United States Patent
Saida et al.

(10) Patent No.: US 8,928,055 B2
(45) Date of Patent: Jan. 6, 2015

(54) MAGNETIC MEMORY ELEMENT

(75) Inventors: Daisuke Saida, Tokyo (JP); Minoru Amano, Kanagawa-ken (JP); Junichi Ito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,343

(22) Filed: Aug. 31, 2012

(65) Prior Publication Data

US 2013/0249024 A1 Sep. 26, 2013

(30) Foreign Application Priority Data

Mar. 20, 2012 (JP) ................................ 2012-062938

(51) Int. Cl.
*H01L 27/22* (2006.01)
*G11C 11/15* (2006.01)

(52) U.S. Cl.
USPC ..................... 257/295; 257/E21.665; 365/173

(58) Field of Classification Search
CPC ................ G11C 11/161; G11C 11/22; G11C 2211/5615; H01L 27/222
USPC ........................... 257/295, E21.665; 365/173
See application file for complete search history.

(56) References Cited

U.S. PATENT DOCUMENTS

| | | | | |
|---|---|---|---|---|
| 6,888,184 | B1* | 5/2005 | Shi et al. ........................ | 257/293 |
| 8,357,982 | B2 | 1/2013 | Kajiyama | |
| 2003/0174446 | A1* | 9/2003 | Hasegawa ..................... | 360/319 |
| 2004/0136231 | A1* | 7/2004 | Huai et al. .................... | 365/158 |
| 2005/0073778 | A1* | 4/2005 | Hasegawa et al. ......... | 360/324.1 |
| 2005/0099724 | A1* | 5/2005 | Nakamura et al. ............ | 360/125 |
| 2005/0259463 | A1* | 11/2005 | Lim .............................. | 365/158 |
| 2006/0017082 | A1* | 1/2006 | Fukuzumi et al. ............ | 257/295 |
| 2006/0126371 | A1* | 6/2006 | Nagase et al. ................ | 365/145 |
| 2007/0019462 | A1* | 1/2007 | Ezaki et al. ................... | 365/158 |
| 2007/0076469 | A1* | 4/2007 | Ashida et al. ................. | 365/158 |
| 2008/0043519 | A1* | 2/2008 | Kitagawa et al. ............. | 365/158 |
| 2009/0015958 | A1 | 1/2009 | Nakamura et al. | |

(Continued)

FOREIGN PATENT DOCUMENTS

| | | |
|---|---|---|
| JP | 2007-504651 | 3/2007 |
| JP | 2007-273493 | 10/2007 |
| JP | 2009-21352 | 1/2009 |
| JP | 2012-22726 | 2/2012 |

OTHER PUBLICATIONS

U.S. Appl. No. 13/795,620, filed Mar. 12, 2013, Saida, et al.

(Continued)

*Primary Examiner* — Steven J Fulk
(74) *Attorney, Agent, or Firm* — Oblon, Spivak, McClelland, Maier & Neustadt, L.L.P.

(57) ABSTRACT

According to one embodiment, a magnetic memory element includes a stacked body and a conductive shield. The stacked body includes first and second stacked units. The first stacked unit includes first and second ferromagnetic layers and a first nonmagnetic layer. The first ferromagnetic layer has a fixed magnetization in a first direction. A magnetization direction of the second ferromagnetic layer is variable in a second direction. The first nonmagnetic layer is provided between the first and second ferromagnetic layers. The second stacked unit includes a third ferromagnetic layer stacked with the first stacked unit in a stacking direction of the first stacked unit. A magnetization direction of the third ferromagnetic layer is variable in a third direction. The conductive shield is opposed to at least a part of a side surface of the second stacked unit. An electric potential of the conductive shield is controllable.

25 Claims, 41 Drawing Sheets

(56) References Cited

U.S. PATENT DOCUMENTS

| | | | |
|---|---|---|---|
| 2009/0244792 A1* | 10/2009 | Nakayama et al. | 360/324.11 |
| 2011/0233697 A1* | 9/2011 | Kajiyama | 257/421 |
| 2012/0061784 A1 | 3/2012 | Nakamura et al. | |
| 2012/0068281 A1 | 3/2012 | Saida et al. | |
| 2013/0070523 A1* | 3/2013 | Saida et al. | 365/173 |

OTHER PUBLICATIONS

U.S. Appl. No. 13/416,724, filed Mar. 9, 2012, Daisuke Saida, et al.
U.S. Appl. No. 13/416,076, filed Mar. 9, 2012, Daisuke Saida, et al.
U.S. Appl. No. 13/416,408, filed Mar. 9, 2012, Daisuke Saida, et al.
U.S. Appl. No. 13/228,040, filed Sep. 8, 2011, Daisuke Saida, et al.
U.S. Appl. No. 13/227,959, filed Sep. 8, 2011, Daisuke Saida, et al.
U.S. Appl. No. 13/210,678, filed Aug. 16, 2011, Tadaomi Daibou, et al.
U.S. Appl. No. 14/184,920, filed Feb. 20, 2014, Saida, et al.
Office Action issued Oct. 10, 2013 in Japanese Patent Application No. 2012-062938 (with English translation).

* cited by examiner

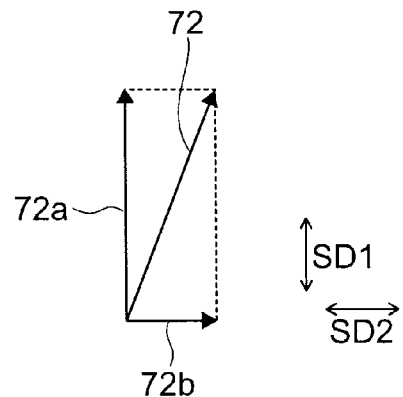
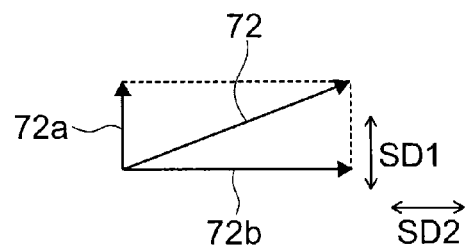
FIG. 2A    FIG. 2B
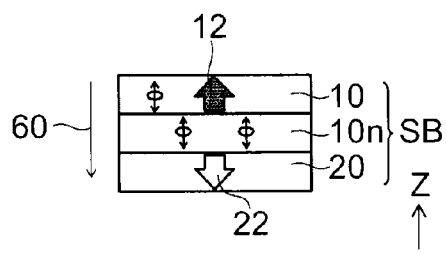
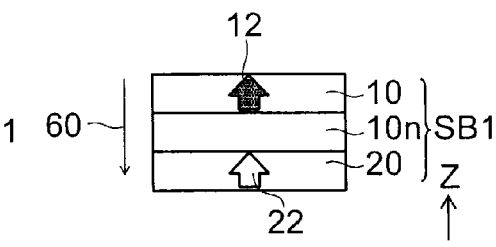
FIG. 3A    FIG. 3B
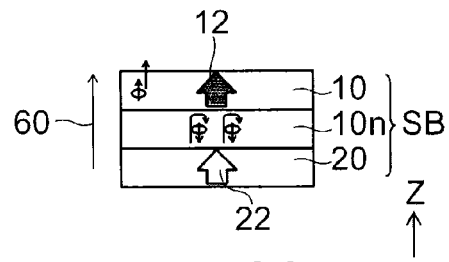
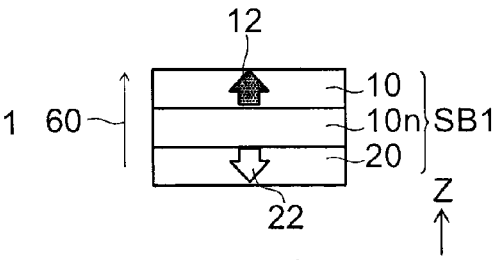
FIG. 3C    FIG. 3D
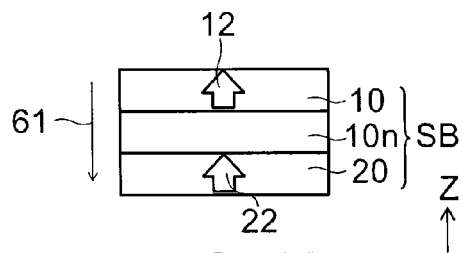
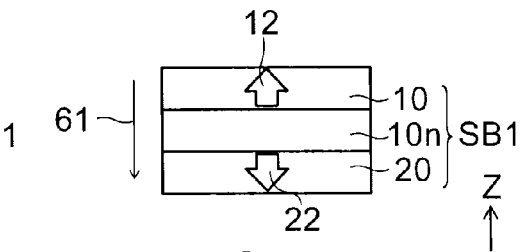
FIG. 4A    FIG. 4B

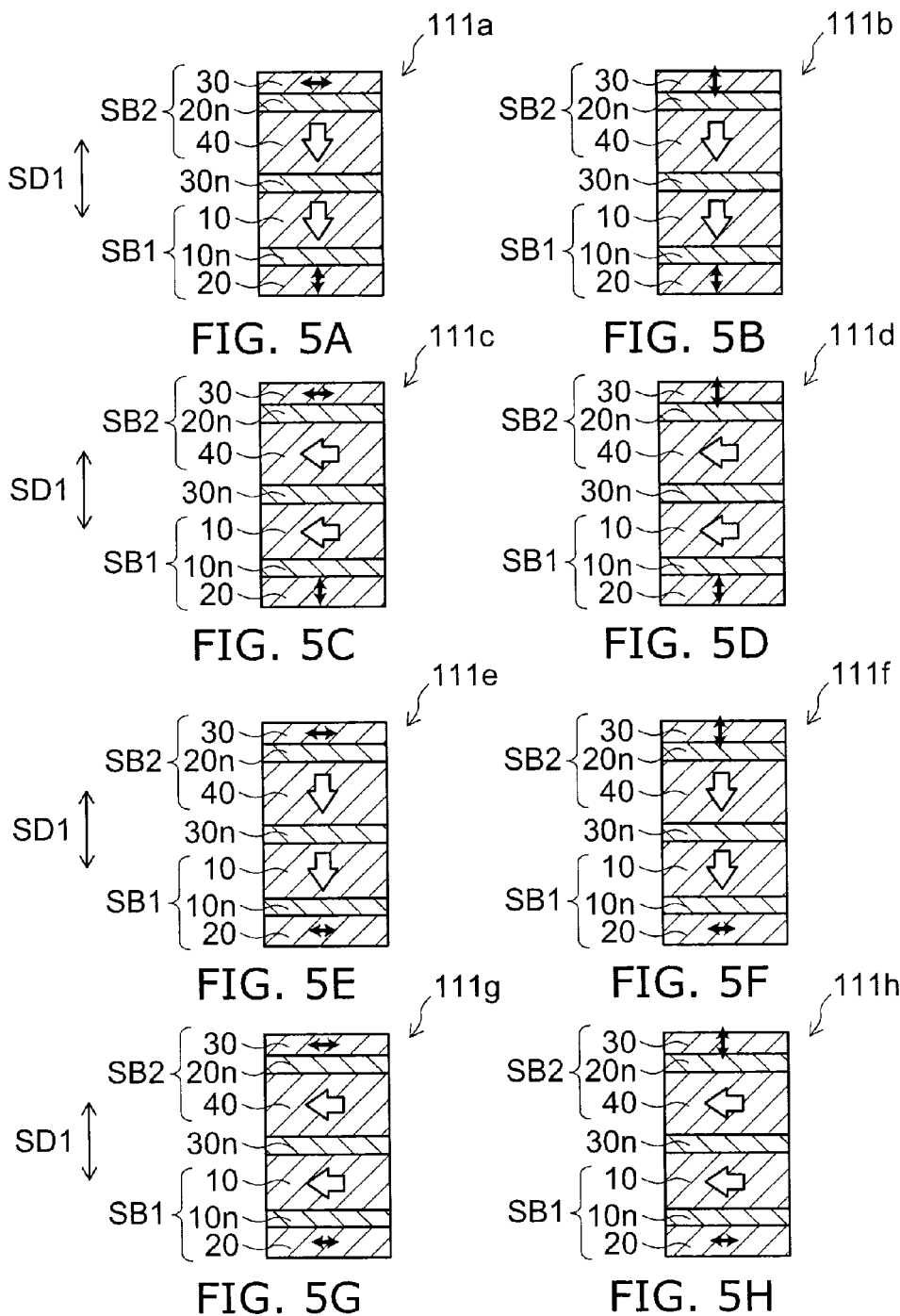

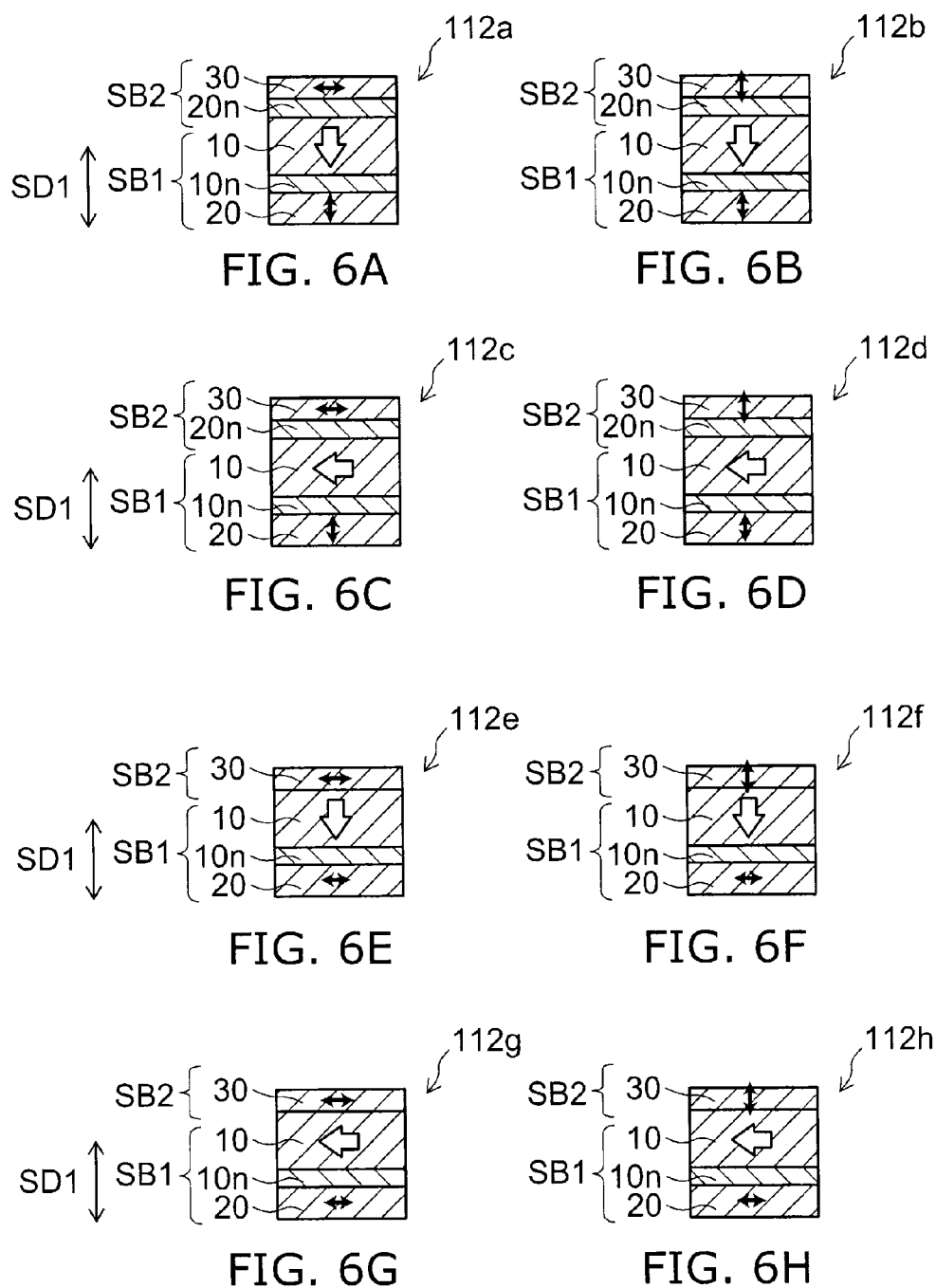

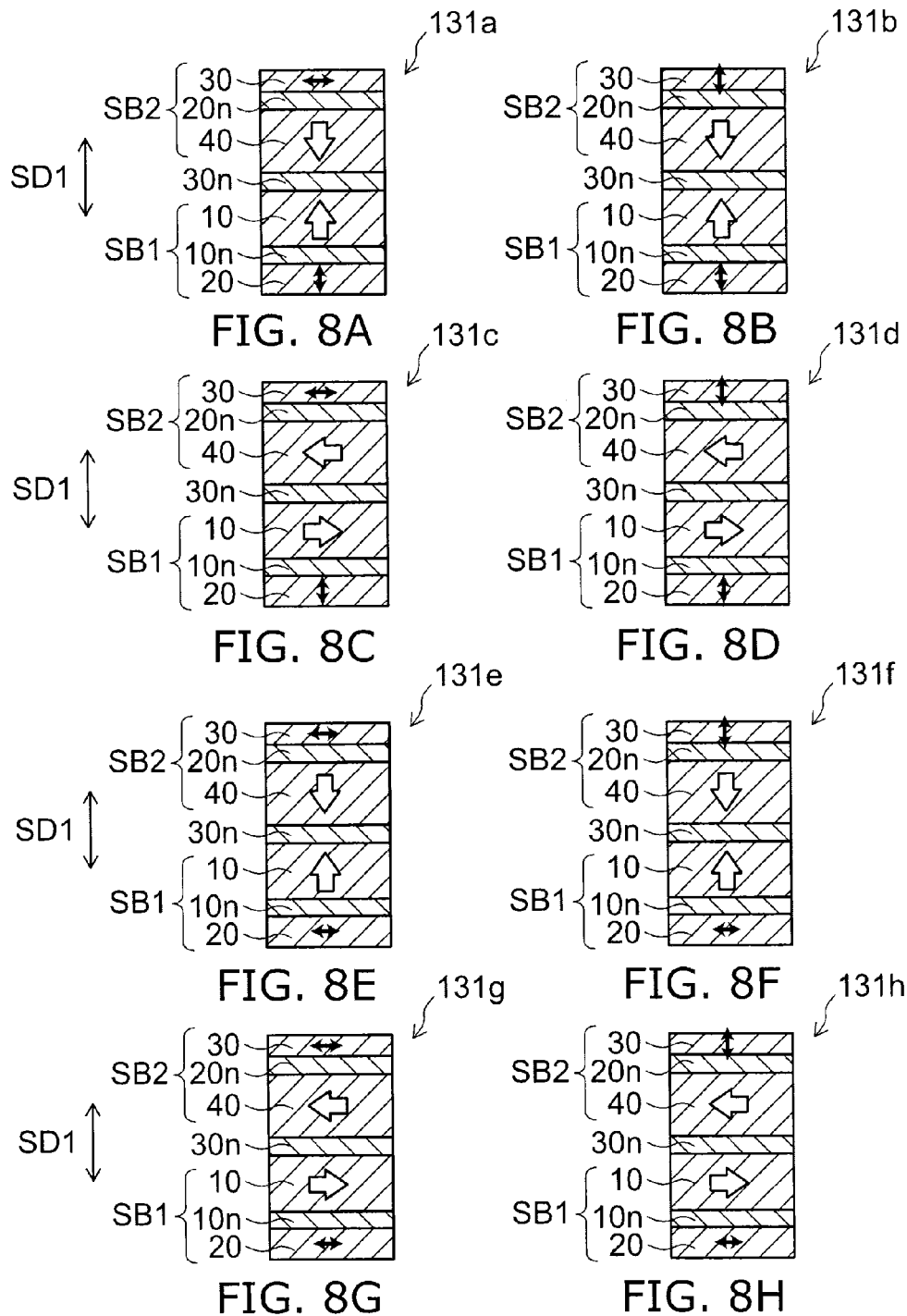

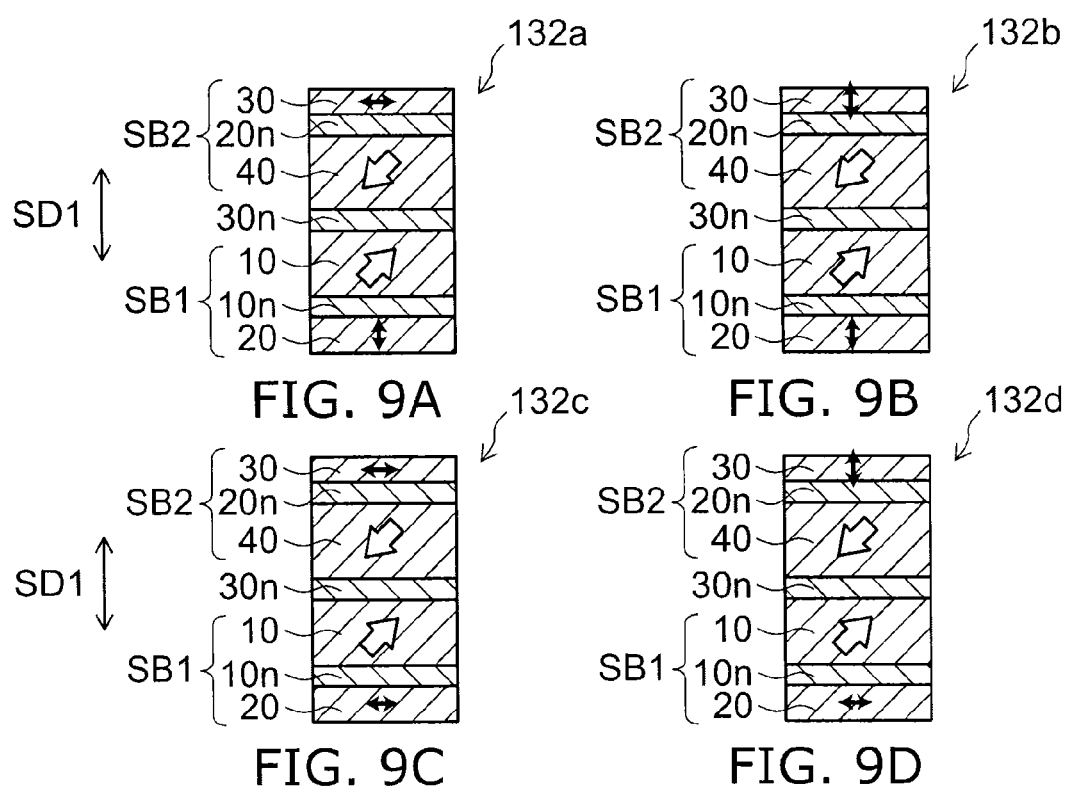

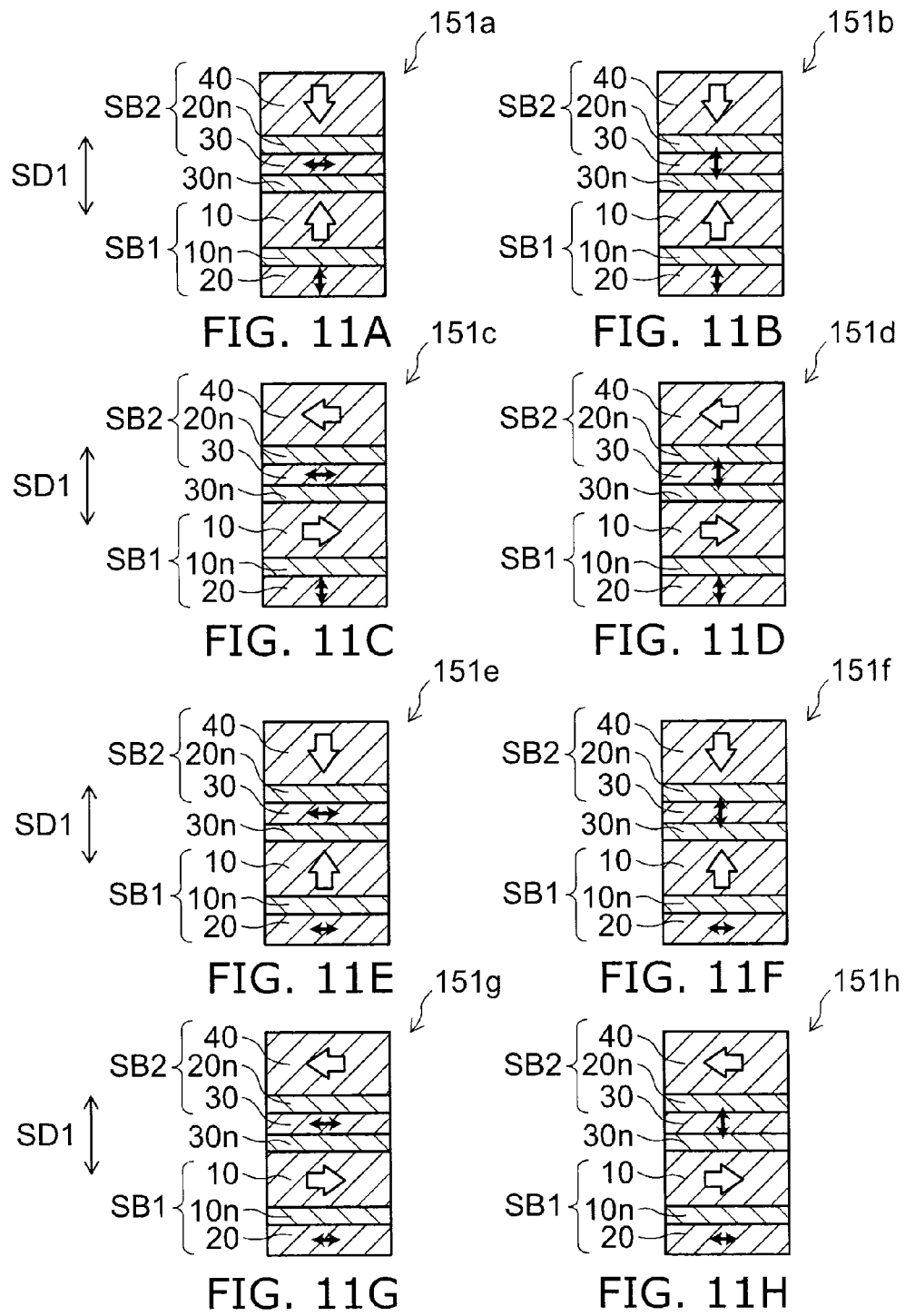

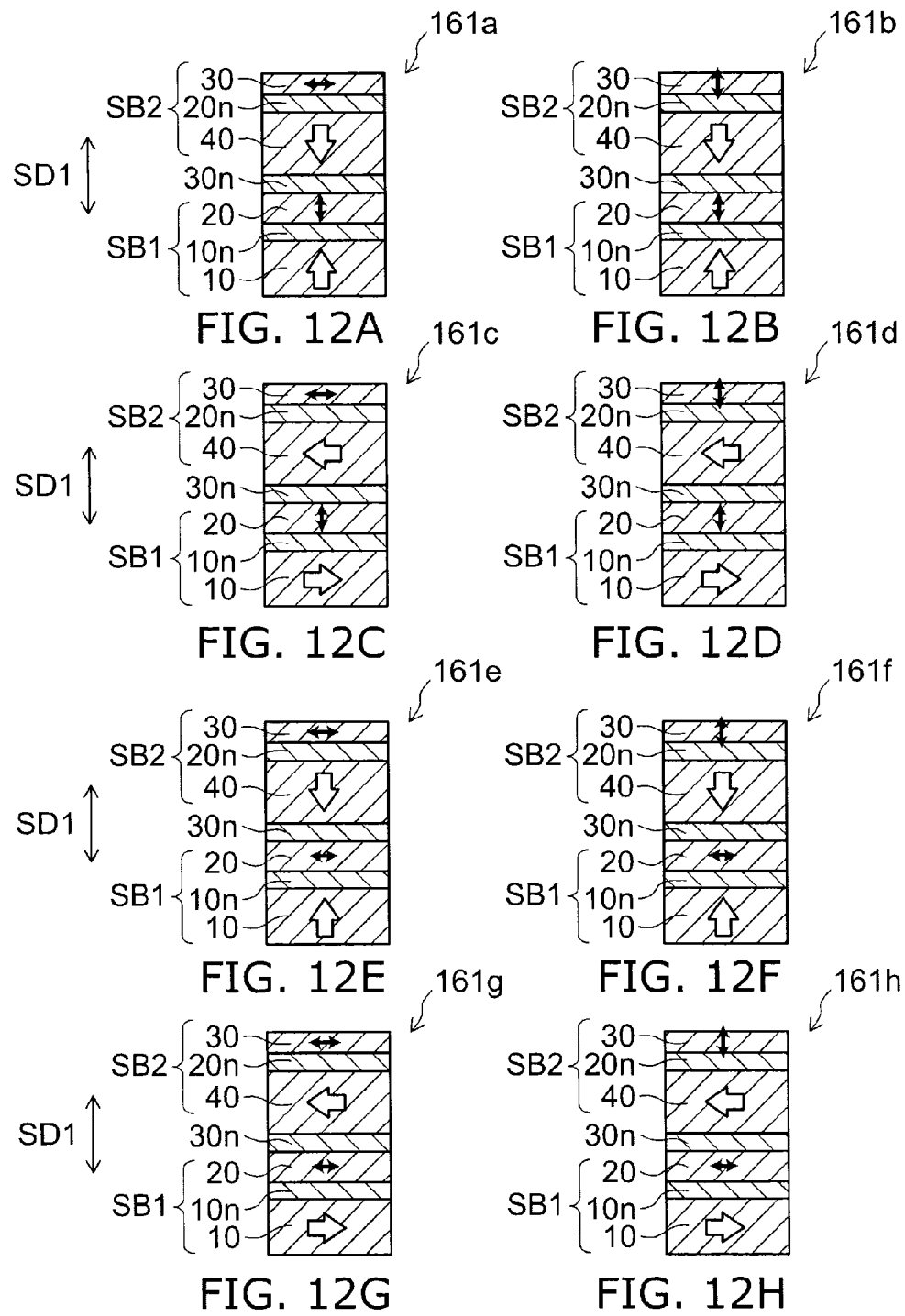

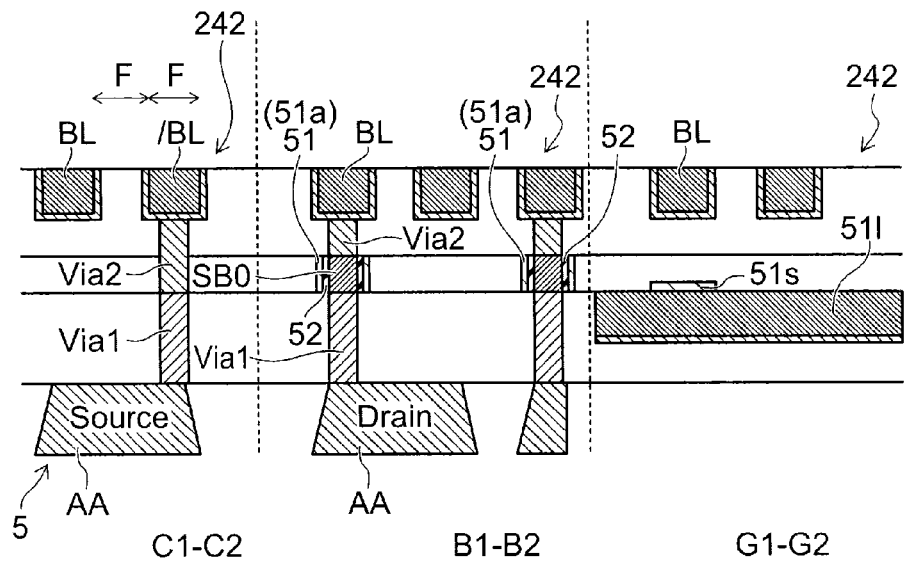
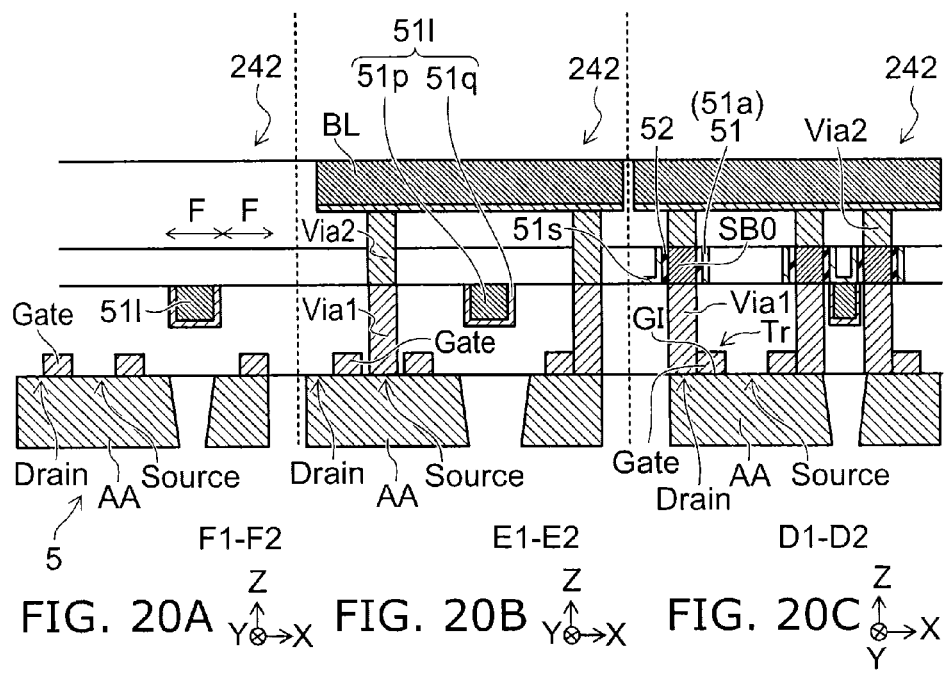

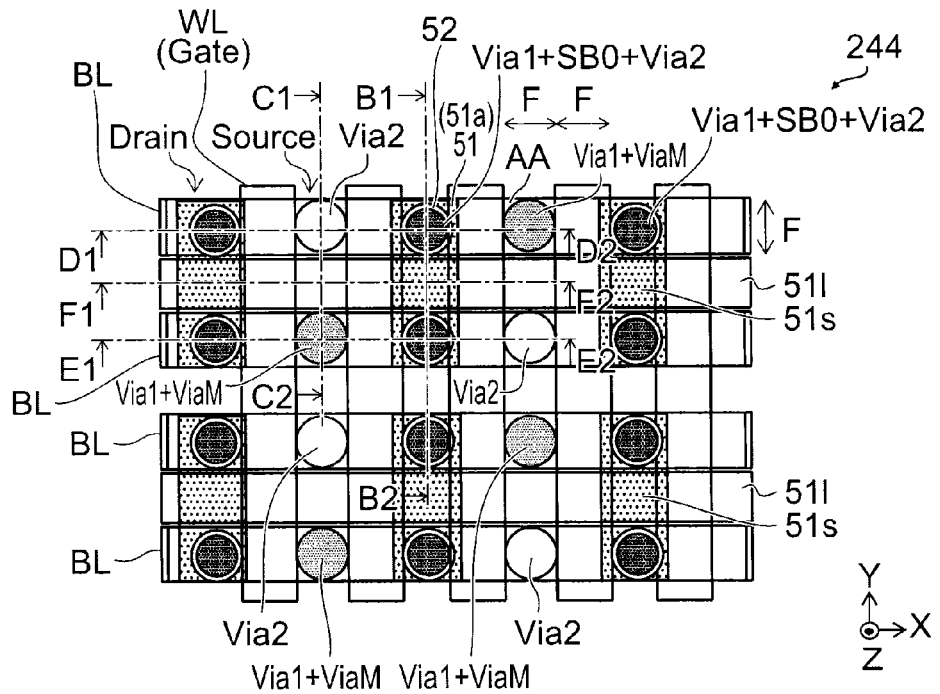
FIG. 33
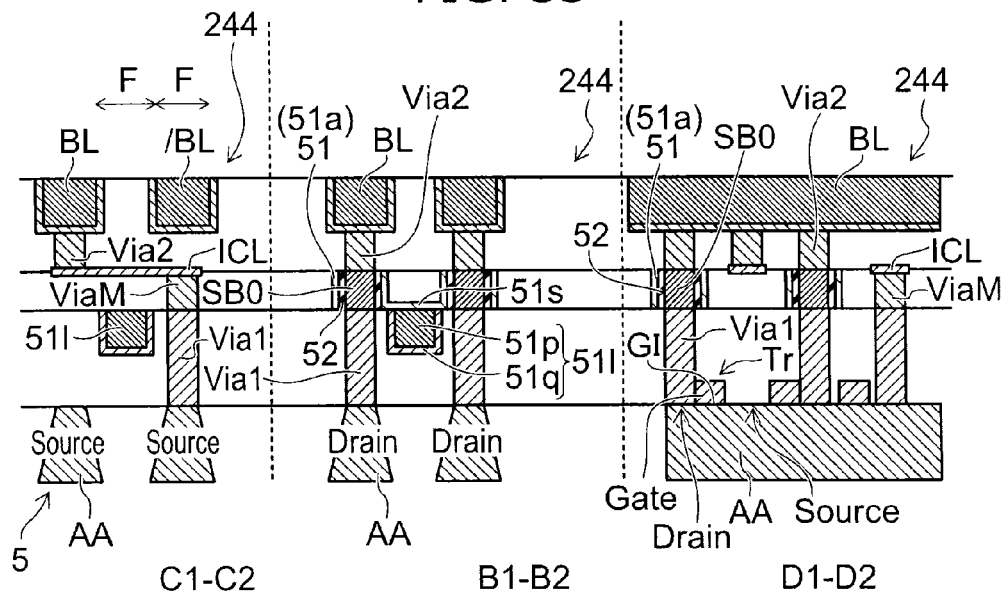
 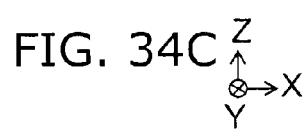

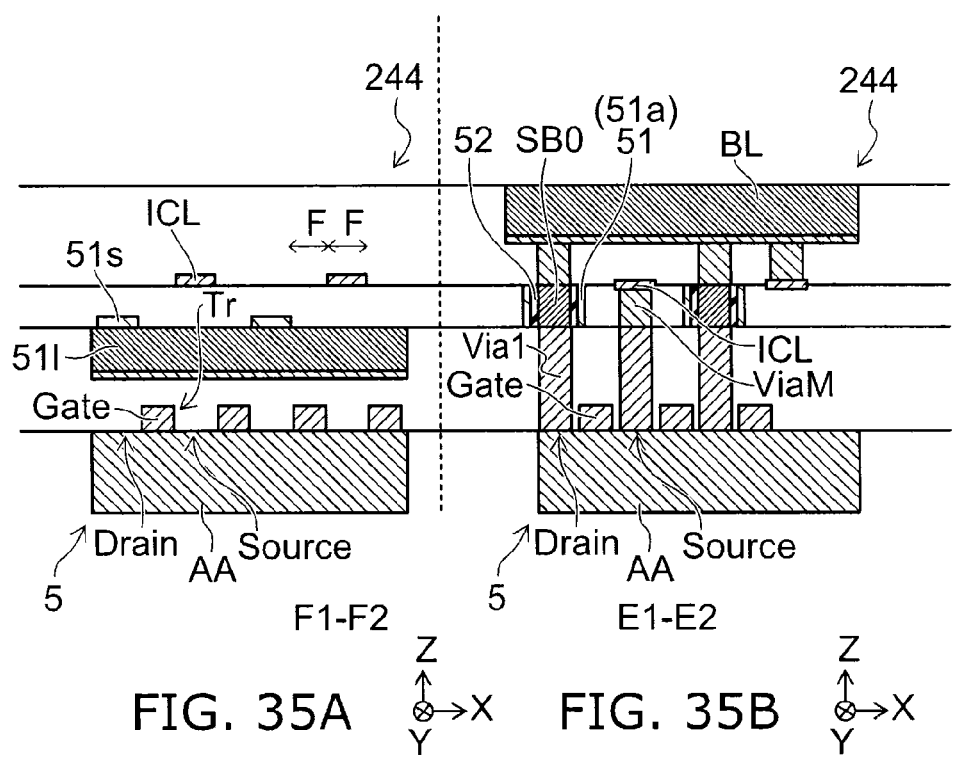

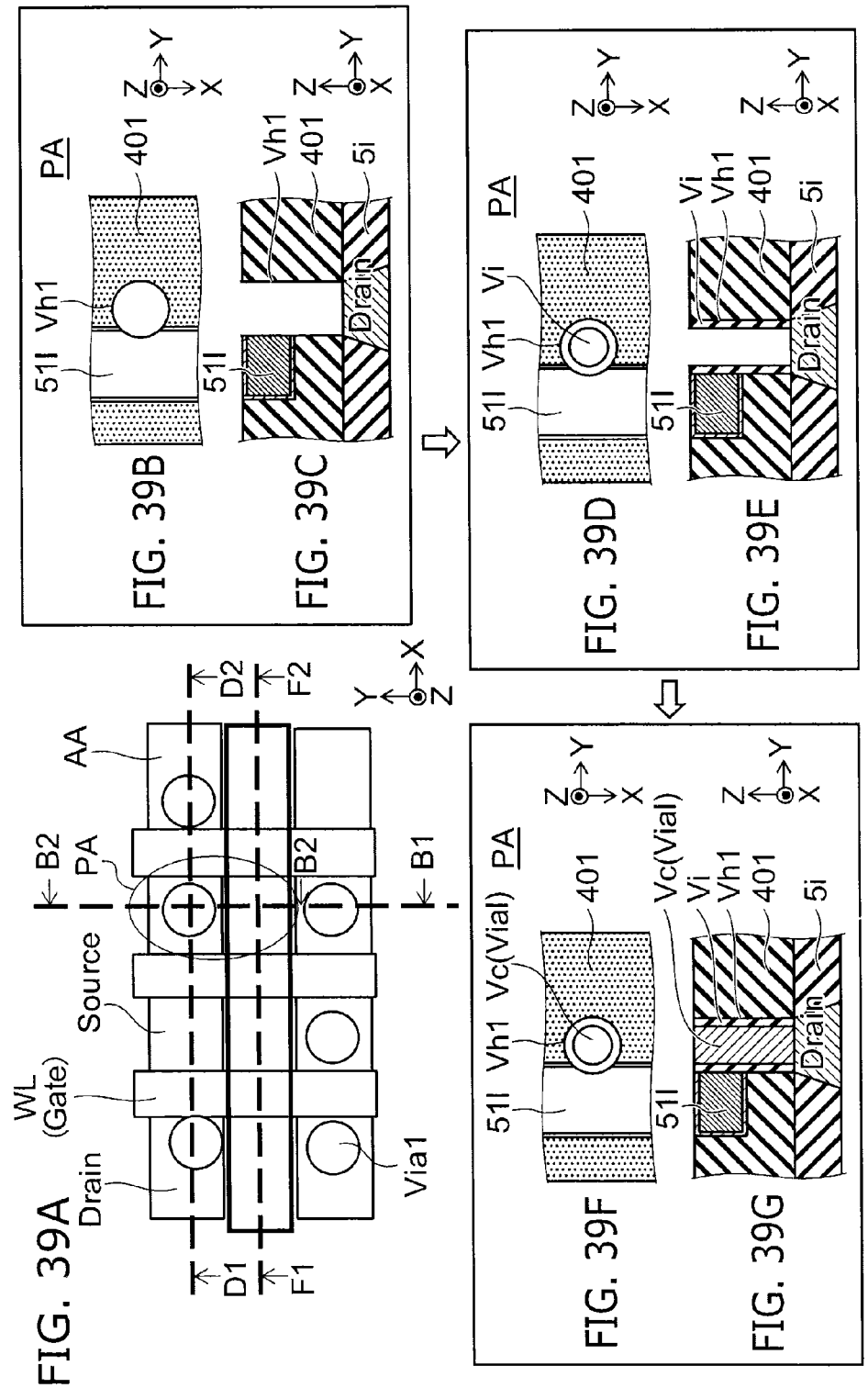

MAGNETIC MEMORY ELEMENT

CROSS-REFERENCE TO RELATED APPLICATIONS

This application is based upon and claims the benefit of priority from the prior Japanese Patent Application No. 2012-062938, filed on Mar. 20, 2012; the entire contents of which are incorporated herein by reference.

FIELD

Embodiments described herein relate generally to a magnetic memory element and a nonvolatile memory device.

BACKGROUND

Some magnetic random access memories (MRAMs) have a configuration in which a magnetic tunnel junction (MTJ) element exhibiting the tunneling magnetoresistive (TMR) effect is used for a data memory unit. The configuration is drawing attention as a high-speed and large-capacity nonvolatile memory element. In such a memory element, it is desired to suppress malfunction.

BRIEF DESCRIPTION OF THE DRAWINGS

FIG. 2A and FIG. 2B are schematic views showing magnetization;

FIG. 3A to FIG. 3D are schematic views showing the operation of the magnetic memory element according to the embodiment;

FIG. 4A and FIG. 4B are schematic views showing the operation of the magnetic memory element according to the embodiment;

FIG. 5A to FIG. 5H are schematic cross-sectional views showing magnetic memory elements according to the first embodiment;

FIG. 6A to FIG. 6H are schematic cross-sectional views showing magnetic memory elements according to the first embodiment;

FIG. 8A to FIG. 8H are schematic cross-sectional views showing magnetic memory elements according to a third embodiment;

FIG. 9A to FIG. 9D are schematic cross-sectional views showing other magnetic memory elements according to the third embodiment;

FIG. 11A to FIG. 11H are schematic cross-sectional views showing magnetic memory elements according to a fifth embodiment;

FIG. 12A to FIG. 12H are schematic cross-sectional views showing magnetic memory elements according to a sixth embodiment;

FIG. 19A to FIG. 19C are schematic cross-sectional views showing the one other nonvolatile memory device according to the eighth embodiment;

FIG. 20A to FIG. 20C are schematic cross-sectional views showing the one other nonvolatile memory device according to the eighth embodiment;

FIG. 33 is a schematic plan view showing one other nonvolatile memory device according to the eighth embodiment;

FIG. 34A to FIG. 34C are schematic cross-sectional views showing the one other nonvolatile memory device according to the eighth embodiment;

FIG. 35A and FIG. 35B are schematic cross-sectional views showing the one other nonvolatile memory device according to the eighth embodiment; and FIG. 36A to FIG. 36C, FIG. 37A to FIG. 37C, FIG. 38A to FIG. 38C, FIG. 39A to FIG. 39G, FIG. 40A to FIG. 40C, FIG. 41A to FIG. 41C, FIG. 42A to FIG. 42C, FIG. 43A to FIG. 43C, FIG. 44A to FIG. 44C, FIG. 45A to FIG. 45C, FIG. 46A to FIG. 46C, FIG. 47A to FIG. 47C, and FIG. 48A to FIG. 48C are schematic views in order of the processes, showing a method for manufacturing a nonvolatile memory device according to the eighth embodiment.

DETAILED DESCRIPTION

Figure 1A:
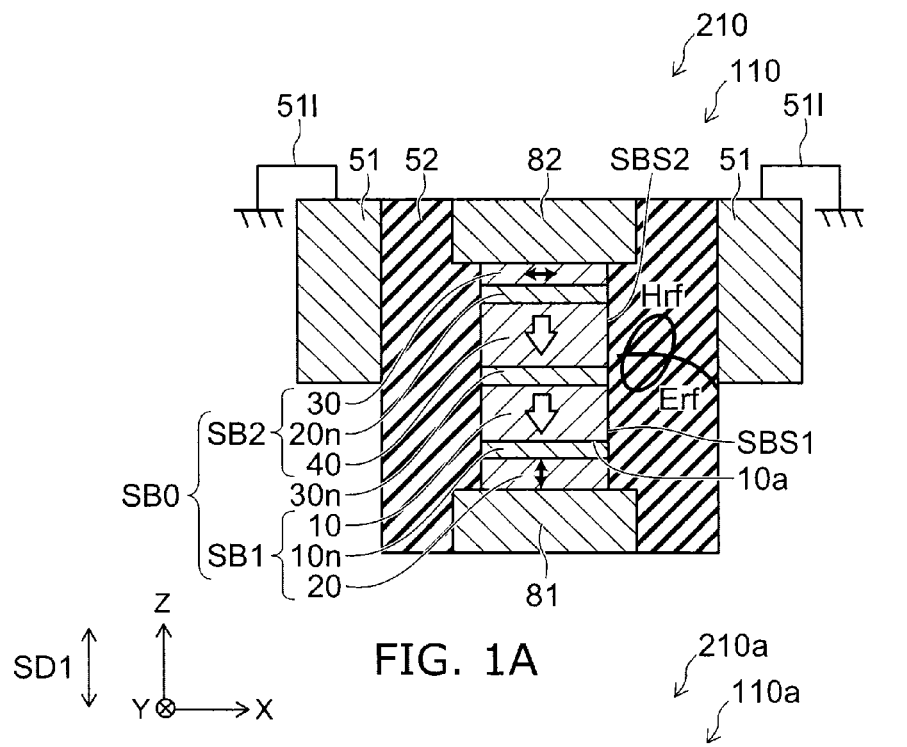
FIG. 1A and FIG. 1B are schematic cross-sectional views showing magnetic memory elements according to a first embodiment.

According to one embodiment, a magnetic memory element includes a stacked body and a conductive shield. The stacked body includes a first stacked unit and a second stacked unit. The first stacked unit includes a first ferromagnetic layer, a second ferromagnetic layer and a first nonmagnetic layer. A magnetization of the first ferromagnetic layer is fixed in a first direction. A direction of a magnetization of the second ferromagnetic layer is variable in a second direction. The first nonmagnetic layer is provided between the first ferromagnetic layer and the second ferromagnetic layer. The first nonmagnetic layer, the first ferromagnetic layer and the second ferromagnetic layer are stacked in a stacking direction. The second stacked unit includes a third ferromagnetic layer stacked with the first stacked unit in the stacking direction. A direction of a magnetization of the third ferromagnetic layer is variable in a third direction. The conductive shield is opposed to at least a part of a side surface of the second stacked unit. An electric potential of the conductive shield is controllable.

According to another embodiment, a nonvolatile memory device includes a plurality of magnetic memory elements. Each of the magnetic memory elements includes a stacked body and a conductive shield. The stacked body includes a first stacked unit and a second stacked unit. The first stacked unit includes a first ferromagnetic layer, a second ferromagnetic layer and a first nonmagnetic layer. A magnetization of the first ferromagnetic layer is fixed in a first direction. A direction of a magnetization of the second ferromagnetic layer is variable in a second direction. The first nonmagnetic layer is provided between the first ferromagnetic layer and the second ferromagnetic layer. The first nonmagnetic layer, the first ferromagnetic layer and the second ferromagnetic layer are stacked in a stacking direction. The second stacked unit includes a third magnetic layer stacked with the first stacked unit in the stacking direction. A direction of a magnetization of the third magnetic layer is variable in a third direction. The conductive shield is opposed to at least a part of side surface of the second stacked unit. An electric potential of the conductive shield is controllable. The shield is disposed between the magnetic memory elements.

Various embodiments will be described hereinafter with reference to the accompanying drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

Figure 1B:
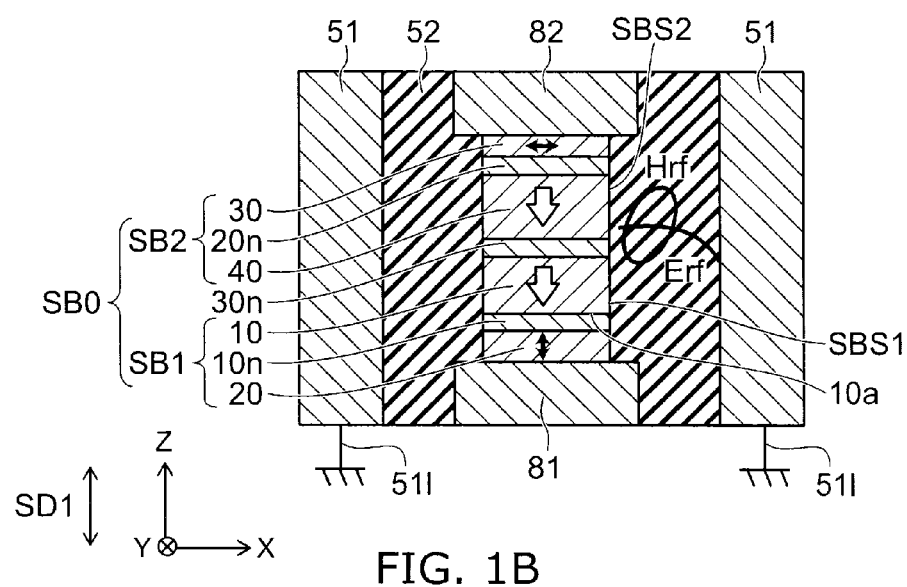

FIG. 1A and FIG. 1B are schematic cross-sectional views illustrating the configurations of magnetic memory elements according to a first embodiment.

As shown in FIG. 1A, a magnetic memory element 110 according to the embodiment includes a stacked body SB0 and a shield 51.

The stacked body SB0 includes a first stacked unit SB1 and a second stacked unit SB2.

The first stacked unit SB1 includes a first ferromagnetic layer 10, a second ferromagnetic layer 20, and a first nonmagnetic layer 10n.

The first ferromagnetic layer 10 has a major surface 10a. The magnetization of the first ferromagnetic layer 10 is fixed in a first direction. The first direction has, for example, a component perpendicular to the major surface 10a. That is, for example, the first direction is non-parallel to the major surface 10a.

The direction of the magnetization of the second ferromagnetic layer 20 is variable in a second direction. The first nonmagnetic layer 10n is provided between the first ferromagnetic layer 10 and the second ferromagnetic layer 20. The first ferromagnetic layer 10, the first nonmagnetic layer 10n, and the second ferromagnetic layer 20 are stacked in a direction perpendicular to the major surface 10a (a stacking direction SD1). The stacking direction SD1 of the first stacked unit SB1 is parallel to a direction from the first ferromagnetic layer 10 toward the second ferromagnetic layer 20. The first nonmagnetic layer 10n, the first ferromagnetic layer 10 and the second ferromagnetic layer 20 are stacked in the stacking direction SD1.

In the specification of the application, the state of being stacked includes not only the state of being stacked directly in contact but also the case of being stacked via other components.

A direction parallel to the stacking direction SD1 is taken as a Z-axis direction. One axis perpendicular to the Z-axis is taken as an X-axis. The axis perpendicular to the X-axis and the Z-axis is taken as a Y-axis. The film surfaces of the layers included in the stacked body SB0 are parallel to the X-Y plane.

The second stacked unit SB2 is stacked with the first stacked unit SB1 in the stacking direction SD1. The second stacked unit SB2 includes a third ferromagnetic layer 30. In this example, the second stacked unit SB2 further includes a fourth ferromagnetic layer 40 and a second nonmagnetic layer 20n.

The direction of the magnetization of the third ferromagnetic layer 30 is variable in a third direction. The fourth ferromagnetic layer 40 is stacked with the third ferromagnetic layer 30 in the stacking direction SD1. The magnetization of the fourth ferromagnetic layer 40 is fixed in a fourth direction. The second nonmagnetic layer 20n is provided between the third ferromagnetic layer 30 and the fourth ferromagnetic layer 40.

In this example, the stacked body SB0 further includes a third nonmagnetic layer 30n. The third nonmagnetic layer 30n is provided between the first stacked unit SB1 and the second stacked unit SB2.

In this example, the magnetic memory element 110 further includes a first conductive layer 81 and a second conductive layer 82. The first stacked unit SB1 is disposed between the first conductive layer 81 and the second conductive layer 82. The second stacked unit SB2 is disposed between the first stacked unit SB1 and the second conductive layer 82. The first conductive layer 81 is electrically connected to the first stacked unit SB1. In this example, the first conductive layer 81 is electrically connected to the second ferromagnetic layer 20. The second conductive layer 82 is electrically connected to the second stacked unit SB2. In this example, the second conductive layer 82 is electrically connected to the third ferromagnetic layer 30. The first conductive layer 81 and the second conductive layer 82 may be regarded as separate from the magnetic memory element 110.

The shield 51 is opposed to the side surface SBS2 of the second stacked unit SB2. The shield 51 is electrically conductive. The electric potential of the shield 51 is controllable. One end of a shield interconnection 51l, for example, is electrically connected to the shield 51. The other end of the shield interconnection 51l is electrically connected to, for example, an electric circuit etc. (not shown). The electric potential of the shield 51 is controlled to a prescribed potential by the electric circuit etc. The electric potential of the shield 51 is set to, for example, the ground potential (the earth potential). Alternatively, the electric potential of the shield 51 is set to the power supply potential or the like. The electric potential of the shield 51 may be fixed or variable in terms of time. The electric potential of the shield 51 may be changed depending on the operating state (e.g. writing, erasing, reading, etc.) of the magnetic memory element 110.

A plurality of magnetic memory elements 110 may be used to form a nonvolatile memory device 210. In the nonvolatile memory device 210, the distance between magnetic memory elements 110 is set short in order to increase memory density.

In the magnetic memory element 110 (the nonvolatile memory device 210) according to the embodiment, by providing the shield 51, radio-frequency electromagnetic waves generated from the second stacked unit SB2 (a radio-frequency electric field Erf accompanying a radio-frequency magnetic field Hrf) affecting an adjacent element can be suppressed.

The magnetic memory element 110 (and the nonvolatile memory device 210) according to the embodiment can provide a magnetic memory element and a nonvolatile memory device in which malfunction is suppressed.

As shown in FIG. 1A, the magnetic memory element 110 further includes a protection layer 52. The protection layer 52 is provided between the side surface SBS2 of the second stacked unit SB2 and the shield 51. The protection layer 52 is insulative.

As shown in FIG. 1B, in a magnetic memory element 110a (a nonvolatile memory device 210a) according to the embodiment, the shield 51 is opposed to the side surface SBS2 of the second stacked unit SB2 and is opposed also to the side surface SBS1 of the first stacked unit SB1. In this example, the protection layer 52 is further provided between the side surface SBS1 of the first stacked unit SB1 and the shield 51. Otherwise, the configuration is similar to that of the magnetic memory element 110 (the nonvolatile memory device 210), and a description is therefore omitted. Also the magnetic memory element 110a (the nonvolatile memory device 210a) can suppress malfunction.

Examples of the configuration and operation of the magnetic memory element 110 will now be described. The following description can be applied to not only the magnetic memory element 110a but also other magnetic memory elements described later according to the embodiment.

In the magnetic memory element 110, an electron whose spin is polarized by passing a current through the first stacked unit SB1 and the second stacked unit SB2 in the stacking direction SD1 is caused to act on the second ferromagnetic layer 20, and a magnetic field generated from the precession of the magnetization of the third ferromagnetic layer 30 is caused to act on the second ferromagnetic layer 20. Thereby, the direction of the magnetization of the second ferromagnetic layer 20 can be determined to a direction in accordance with the direction of the current.

The first ferromagnetic layer 10 functions as, for example, a first magnetization fixed layer. In the first ferromagnetic layer 10, for example, the magnetization is fixed in a direction substantially perpendicular to the film surface. In the second ferromagnetic layer 20, for example, the magnetization easy axis is in a direction substantially perpendicular to the film surface. The second ferromagnetic layer 20 functions as a magnetic memory layer. The first nonmagnetic layer 10n functions as a first spacer layer. In the case where the first nonmagnetic layer 10n is a tunnel barrier layer based on an insulating material, the first stacked unit SB1 including the first ferromagnetic layer 10, the first nonmagnetic layer 10n, and the second ferromagnetic layer 20 has a structure of, for example, MTJ (magnetic tunnel junction).

The third ferromagnetic layer 30 functions as a magnetization rotation layer. In the third ferromagnetic layer 30, for example, the magnetization easy axis is in a direction substantially parallel to the film surface. The fourth ferromagnetic layer 40 functions as, for example, a second magnetization fixed layer. In the fourth ferromagnetic layer 40, for example, the magnetization is fixed in a direction substantially perpendicular to the film surface. The second nonmagnetic layer 20n functions as a second spacer layer.

A perpendicular magnetization film, for example, is used as the first ferromagnetic layer 10, the second ferromagnetic layer 20, and the fourth ferromagnetic layer 40. An in-plane magnetization film, for example, is used as the third ferromagnetic layer 30.

FIG. 2A and FIG. 2B are schematic views illustrating magnetization.

FIG. 2A illustrates the magnetization in a perpendicular magnetization film. FIG. 2B illustrates the magnetization in an in-plane magnetization film.

As shown in FIG. 2A and FIG. 2B, one direction perpendicular to the stacking direction SD1 is taken as an in-plane direction SD2. The in-plane direction SD2 is a direction in the X-Y plane. An in-plane magnetization component 72b of a magnetization 72 is the component projected onto the X-Y plane of the magnetization 72. The in-plane magnetization component 72b is parallel to the in-plane direction SD2. A perpendicular magnetization component 72a is the component of the magnetization 72 projected onto the Z-axis. The perpendicular magnetization component 72a is parallel to the stacking direction SD1.

As shown in FIG. 2A, the perpendicular magnetization film has a magnetization state in which the perpendicular magnetization component 72a is larger than the in-plane magnetization component 72b. In the perpendicular magnetization film, the direction of the magnetization is preferably substantially perpendicular to the film surface in view of operating characteristics.

As shown in FIG. 2B, the in-plane magnetization film has a magnetization state in which the in-plane magnetization component 72b is larger than the perpendicular magnetization component 72a. In the in-plane magnetization film, the direction of the magnetization is preferably substantially parallel to the film surface in view of operating characteristics.

For convenience of description, the direction from the first stacked unit SB1 toward the second stacked unit SB2 is referred to as "upward" or an "upward direction." The direction from the second stacked unit SB2 toward the first stacked unit SB1 is referred to as "downward" or a "downward direction."

As described above, the magnetization of the first ferromagnetic layer 10 is substantially fixed in the first direction. The magnetization of the fourth ferromagnetic layer 40 is substantially fixed in the fourth direction.

As illustrated in FIG. 1A, in the magnetic memory element 110, the first direction is the downward direction, and also the fourth direction is the downward direction. However, the first direction and the fourth direction may be variously altered. For example, the first direction may be the upward direction and the fourth direction may be the upward direction.

In the magnetic memory element 110, for example, an electronic current can be passed through the first stacked unit SB1 and the second stacked unit SB2 via the first conductive layer 81 and the second conductive layer 82. The electronic current is a flow of electrons. When a current flows upward, the electronic current flows downward.

The second ferromagnetic layer 20 takes the role of storing data. The magnetization of the second ferromagnetic layer 20 can be reversed comparatively easily. The third ferromagnetic layer 30 takes the role of generating a radio-frequency magnetic field in writing.

When an electronic current is passed in the direction perpendicular to the film surface, the magnetization in the third ferromagnetic layer 30 of a magnetic field generation source precesses. Thereby, a rotating magnetic field (a radio-frequency magnetic field Hrf) is generated. The frequency of the radio-frequency magnetic field Hrf is, for example, about 1

GHz to 60 GHz. The radio-frequency magnetic field Hrf has a component in a direction perpendicular to the magnetization of the second ferromagnetic layer 20 (a component in the direction of the magnetization hard axis of the second ferromagnetic layer 20). Therefore, at least part of the radio-frequency magnetic field Hrf generated from the third ferromagnetic layer 30 is applied in the direction of the magnetization hard axis of the second ferromagnetic layer 20. When the radio-frequency magnetic field Hrf generated from the third ferromagnetic layer 30 is applied in the direction of the magnetization hard axis of the second ferromagnetic layer 20, it becomes very easy for the magnetization of the second ferromagnetic layer 20 to reverse.

In the magnetic memory element 110, the direction of the magnetization of the second ferromagnetic layer 20 can be controlled by passing an electronic current through the first stacked unit SB1 and the second stacked unit SB2. Specifically, the direction of the magnetization of the second ferromagnetic layer 20 can be reversed by changing the direction of the flow of the electronic current (polarity). When storing information, for example, "0" and "1" are allotted in accordance with the direction of the magnetization of the second ferromagnetic layer 20.

As a specific example of the operation in the magnetic memory element 110, first, an example of the "write" operation is described.

FIG. 3A to FIG. 3D are schematic views illustrating the operation of the magnetic memory element according to the embodiment.

The drawings illustrate states of the first stacked unit SB1 in the "write" operation in the magnetic memory element 110. In the drawings, the second stacked unit SB2, the first conductive layer 81, the second conductive layer 82, and the third nonmagnetic layer 30n are omitted.

FIG. 3A illustrates a state where an electronic current 60 has started to be passed from the first ferromagnetic layer 10 toward the second ferromagnetic layer 20. FIG. 3B illustrates a state where passing the electronic current 60 from the first ferromagnetic layer 10 toward the second ferromagnetic layer 20 has been completed (a state where the magnetization is reversed). FIG. 3C illustrates a state where the electronic current 60 has started to be passed from the second ferromagnetic layer 20 toward the first ferromagnetic layer 10. FIG. 3D illustrates a state where passing the electronic current 60 from the second ferromagnetic layer 20 toward the first ferromagnetic layer 10 has been completed (a state where the magnetization is reversed). FIG. 3C and FIG. 3D correspond to the cases where the direction of the electronic current 60 is reversed in the cases illustrated in FIG. 3A and FIG. 3B, respectively.

In the write operation, the electronic current 60 is passed to cross the film surface of the first ferromagnetic layer 10 and the film surface of the second ferromagnetic layer 20 to perform the write operation on the second ferromagnetic layer 20. Herein, the case is described where the magnetoresistive effect via the first nonmagnetic layer 10n is a normal type.

In the magnetoresistive effect of the "normal type," the electric resistance when the magnetizations of magnetic layers on both sides of a nonmagnetic layer are parallel to each other is lower than the electric resistance when they are antiparallel. In the case of the normal type, the electric resistance between the first ferromagnetic layer 10 and the second ferromagnetic layer 20 via the first nonmagnetic layer 10n is lower when the magnetization of the first ferromagnetic layer 10 is parallel to the magnetization of the second ferromagnetic layer 20 than when antiparallel.

As shown in FIG. 3A, an electron having passed through the first ferromagnetic layer 10 having a magnetization 12 in a direction substantially perpendicular to the film surface obtains a spin in the same direction as the magnetization 12 of the first ferromagnetic layer 10. When the electron flows into the second ferromagnetic layer 20, the angular momentum of the spin is transferred to the second ferromagnetic layer 20 to act on the magnetization 22 of the second ferromagnetic layer 20. That is, what is called a spin-transfer torque works.

Thereby, as shown in FIG. 3B, the magnetization 22 of the second ferromagnetic layer 20 becomes in the same direction as the magnetization 12 of the first ferromagnetic layer 10. This direction is the upward direction in FIG. 3B, for example one direction parallel to the stacking direction SD1. "0", for example, is allotted to the state of the second ferromagnetic layer 20 having the magnetization 22 in this direction (the upward direction in FIG. 3B).

As shown in FIG. 3C, out of the electrons having passed through the first nonmagnetic layer 10n, an electron having a spin in the same direction as the magnetization 12 of the first ferromagnetic layer 10 (the upward direction in FIG. 3C) passes through the first ferromagnetic layer 10. On the other hand, an electron having a spin in the opposite direction to the magnetization 12 of the first ferromagnetic layer 10 (the downward direction in FIG. 3C) is reflected at the interface between the first ferromagnetic layer 10 and the first nonmagnetic layer 10n. The angular momentum of the spin of the reflected electron is transferred to the second ferromagnetic layer 20 to act on the magnetization 22 of the second ferromagnetic layer 20.

Thereby, as shown in FIG. 3D, the magnetization 22 of the second ferromagnetic layer 20 becomes in the opposite direction to the magnetization 12 of the first ferromagnetic layer 10 (the downward direction in FIG. 3D). That is, a spin-transfer torque works. "1", for example, is allotted to the state of the second ferromagnetic layer 20 having the magnetization 22 in this direction (the downward direction in FIG. 3D).

"0" or "1" is appropriately allotted to the different states of the second ferromagnetic layer 20 based on such action. Thereby, "writing" in the magnetic memory element 110 is performed.

On the other hand, in the case where the magnetoresistive effect is a "reverse type," the electric resistance between the first ferromagnetic layer 10 and the second ferromagnetic layer 20 via the first nonmagnetic layer 10n is higher when the magnetization of the first ferromagnetic layer 10 is parallel to the magnetization of the second ferromagnetic layer 20 than when antiparallel. The "write" operation in the reverse type is similar to that in the case of the normal type.

Next, an example of the "read" operation is described.

The detection of the direction of the magnetization of the second ferromagnetic layer 20 in the magnetic memory element 110 is performed by, for example, utilizing the magnetoresistive effect. In the magnetoresistive effect, electric resistance changes with the relative direction of the magnetization of each layer. In the case where the magnetoresistive effect is utilized, a sense current is passed between the first ferromagnetic layer 10 and the second ferromagnetic layer 20 to measure the magnetoresistance. The current value of the sense current is smaller than the current value corresponding to the electronic current 60 passed at the time of writing (storing).

FIG. 4A and FIG. 4B are schematic views illustrating the operation of the magnetic memory element according to the embodiment.

The drawings illustrate states of the first stacked unit SB1 in the "read" operation in the magnetic memory element 110.

In the drawings, the second stacked unit SB2, the first conductive layer 81, the second conductive layer 82, and the third nonmagnetic layer 30n are omitted.

FIG. 4A illustrates the case where the direction of the magnetization 12 of the first ferromagnetic layer 10 is the same as the direction of the magnetization 22 of the second ferromagnetic layer 20. FIG. 4B illustrates the case where the direction of the magnetization 12 of the first ferromagnetic layer 10 is antiparallel (opposite) to the direction of the magnetization 22 of the second ferromagnetic layer 20.

As shown in FIG. 4A and FIG. 4B, a sense current 61 is passed through the first stacked unit SB1 to detect the electric resistance.

In the magnetoresistive effect of the normal type, the resistance in the state of FIG. 4A is lower than the resistance in the state of FIG. 4B. In the magnetoresistive effect of the reverse type, the resistance in the state of FIG. 4A is higher than the resistance in the state of FIG. 4B.

By relating "0" and "1" to these states of different resistances, respectively, the memory of two value data can be read out. The direction of the sense current 61 may be opposite to the direction illustrated in FIG. 4A and FIG. 4B.

As mentioned above, in the magnetic memory element 110, the second stacked unit SB2 functions as a magnetic field generation source. The first stacked unit SB1 functions as a magnetic memory unit. Hereinafter, the second stacked unit SB2 may be referred to as the magnetic field generation source or an STO (spin torque oscillator). On the other hand, the first stacked unit SB1 may be referred to as the magnetic memory unit or an MTJ.

As mentioned above, writing to the memory layer of the MTJ element is performed by the spin torque writing system. According to an investigation by the inventors of the application, it has been found that in such a memory element, a malfunction may occur if the distance between memory elements is decreased. For example, when information is written to a memory element, false writing may occur in an adjacent memory element.

As shown in FIG. 1A and FIG. 1B, in the magnetic memory element 110, a radio-frequency magnetic field Hrf and a radio-frequency electric field Erf accompanying the radio-frequency magnetic field Hrf are generated in the first stacked unit SB1. If the shield 51 is not provided, the radio-frequency magnetic field Hrf and the radio-frequency electric field Erf reach an adjacent element. In the embodiment, by providing the shield 51, the possibility is reduced that the radio-frequency magnetic field Hrf and the radio-frequency electric field Erf generated from the second stacked unit SB2 will act on an adjacent bit when the distance between bits is decreased. That is, a magnetic memory element in which malfunction is suppressed can be provided.

In the embodiment, the electric potential of the shield 51 is set to a prescribed potential. That is, it is not a floating potential.

If the electric potential of the shield 51 is in a floating state, the electric field (lines of electric force) that has been emitted from the second stacked unit SB2 and has entered the shield 51 goes out again from the shield 51. In contrast, by setting the electric potential of the shield 51 to a prescribed potential, the electric field (lines of electric force) that has been emitted from the second stacked unit SB2 and has entered the shield 51 does not go out of the shield 51. That is, the lines of electric force are terminated.

When the shield 51 is at a floating potential, in order to prevent the radio-frequency electric field Erf from leaking between elements, it is necessary to make the thickness of the shield 51 very thick and this interferes with increasing the density of memory elements.

In contrast, in the embodiment, since the electric potential of the shield 51 is set to a prescribed potential, the thickness of the shield 51 may be thin. Thus, the embodiment can provide a magnetic memory element with high memory density in which malfunction is suppressed.

In the case where a plurality of magnetic memory elements are arranged, the shield 51 suppresses radio-frequency components of a leak magnetic field from an adjacent magnetic memory element affecting the operation of the first stacked unit SB1 and the second stacked unit SB2. Thereby, the current injection amount necessary to generate the rotating magnetic field can be reduced. Furthermore, the possibility is reduced that the radio-frequency leak magnetic field generated from the first stacked unit SB1 and the second stacked unit SB2 will act on an adjacent magnetic memory element. As a consequence, the plurality of magnetic memory elements can be closely arranged to improve the integration degree.

In the magnetic memory element 110 (and the magnetic memory element 110a), the second ferromagnetic layer 20, the first nonmagnetic layer 10n, the first ferromagnetic layer 10, the third nonmagnetic layer 30n, the fourth ferromagnetic layer 40, the second nonmagnetic layer 20n, and the third ferromagnetic layer 30 are stacked in this order. The embodiment is not limited thereto, and the stack configuration may be variously modified.

FIG. 5A to FIG. 5H are schematic cross-sectional views illustrating the configurations of magnetic memory elements according to the first embodiment.

As shown in FIG. 5A to FIG. 5D, in magnetic memory elements 111a to 111d according to the embodiment, the direction of the magnetization of the second ferromagnetic layer 20 (the second direction) is substantially parallel to the stacking direction SD1.

In the magnetic memory elements 111a and 111b, the direction of the magnetization of the first ferromagnetic layer 10 (the first direction) and the direction of the magnetization of the fourth ferromagnetic layer 40 (the fourth direction) are substantially parallel to the stacking direction SD1. In the magnetic memory element 111a, the direction of the magnetization of the third ferromagnetic layer 30 (the third direction) is substantially perpendicular to the stacking direction SD1. This configuration is the same as the configuration of the magnetic memory element 110. In the magnetic memory element 111b, the third direction is substantially parallel to the stacking direction SD1.

In the magnetic memory elements 111c and 111d, the first direction and the fourth direction are substantially perpendicular to the stacking direction SD1. In the magnetic memory element 111c, the third direction is substantially perpendicular to the stacking direction SD1. In the magnetic memory element 111d, the third direction is substantially parallel to the stacking direction SD1.

As shown in FIG. 5E to FIG. 5H, in magnetic memory elements 111e to 111h according to the embodiment, the direction of the magnetization of the second ferromagnetic layer 20 (the second direction) is substantially perpendicular to the stacking direction SD1.

In the magnetic memory elements 111e and 111f, the first direction and the fourth direction are substantially parallel to the stacking direction SD1. In the magnetic memory element 111e, the third direction is substantially perpendicular to the stacking direction SD1. In the magnetic memory element 111f, the third direction is substantially parallel to the stacking direction SD1.

In the magnetic memory elements 111g and 111h, the first direction and the fourth direction are substantially perpendicular to the stacking direction SD1. In the magnetic memory element 111g, the third direction is substantially perpendicular to the stacking direction SD1. In the magnetic memory element 111h, the third direction is substantially parallel to the stacking direction SD1.

FIG. 6A to FIG. 6H are schematic cross-sectional views illustrating the configurations of magnetic memory elements according to the first embodiment.

As shown in FIG. 6A to FIG. 6D, in magnetic memory elements 112a to 112d according to the embodiment, the second stacked unit SB2 includes the third ferromagnetic layer 30 and the second nonmagnetic layer 20n. That is, the fourth ferromagnetic layer 40 is not provided. The second nonmagnetic layer 20n is provided between the first stacked unit SB1 and the third ferromagnetic layer 30.

In the magnetic memory elements 112a and 112b, the direction of the magnetization of the first ferromagnetic layer 10 (the first direction) is substantially parallel to the stacking direction SD1. In the magnetic memory element 112a, the direction of the magnetization of the third ferromagnetic layer 30 (the third direction) is substantially perpendicular to the stacking direction SD1. In the magnetic memory element 112b, the third direction is substantially parallel to the stacking direction SD1.

In the magnetic memory elements 112c and 112d, the first direction is substantially perpendicular to the stacking direction SD1. In the magnetic memory element 112c, the third direction is substantially perpendicular to the stacking direction SD1. In the magnetic memory element 112d, the third direction is substantially parallel to the stacking direction SD1.

As shown in FIG. 6E to FIG. 6H, in magnetic memory elements 112e to 112h according to the embodiment, the second stacked unit SB2 includes the third ferromagnetic layer 30. That is, the second nonmagnetic layer 20n and the fourth ferromagnetic layer 40 are not provided.

In the magnetic memory elements 112e and 112f, the direction of the magnetization of the first ferromagnetic layer 10 (the first direction) is substantially parallel to the stacking direction SD1. In the magnetic memory element 112e, the direction of the magnetization of the third ferromagnetic layer 30 (the third direction) is substantially perpendicular to the stacking direction SD1. In the magnetic memory element 112f, the third direction is substantially parallel to the stacking direction SD1.

In the magnetic memory elements 112g and 112h, the first direction is substantially perpendicular to the stacking direction SD1. In the magnetic memory element 112g, the third direction is substantially perpendicular to the stacking direction SD1. In the magnetic memory element 112h, the third direction is substantially parallel to the stacking direction SD1.

In the magnetic memory elements 112e to 112h, the first ferromagnetic layer 10 has the function of the fourth ferromagnetic layer 40.

In the magnetic memory elements 111a to 111h and 112a to 112h, the direction of the first direction is the same as the direction of the fourth direction. In these magnetic memory elements, the direction of the first direction and the direction of the fourth direction may be the upward direction or the downward direction. The vertical direction in FIG. 5E to FIG. 5H and FIG. 6E to FIG. 6H may be inverted, and the horizontal direction may be reversed.

Also in the magnetic memory elements 111a to 111h and 112a to 112h, by providing the shield 51, a magnetic memory element in which malfunction is suppressed can be provided.

Examples of the configuration of the layers of the magnetic memory element 110 will now be described. The following description can be applied to any magnetic memory element according to the embodiment, including the magnetic memory elements 110a, 111a to 111h, and 112a to 112h.

As the first ferromagnetic layer 10 and the second ferromagnetic layer 20, a metal material including at least one element selected from the group consisting of iron (Fe), cobalt (Co), nickel (Ni), manganese (Mn), and chromium (Cr), for example, is preferably used. In addition, an alloy including at least one selected from the group mentioned above and at least one metal selected from the group consisting of platinum (Pt), palladium (Pd), iridium (Ir), ruthenium (Ru), and rhodium (Rh) may be used.

The characteristics of the first ferromagnetic layer 10 and the second ferromagnetic layer 20 can be adjusted by the composition of the magnetic material included and heat treatment. Furthermore, as the first ferromagnetic layer 10 and the second ferromagnetic layer 20, an amorphous alloy of rare earth-transition metal such as TbFeCo and GdFeCo may be used. A stacked structure such as Co/Pt, Co/Pd, and Co/Ni may be used as the first ferromagnetic layer 10 and the second ferromagnetic layer 20. Co/Ru, Fe/Au, Ni/Cu, and the like become a perpendicular magnetization film depending on the combination with the underlayer. Co/Ru, Fe/Au, Ni/Cu, and the like can be used as the first ferromagnetic layer 10 and the second ferromagnetic layer 20 by controlling the crystalline orientation direction of the film.

An insulating material functioning as a nonmagnetic tunnel barrier layer may be used as the first nonmagnetic layer 10n. Specifically, for example, an oxide, a nitride, or a fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

As the first nonmagnetic layer 10n, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used. In addition, for example, a nonmagnetic semiconductor ($ZnO_x$, InMn, GaN, GaAs, $TiO_x$, Zn, and Te or these materials doped with a transition metal) and the like may be used as the first nonmagnetic layer 10n.

The thickness of the first nonmagnetic layer 10n is preferably set to a value in a range approximately from 0.2 nanometers (nm) to 2.0 nm. Thereby, for example, an excessive high resistance is suppressed while ensuring the uniformity of the insulating film.

As the third ferromagnetic layer 30, for example, a magnetic metal including at least one element selected from the group consisting of iron (Fe), cobalt (Co), nickel (Ni), manganese (Mn), and chromium (Cr) may be used.

As the second nonmagnetic layer 20n, for example, one of a nonmagnetic tunnel barrier layer and a nonmagnetic metal layer may be used.

An insulating material, for example, is used as the nonmagnetic tunnel barrier layer. Specifically, for example, an oxide, a nitride, or a fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used as the nonmagnetic tunnel barrier layer. In addition, as the nonmagnetic tunnel barrier layer, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used.

As the nonmagnetic tunnel barrier layer, a nonmagnetic semiconductor ($ZnO_x$, InMn, GaN, GaAs, $TiO_x$, Zn, and Te or these materials doped with a transition metal) and the like may be used.

In the case where a nonmagnetic tunnel barrier layer is used as the second nonmagnetic layer $20n$, the thickness of the second nonmagnetic layer $20n$ is preferably set to a value in a range approximately from 0.2 nm to 2.0 nm. In the case where a nonmagnetic tunnel barrier layer is used as the second nonmagnetic layer $20n$, the thickness of the second nonmagnetic layer $20n$ is preferably set thinner than that of the first nonmagnetic layer $10n$. Thereby, the possibility is reduced that the write current when the same voltage is applied to the magnetic memory element will decrease due to an increased resistance.

As the nonmagnetic metal layer used as the second nonmagnetic layer $20n$, for example, a nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), and bismuth (Bi) or an alloy including at least two nonmagnetic metals selected from the group mentioned above may be used. The thickness of the second nonmagnetic layer $20n$ is preferably made not less than 1.5 nm and not more than 20 nm. Thereby, an interlayer coupling does not occur between magnetic layers, and the loss of the spin polarization state of a conduction electron is suppressed when the conduction electron passes through the nonmagnetic metal layer.

As the fourth ferromagnetic layer 40, a metal material including at least one element selected from the group consisting of iron (Fe), cobalt (Co), nickel (Ni), manganese (Mn), and chromium (Cr) is preferably used. Furthermore, an alloy including these and at least one element selected from the group consisting of platinum (Pt), palladium (Pd), iridium (Ir), ruthenium (Ru), and rhodium (Rh) may be used.

The characteristics of the fourth ferromagnetic layer 40 can be adjusted by the composition of the magnetic material included and heat treatment. As the fourth ferromagnetic layer 40, an amorphous alloy of rare earth-transition metal such as TbFeCo and GdFeCo may be used. In addition, as the fourth ferromagnetic layer 40, a stacked structure such as Co/Pt, Co/Pd, and Co/Ni may be used. Co/Ru, Fe/Au, Ni/Cu, and the like become a perpendicular magnetization film depending on the combination with the underlayer. Co/Ru, Fe/Au, Ni/Cu, and the like can be used as the fourth ferromagnetic layer 40 by controlling the crystalline orientation direction of the film.

A nonmagnetic metal layer is used as the third nonmagnetic layer $30n$.

The nonmagnetic metal layer used as the third nonmagnetic layer $30n$ may include at least one nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), titanium (Ti), tungsten (W), platinum (Pt), bismuth (Bi), iridium (Ir), and osmium (Os) or an alloy including two or more nonmagnetic metals selected from the group mentioned above. Furthermore, for the nonmagnetic metal layer used as the third nonmagnetic layer $30n$, one of a conductive nitride, a conductive oxide, and a conductive fluoride including at least one element selected from the group mentioned above may be used.

For example, TiN, TaN, and the like may be used as the third nonmagnetic layer $30n$. In addition, a stacked film in which films made of these materials are stacked may be used. A stacked film such as a Ti film/a Ru film/a Ti film and the like, for example, may be used as the third nonmagnetic layer $30n$.

As the third nonmagnetic layer $30n$, a material with a long spin diffusion length such as copper (Cu) or a material with a short spin diffusion length such as ruthenium (Ru) may be used. In the case where it is desirable to cancel the effect of spin-polarized electrons being interposed, a material with a short spin diffusion length such as ruthenium (Ru) is preferably used as the third nonmagnetic layer $30n$.

A conductive magnetic material or a conductive nonmagnetic material is used as the first conductive layer 81 and the second conductive layer 82. Specific examples of the conductive magnetic material include a material similar to the material used as the third ferromagnetic layer 30 and the fourth ferromagnetic layer 40.

Specific examples of the conductive nonmagnetic material used as the first conductive layer 81 and the second conductive layer 82 include a metal selected from the group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), and aluminum (Al) or an alloy including two or more metals selected from the group mentioned above. In addition, as the conductive nonmagnetic material used as the first conductive layer 81 and the second conductive layer 82, one of a conductive nitride, a conductive oxide, and a conductive fluoride including at least one element selected from the group mentioned above may be used.

In addition, as the conductive nonmagnetic material used as the first conductive layer 81 and the second conductive layer 82, a material such as carbon nanotube, carbon nanowire, and graphene may be used.

As described later, a transistor may be directly or indirectly connected to at least one of the first conductive layer 81 and the second conductive layer 82. At this time, for example, the source portion or the drain portion of the transistor may be used as the at least one of the first conductive layer 81 and the second conductive layer 82 mentioned above. Furthermore, at this time, a contact unit connected to the source portion or the drain portion of the transistor, for example, may be used as the at least one of the first conductive layer 81 and the second conductive layer 82 mentioned above.

As described above, the shapes of the first stacked unit SB1 and the second stacked unit SB2 as viewed in the Z-axis direction are arbitrary. For example, the shapes of the first stacked unit SB1 and the second stacked unit SB2 as viewed in the Z-axis direction (the cross-sectional shape obtained by cutting in a plane parallel to the film surface) may have one of a circle, ellipse, flat circle, polygon having three or more angles such as a tetragon and hexagon, and polygon having round angles.

The inventors of the application has found out through a calculation of micromagnetics that, if the third ferromagnetic layer 30 has a diameter larger than 35 nm, the magnetization forms a vortex (closure domain) when making a rotational motion. That is, by setting the circle-equivalent diameter of the cross-sectional shape of the third ferromagnetic layer 30 not more than 35 nm and the thickness not less than 0.5 nm and not more than 3.5 nm, a uniform magnetic field can be caused to act on the second ferromagnetic layer 20 to assist the magnetization rotation while suppressing vortex formation in the rotational motion of the magnetization. That is, a sufficient magnetic field strength to promote the reversal of the magnetization is obtained in the position of the second ferromagnetic layer 20.

Assuming that the circle-equivalent diameter of the horizontal cross-sectional shape (the cross-sectional shape obtained by cutting along a plane perpendicular to the stacking direction SD1) of the third ferromagnetic layer 30 is R (nm), a value half of "R" is r (=R/2) (nm), and the layer thickness is t (nm), a size satisfying the relation of $r<0.419t^2 - 2.86t+19.8$ is preferably used.

In the specification of the application, "circle-equivalent diameter" refers to the diameter of a supposed circle that has an area equal to the area of the planar shape in question. For example, in the case where the horizontal cross-sectional shape of the third ferromagnetic layer 30 is a circle, "R" means the diameter. In the case where the horizontal cross-sectional shape of the third ferromagnetic layer 30 is an ellipse, "R" means the diameter of a circle having an area equal to the area of the ellipse. In the case where the horizontal cross-sectional shape of the third ferromagnetic layer 30 is a polygon, "R" means the diameter of a circle having an area equal to the area of the polygon. The horizontal cross-sectional shape of the third ferromagnetic layer 30 is preferably a circle with a diameter of R. Thereby, the magnetization of the third ferromagnetic layer 30 precesses all at once with a component in the surface perpendicular direction and the rotating magnetic field is applied to the second ferromagnetic layer 20.

As the shield 51, a metal selected from the group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), vanadium (V), zirconium (Zr), magnesium (Mg), silicon (Si), and aluminum (Al) or an alloy including two or more metals selected from the group mentioned above may be used. Further, at least one of a conductive nitride, a conductive oxide and a conductive carbide of the metal recited above may be used.

As the protection layer 52, an oxide, a nitride, or a fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

A method for fabricating a magnetic memory element according to the first embodiment will now be described. In the following, a method for manufacturing the magnetic memory element 110a is described.

A lower electrode (not shown) is formed on a wafer. Next, on the lower electrode, a Ta\Ru layer (a contact layer for contact with an electrode, also functioning as a stopper layer), an FePd\CoFeB layer (the second ferromagnetic layer 20), a MgO layer (the first nonmagnetic layer 10n), a CoFeB\FePt layer (the first ferromagnetic layer 10), and Ru (a cap layer) and a Ta layer (a contact layer for contact with an electrode) are stacked in this order using an ultrahigh vacuum sputter apparatus. Here, the strength of the magnetic anisotropy in the film surface perpendicular direction of the FePd\CoFeB layer, the CoFeB\FePt layer and the FePt\CoFeB layer can be adjusted by annealing in a magnetic field.

Next, an EB resist is applied to perform EB exposure to form a resist mask with a diameter of 20 nm. Ion milling is performed to remove the portions not covered with the resist mask until the Ta layer also functioning as a stopper layer on the lower electrode becomes exposed.

Subsequently, a SiN layer is formed as the protection layer 52, and then a Ta\Cu\Ta layer functioning as the shield 51 is formed. Etchback is performed so that the Ta\Cu\Ta layer may remain at the side wall of the magnetic memory element.

Next, a SiO$_2$ film is deposited in order to perform insulating embedding on the magnetic memory element, then planarization is performed by CMP or the like, and then RIE (reactive ion etching) or the like is performed to etch the entire surface to expose the contact layer for contact with an electrode.

Further, a resist is applied to the entire surface of the workpiece, and a stepper exposure apparatus is used to perform patterning on the resist so that a portion not covered with the resist may be created in the position of a shield interconnection 51l. RIE is performed to remove the portions not covered with the resist, and the resist is removed. Then the shield interconnection 51l is formed using Cu damascene process.

Further, the upper electrode and the connection via are formed. The upper electrode is provided with a not-shown interconnection to enable electrical inputting and outputting. The lower electrode is provided with a not-shown interconnection to enable electrical inputting and outputting.

Second Embodiment

Figure 7A:
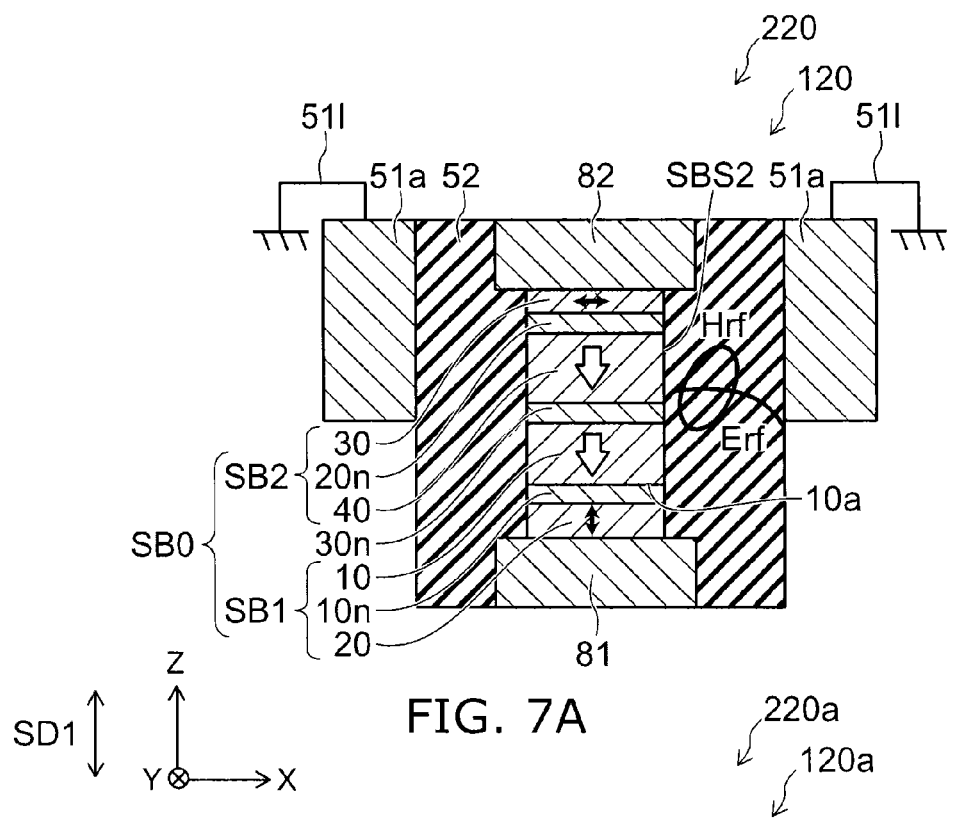
FIG. 7A and FIG. 7B are schematic cross-sectional views showing magnetic memory elements according to a second embodiment.
Figure 7B:
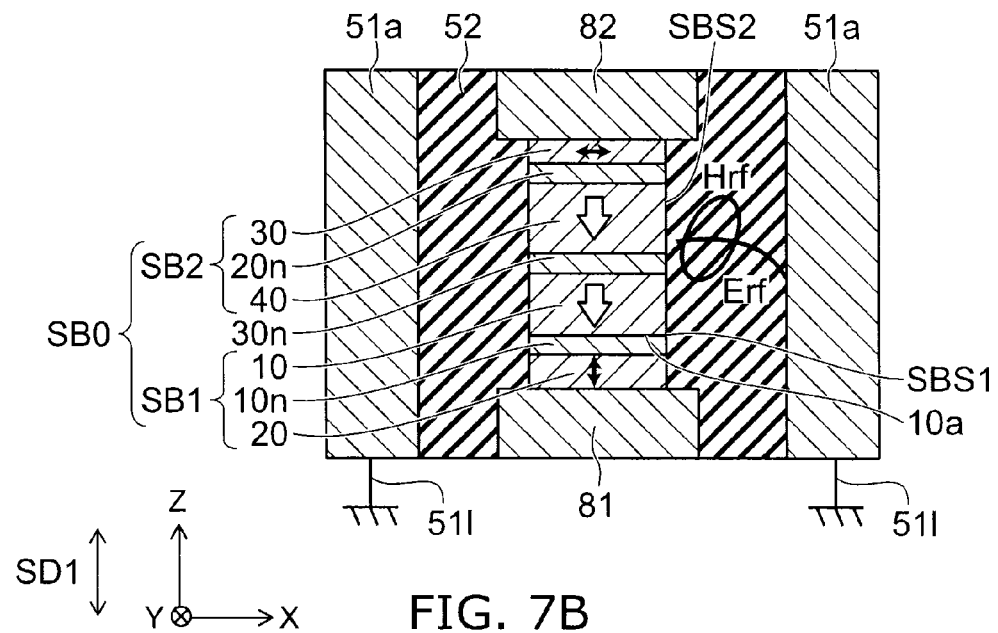
Figures 10A, 10B, 10C, 10D, 10E, 10F, 10G, 10H:
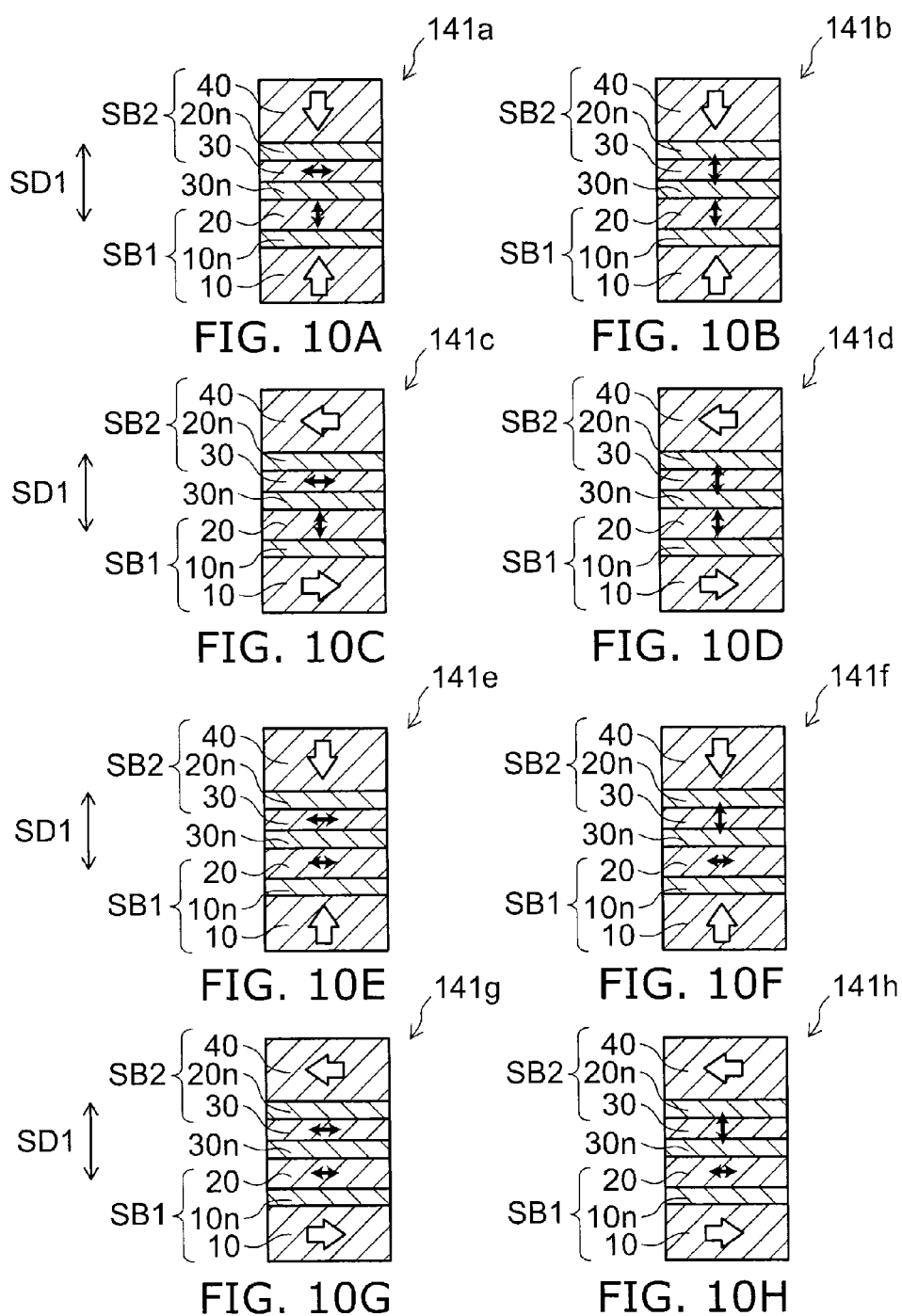
FIG. 10A to FIG. 10H are schematic cross-sectional views showing magnetic memory elements according to a fourth embodiment.

FIG. 7A and FIG. 7B are schematic cross-sectional views illustrating the configurations of magnetic memory elements according to a second embodiment.

As shown in FIG. 7A, a magnetic memory element 120 according to the embodiment includes the stacked body SB0 and a shield 51a. The stacked body SB0 includes the first stacked unit SB1 and the second stacked unit SB2. The shield 51a is opposed to the second stacked unit SB2.

As shown in FIG. 7B, in a magnetic memory element 120a according to the embodiment, the shield 51a is opposed to the side surface SBS2 of the second stacked unit SB2 and is further opposed to the side surface SBS1 of the first stacked unit SB1.

In the embodiment, the shield 51a is a conductive magnetic substance. Otherwise, the embodiment is similar to the first embodiment and a description is therefore omitted.

Also in this case, a plurality of magnetic memory elements 120 may be used to form a nonvolatile memory device 220. In the nonvolatile memory device 220, if the shield 51 is not provided, the radio-frequency magnetic field Hrf and the static magnetic field Hdc from the second stacked unit SB2 may adversely affect other elements when magnetic memory elements 120 are close to one another.

In the embodiment, the shield 51a is electrically conductive and is also a magnetic substance. Therefore, the shield 51a attenuates or blocks not only the radio-frequency magnetic field Hrf generated from the second stacked unit SB2 but also the static magnetic field Hdc. Thereby, a magnetic memory element in which malfunction is further suppressed can be provided.

When the shield is not provided, both the static magnetic field Hdc and the radio-frequency magnetic field Hrf adversely affect an adjacent element.

In the embodiment, as the shield 51a, a metal selected from the group consisting of iron (Fe), cobalt (Co), nickel (Ni), manganese (Mn), and chromium (Cr) or an alloy including two or more metals selected from the group may be used.

As the shield 51a, an alloy including at least one metal selected from the group consisting of iron (Fe), cobalt (Co), nickel (Ni), manganese (Mn), and chromium (Cr) and at least one metal selected from the group consisting of platinum (Pt), palladium (Pd), iridium (Ir), ruthenium (Ru), and rhodium (Rh) may be used.

The characteristics of the shield 51a can be adjusted by the composition of the magnetic material included in the shield 51a and heat treatment. Furthermore, as the shield 51a, an amorphous alloy of rare earth-transition metal such as TbFeCo and GdFeCo may be used. Furthermore, a stacked structure such as Co/Pt, Co/Pd, and Co/Ni may be used as the shield 51a.

The materials described in regard to the first embodiment may be used as the protection layer 52.

The configurations described in regard to the magnetic memory elements 111a to 111h and 112a to 112h can be applied to the embodiment. Also in those cases, by providing the shield 51a that is electrically conductive and is a magnetic substance, a magnetic memory element in which malfunction is further suppressed can be provided.

A method for fabricating a magnetic memory element according to the second embodiment will now be described. In the following, a method for manufacturing the magnetic memory element 120a is described.

A lower electrode (not shown) is formed on a wafer. Next, on the lower electrode, a Ta\Ru layer (a contact layer for contact with an electrode, also functioning as a stopper layer), an FePd\CoFeB layer (the second ferromagnetic layer 20), a MgO layer (the first nonmagnetic layer 10n), a CoFeB\FePt layer (the first ferromagnetic layer 10), and Ru (a cap layer) and a Ta layer (a contact layer for contact with an electrode) are stacked in this order using an ultrahigh vacuum sputter apparatus. Here, the strength of the magnetic anisotropy in the film surface perpendicular direction of the FePd\CoFeB layer, the CoFeB\FePt layer and the FePt\CoFeB layer can be adjusted by annealing in a magnetic field.

Next, an EB resist is applied to perform EB exposure to form a resist mask with a diameter of 20 nm. Ion milling is performed to remove the portions not covered with the resist mask until the Ta layer also functioning as a stopper layer on the lower electrode becomes exposed.

Subsequently, a SiN layer is formed as the protection layer 52, and then a Ta\Py\Ta layer functioning as the shield 51 is formed. Etchback is performed so that the Ta\Py\Ta layer may remain at the side wall of the magnetic memory element.

Next, a SiO$_2$ film is deposited in order to perform insulating embedding on the magnetic memory element, then planarization is performed by CMP or the like, and then RIE or the like is performed to etch the entire surface to expose the contact layer for contact with an electrode.

Furthermore, a resist is applied to the entire surface of the workpiece, and a stepper exposure apparatus is used to perform patterning on the resist so that a portion not covered with the resist may be created in the position of a shield interconnection 51l. RIE is performed to remove SiO$_2$ in the portions not covered with the resist, and the resist is removed to form the opening of the shield interconnection 51l. Then the shield interconnection 51l is formed using Cu damascene process.

Furthermore, the upper electrode is provided with a not-shown interconnection to enable electrical inputting and outputting. The lower electrode is provided with a not-shown interconnection to enable electrical inputting and outputting.

Also magnetic memory elements according to a third to a sixth embodiment described below include the stacked body SB0 and the shield 51. Alternatively, they include the stacked body SB0 and the shield 51a. They may further include the protection layer 52. Similar configurations to those described in regard to the first and second embodiments can be applied to the shield 51, the shield 51a, and the protection layer 52. In the following, the stacked body SB0 is described.

Third Embodiment

FIG. 8A to FIG. 8H are schematic cross-sectional views illustrating the configurations of magnetic memory elements according to a third embodiment.

The drawings illustrate configurations of the stacked body SB0.

As shown in FIG. 8A to FIG. 8H, in magnetic memory elements 131a to 131h according to the embodiment, the first ferromagnetic layer 10 is disposed between the second ferromagnetic layer 20 and the fourth ferromagnetic layer 40, and the fourth ferromagnetic layer 40 is disposed between the first ferromagnetic layer 10 and the second ferromagnetic layer 20

In the embodiment, the direction of the component projected onto the stacking direction SD1 of the first direction is opposite to the direction of the component projected onto the stacking direction SD1 of the fourth direction. That is, the direction of the component of the first direction parallel to the stacking direction SD1 is opposite to the direction of the component of the fourth direction parallel to the stacking direction SD1.

The directions of the magnetizations of the second ferromagnetic layers 20 (the second directions) in the magnetic memory elements 131a to 131h are the same as the directions of the magnetizations of the second ferromagnetic layers 20 (the second directions) in the magnetic memory elements 111a to 111h, respectively. The directions of the magnetizations of the third ferromagnetic layers 30 (the third directions) in the magnetic memory elements 131a to 131h are the same as the directions of the magnetizations of the third ferromagnetic layers 30 (the third directions) in the magnetic memory elements 111a to 111h, respectively.

In the magnetic memory elements 131a, 131b, 131e, and 131f, the first direction is the upward direction and the fourth direction is the downward direction. The first direction may be the downward direction and the fourth direction may be the upward direction. The vertical direction in FIG. 8E to FIG. 8H may be inverted, and the horizontal direction may be reversed.

For example, in the write operation, a write current Iw is passed through the stacked body SB0, the first conductive layer 81 and the second conductive layer 82. The direction of the write current Iw is arbitrary. The direction of the rotating magnetic field generated in the third ferromagnetic layer 30 (the rotating magnetic field direction) and the direction in which the magnetization of the second ferromagnetic layer 20 precesses (the precession direction) agree with each other. The rotating magnetic field generated in the third ferromagnetic layer 30 acts on the second ferromagnetic layer 20 more effectively. Thereby, the magnetization reversal of the second ferromagnetic layer 20 can be more efficiently assisted. As a result, the current necessary for writing to the second ferromagnetic layer 20 can be more reduced.

In the read operation RO, a read current Ir is passed through the stacked body SB0, the first conductive layer 81 and the second conductive layer 82. The direction of the read current Ir is arbitrary. The value of the read current Ir is set to a value lower than the value of the write current Iw.

FIG. 9A to FIG. 9D are schematic cross-sectional views illustrating the configurations of one other magnetic memory elements according to the third embodiment.

As shown in FIG. 9A to FIG. 9D, in other magnetic memory elements 132a to 132d according to the embodiment, the direction of the magnetization of the first ferromagnetic layer 10 (the first direction) and the direction of the magnetization of the fourth ferromagnetic layer 40 (the fourth direction) are oblique to the film surface.

In the magnetic memory elements 131a to 131h and 132a to 132d, the direction of the component projected onto the stacking direction SD1 of the first direction is opposite to the direction of the component projected onto the stacking direction SD1 of the fourth direction. That is, the direction of the component of the first direction parallel to the stacking direction SD1 is opposite to the direction of the component of the fourth direction parallel to the stacking direction SD1. In this case, the leak magnetic field applied in the direction perpendicular to the film surface in the position of the second ferromagnetic layer 20 can be reduced. That is, the leak magnetic field applied in the direction perpendicular to the film surface in the position of the second ferromagnetic layer 20 can be canceled. On the other hand, the leak magnetic field applied in the direction perpendicular to the film surface in the position of the third ferromagnetic layer 30 can be caused to remain and act.

Thereby, the direction of the rotating magnetic field generated in the third ferromagnetic layer 30 and the direction in which the magnetization of the second ferromagnetic layer 20 precesses agree with each other. Thereby, the magnetization reversal of the second ferromagnetic layer 20 can be efficiently assisted by the rotating magnetic field generated in the third ferromagnetic layer 30. As a result, the current necessary for storing (writing) information to the second ferromagnetic layer 20 can be reduced.

In the embodiment, the first ferromagnetic layer 10 and the fourth ferromagnetic layer 40 may be coupled antiferromagnetically via the third nonmagnetic layer. Such a structure in which mutual magnetization directions are coupled antiferromagnetically via a nonmagnetic layer to become antiparallel is called a synthetic anti-ferromagnetic (SAF) structure. In this example, the stacked structure of "a first magnetic layer (e.g. the first ferromagnetic layer 10)/a nonmagnetic layer (e.g. the third nonmagnetic layer)/a second magnetic layer (e.g. the fourth ferromagnetic layer 40)" corresponds to the SAF structure.

Using the SAF structure can enhance the mutual magnetization fixing strength and increase resistance to external magnetic fields and thermal stability. In the structure, the leak magnetic field applied in the direction perpendicular to the film surface in the position of the magnetic memory layer (e.g. the second ferromagnetic layer 20) can be made almost zero.

A metal material such as ruthenium (Ru), iridium (Ir), and osmium (Os) is used as the nonmagnetic layer (intermediate layer) in the SAF structure. The thickness of the nonmagnetic layer is set not more than 3 nm. Thereby, a sufficiently strong antiferromagnetic coupling is obtained via the nonmagnetic layer.

That is, the third nonmagnetic layer preferably includes a metal selected from the group consisting of ruthenium (Ru), osmium (Os), and iridium (Ir) or an alloy including at least two metals selected from the group, and the thickness of the third nonmagnetic layer is preferably not more than 3 nm.

The dimensions (width, thickness, etc.) of the layers included in the magnetic memory element according to the embodiment are found through an electron microscope photographic image or the like, for example.

Fourth Embodiment

FIG. 10A to FIG. 10H are schematic cross-sectional views illustrating the configurations of magnetic memory elements according to a fourth embodiment.

The drawings illustrate configurations of the stacked body SB0 according to the embodiment.

As shown in FIG. 10A to FIG. 10H, in magnetic memory elements 141a to 141h according to the embodiment, the second ferromagnetic layer 20 is disposed between the first ferromagnetic layer 10 and the third ferromagnetic layer 30, and the third ferromagnetic layer 30 is disposed between the second ferromagnetic layer 20 and the fourth ferromagnetic layer 40.

In the embodiment, the direction of the component of the first direction parallel to the stacking direction SD1 is opposite to the direction of the component of the fourth direction parallel to the stacking direction SD1.

The second directions in the magnetic memory elements 141a to 141h are the same as the second directions in the magnetic memory elements 111a to 111h, respectively. The third directions in the magnetic memory elements 141a to 141h are the same as the third directions in the magnetic memory elements 111a to 111h, respectively.

Also in these cases, the direction of the magnetization of the first ferromagnetic layer 10 and the direction of the magnetization of the fourth ferromagnetic layer 40 may be oblique to the film surface.

The write current Iw is passed through the stacked body SB0, the first conductive layer 81 and the second conductive layer 82. The direction of the write current Iw is arbitrary. The direction of the rotating magnetic field generated in the third ferromagnetic layer 30 and the direction in which the magnetization of the second ferromagnetic layer 20 precesses agree with each other. For example, these directions are a counterclockwise direction CCW.

In the magnetic memory elements 141a to 141h, the distance between the second ferromagnetic layer 20 and the third ferromagnetic layer 30 is shorter than that in the magnetic memory elements 131a to 131h. Thereby, the rotating magnetic field generated in the third ferromagnetic layer 30 can act more on the second ferromagnetic layer 20, and the magnetization reversal of the second ferromagnetic layer 20 can be assisted more efficiently. Thereby, the current necessary for writing to the second ferromagnetic layer 20 can be more reduced.

For example, in the magnetic memory element 141a, if the spin information is kept in the third nonmagnetic layer 30n, the third ferromagnetic layer 30 is affected by the spin-transfer torque from the second ferromagnetic layer 20. This may cause a decrease in the controllability of the magnetization rotation of the third ferromagnetic layer 30. At this time, as the third nonmagnetic layer 30n, a film with a short spin diffusion length such as, for example, ruthenium (Ru) (a material having the function of spin cancel) or a layer having a structure with a short spin diffusion length is preferably used. This can suppress the decrease in the controllability of the magnetization rotation of the third ferromagnetic layer 30.

That is, the magnitude of the spin-transfer torque for the magnetization of the third ferromagnetic layer 30 to precess is determined by the spin polarization in the fourth ferromagnetic layer 40. In this configuration, the magnetization of the third ferromagnetic layer 30 can be independently controlled without being affected by the spin of other electrons (spin-transfer torque).

As the material of the third nonmagnetic layer 30n providing such a spin cancel effect, a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more metals selected from the group can be given.

The thickness of the third nonmagnetic layer 30n is preferably set to a value that does not cause an interlayer magnetic coupling between the second ferromagnetic layer 20 and the third ferromagnetic layer 30. Specifically, the thickness of the third nonmagnetic layer 30n is preferably set not less than 1.4 nm.

If the thickness of the third nonmagnetic layer 30n is not less than 1.4 nm, the second ferromagnetic layer 20 and the third ferromagnetic layer 30 are not interlayer-coupled, and the spin polarization degree can be canceled in the third nonmagnetic layer 30n when conduction electrons pass through the interior and interface of the third nonmagnetic layer 30n. Furthermore, the third nonmagnetic layer 30n can prevent the precession of the third ferromagnetic layer 30 from changing due to the direction of the magnetization of the second ferromagnetic layer 20.

On the other hand, if the thickness of the third nonmagnetic layer 30n exceeds 20 nm, the pillar formation of a multiple-layer film is difficult. Furthermore, the strength of the rotating magnetic field generated from the third ferromagnetic layer 30 decreases in the position of the second ferromagnetic layer 20. Therefore, the thickness of the third nonmagnetic layer 30n is preferably set not more than 20 nm.

As the third nonmagnetic layer 30n, a stacked film may be used as well as the single-layer film described above. The stacked film may have, for example, a stacked configuration of the following layers: a layer including a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more metals selected from the group; and a copper (Cu) layer stacked at least on one side of the layer.

In addition, the stacked film used as the third nonmagnetic layer 30n may have a stacked configuration including a first layer and a second layer stacked at least on one side of the first layer. The first layer includes, for example, a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more metals selected from the group. The second layer includes an oxide including at least one element selected from the group consisting of aluminum (Al), magnesium (Mg), titanium (Ti), iron (Fe), cobalt (Co), nickel (Ni), vanadium (V), chromium (Cr), tantalum (Ta), tungsten (W), and ruthenium (Ru).

Fifth Embodiment

FIG. 11A to FIG. 11H are schematic cross-sectional views illustrating the configurations of magnetic memory elements according to a fifth embodiment.

The drawings illustrate configurations of the stacked body SB0 according to the embodiment.

As shown in FIG. 11A to FIG. 11H, in magnetic memory elements 151a to 151h according to the embodiment, the first ferromagnetic layer 10 is disposed between the second ferromagnetic layer 20 and the third ferromagnetic layer 30, and the third ferromagnetic layer 30 is disposed between the first ferromagnetic layer 10 and the fourth ferromagnetic layer 40.

In the embodiment, the direction of the component of the first direction parallel to the stacking direction SD1 is opposite to the direction of the component of the fourth direction parallel to the stacking direction SD1.

The second directions in the magnetic memory elements 151a to 151h are the same as the second directions in the magnetic memory elements 111a to 111h, respectively. The third directions in the magnetic memory elements 151a to 151h are the same as the third directions in the magnetic memory elements 111a to 111h, respectively.

Also in these cases, the direction of the magnetization of the first ferromagnetic layer 10 and the direction of the magnetization of the fourth ferromagnetic layer 40 may be oblique to the film surface.

The write current Iw is passed through the stacked body SB0, the first conductive layer 81 and the second conductive layer 82. The direction of the write current Iw is arbitrary. By applying a magnetic field in the direction opposite to the direction of the magnetization of the fourth ferromagnetic layer 40, the direction of the rotating magnetic field generated in the third ferromagnetic layer 30 and the direction in which the magnetization of the second ferromagnetic layer 20 precesses can be caused to agree with each other.

Sixth Embodiment

FIG. 12A to FIG. 12H are schematic cross-sectional views illustrating the configurations of magnetic memory elements according to a sixth embodiment.

The drawings illustrate configurations of the stacked body SB0 according to the embodiment.

As shown in FIG. 12A to FIG. 12H, in magnetic memory elements 161a to 161h according to the embodiment, the second ferromagnetic layer 20 is disposed between the first ferromagnetic layer 10 and the fourth ferromagnetic layer 40, and the fourth ferromagnetic layer 40 is disposed between the second ferromagnetic layer 20 and the third ferromagnetic layer 30.

In the embodiment, That is, the direction of the component of the first direction parallel to the stacking direction SD1 is opposite to the direction of the component of the fourth direction parallel to the stacking direction SD1.

The second directions in the magnetic memory elements 161a to 161h are the same as the second directions in the magnetic memory elements 111a to 111h, respectively. The third directions in the magnetic memory elements 161a to 161h are the same as the third directions in the magnetic memory elements 111a to 111h, respectively.

Also in these cases, the direction of the magnetization of the first ferromagnetic layer 10 and the direction of the magnetization of the fourth ferromagnetic layer 40 may be oblique to the film surface.

The write current 1w is passed through the stacked body SB0, the first conductive layer 81 and the second conductive layer 82. The direction of the write current Iw is arbitrary. By applying a magnetic field in the direction opposite to the direction of the magnetization of the fourth ferromagnetic layer 40, the direction of the rotating magnetic field generated in the third ferromagnetic layer 30 and the direction in which the magnetization of the second ferromagnetic layer 20 precesses can be caused to agree with each other.

In the configurations illustrated in the magnetic memory elements 131a to 131h, 141a to 141h, 151a to 151h, and 161a to 161h, as described in regard to FIGS. 6A to 6H, the fourth ferromagnetic layer 40 is provided as necessary and may be omitted. Furthermore, the second nonmagnetic layer 20n may be omitted.

An interconnection is connected to the third nonmagnetic layer 30n, and then the magnitude and direction of the current between the first conductive layer 81 and the third nonmagnetic layer 30n may be differentiated from the magnitude and direction of the current between the second conductive layer 82 and the third nonmagnetic layer 30n in at least one of the write operation and the read operation. This operation includes the case where no current is passed. That is, the first stacked unit SB1 and the second stacked unit SB2 may be operated independently of each other.

The characteristics (e.g. frequency) of the radio-frequency magnetic field generated in the third ferromagnetic layer 30 change with the state of the magnetization of the second ferromagnetic layer 20. For example, the leak magnetic field in the third ferromagnetic layer 30 changes based on the stored information (the direction of the magnetization) stored in the second ferromagnetic layer 20. This may be detected as a change in the frequency of the radio-frequency magnetic field generated in the third ferromagnetic layer 30 to read out the stored information.

Seventh Embodiment

Figure 13:
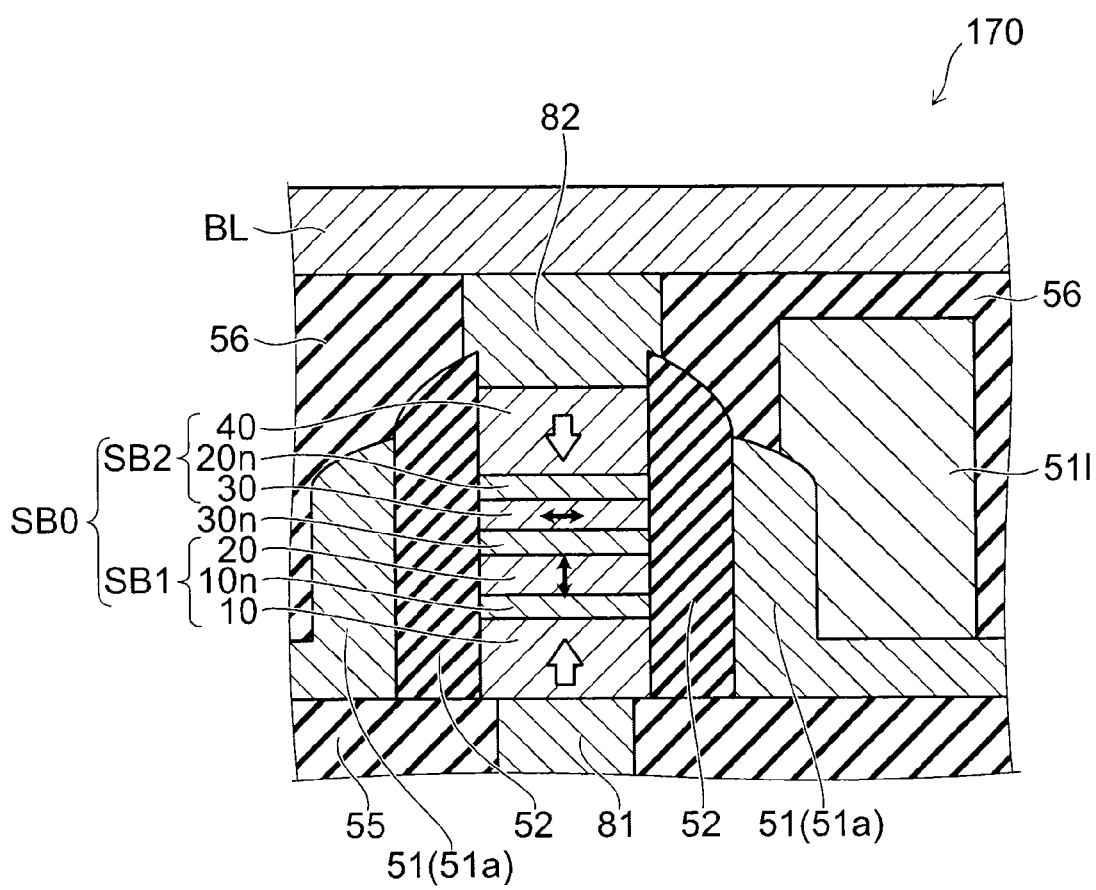
FIG. 13 is a schematic cross-sectional view showing a magnetic memory element according to a seventh embodiment.

FIG. 13 is a schematic cross-sectional view illustrating the configuration of a magnetic memory element according to a seventh embodiment. As shown in FIG. 13, a magnetic memory element 170 according to the embodiment includes the stacked body SB0, the shield 51, and the shield interconnection 51l. The shield interconnection 51l is electrically connected to the shield 51. The shield 51 may be the shield 51a. In this example, the configuration of the magnetic memory element 141a is used as the stacked body SB0.

In this example, the first conductive layer 81 is formed in part of an underlayer 55. The first conductive layer 81 functions as an interconnection. The first conductive layer 81 is connected to, for example, the drain of a transistor for control (not shown)

The stacked body SB0 is provided on the first conductive layer 81. The protection layer 52 is provided so as to cover the side wall of the stacked body SB0. The shield 51 is provided around the protection layer 52. The shield interconnection 51l is provided in contact with the shield 51. An interlayer insulating layer 56 covering the stacked body SB0, the protection layer 52, the shield 51, and the shield interconnection 51l is provided. Part of the interlayer insulating layer 56 is removed, and the second conductive layer 82 is provided in the removed portion. The second conductive layer 82 is located on the stacked body SB0. The second conductive layer 82 functions as an interconnection. An interconnection (e.g. a bit line BL) electrically connected to the second conductive layer 82 is provided on the second conductive layer 82 and the interlayer insulating layer 56.

SiN, for example, is used as the protection layer 52. SiO$_2$ or the like, for example, is used as the interlayer insulating layer 56. However, the materials of them are arbitrary A Cu layer, for example, is used as the shield interconnection 51l. Also a stacked film of a Cu layer and a barrier metal layer of Ti, TiN, TaN, or the like may be used. The shield interconnection 51l is connected to, for example, a terminal at the ground potential, the power supply potential, or the like in a peripheral circuit unit.

In the magnetic memory elements according to the first to seventh embodiments, the size (e.g. the width in the X-axis direction or the width in the Y-axis direction) of the first stacked unit SB1 projected onto the X-Y plane may be equal to, smaller than, or larger than the size of the second stacked unit SB2 projected onto the X-Y plane.

The thickness of the protection layer 52 is preferably approximately equal to or larger than the distance (the distance in the Z-axis direction from the center (the center in the Z-axis direction) of the second ferromagnetic layer 20 to the center (the center in the Z-axis direction) of the third ferromagnetic layer 30. The distance (the distance in the Z-axis direction) from the center of the second ferromagnetic layer 20 to the center of the third ferromagnetic layer 30 is smallest in the case of the fourth embodiment. The distance is largest in the case of the first embodiment. The thickness of the protection layer 52 is preferably not less than 2 nm and not more than 30 nm.

Eighth Embodiment

The embodiment relates to a nonvolatile memory device.

Figure 14A:
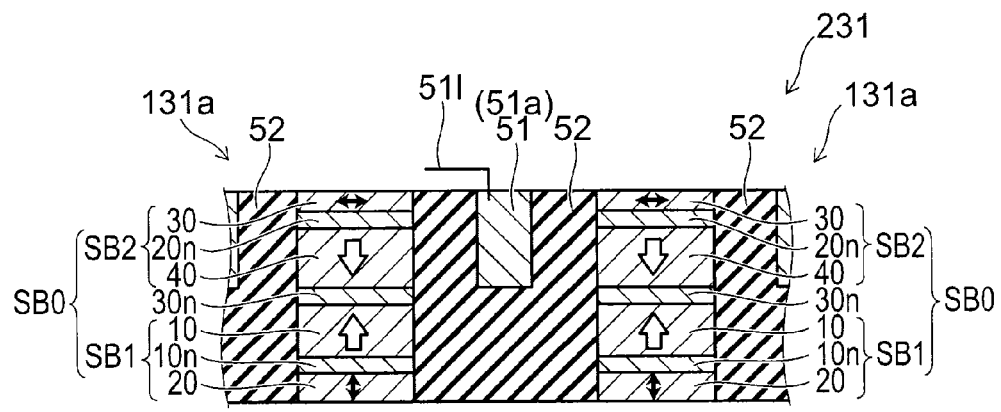
FIG. 14A and FIG. 14B are schematic cross-sectional views showing nonvolatile memory devices according to an eighth embodiment.
Figure 14B:
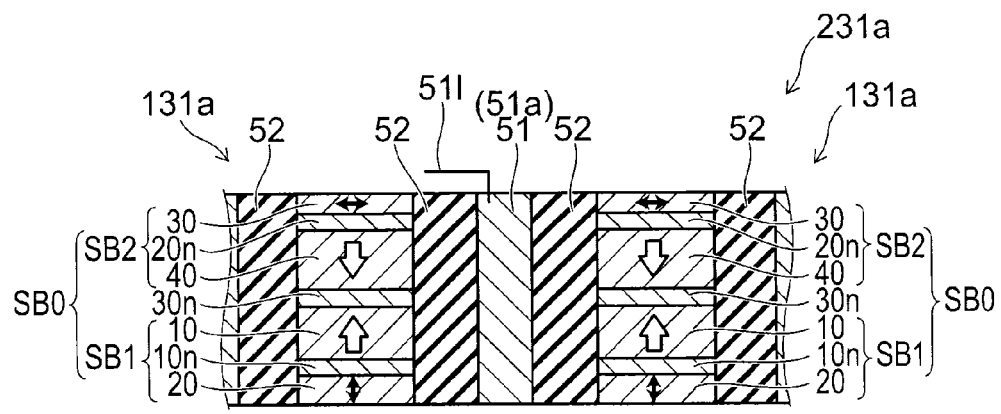

FIG. 14A and FIG. 14B are schematic cross-sectional views illustrating the configurations of nonvolatile memory devices according to an eighth embodiment.

As shown in FIG. 14A, a nonvolatile memory device 231 according to the embodiment includes a plurality of magnetic memory elements. In this example, the magnetic memory element 131a is provided. However, the embodiment is not limited thereto, and the magnetic memory elements described in regard to the first to seventh embodiments and modifications thereof may be used. In the following, a description is given using the case where the magnetic memory element 131a is used.

In the nonvolatile memory device 231, the shield 51 (or the shield 51a) is disposed between magnetic memory elements 131a. In this example, the shield 51 (or the shield 51a) is opposed to the second stacked units SB2 of the magnetic memory elements 131a. By providing the shield 51 (or the shield 51a) between magnetic memory elements 131a, the influence of radio-frequency electromagnetic waves between elements is suppressed.

As shown in FIG. 14B, in a nonvolatile memory device 231a according to the embodiment, the shield 51 (or the shield 51a) is opposed to the second stacked units SB2 and the first stacked units SB1 of the magnetic memory elements 131a. Also in this case, the influence of radio-frequency electromagnetic waves between elements is suppressed.

The embodiment can provide a nonvolatile memory device in which malfunction is suppressed.

Examples of the configuration of the nonvolatile memory device according to the embodiment will now be described. Although the case of using the shield 51 is described in the following, the shield 51a of a conductive magnetic substance may be used instead of the shield 51.

Figure 15:
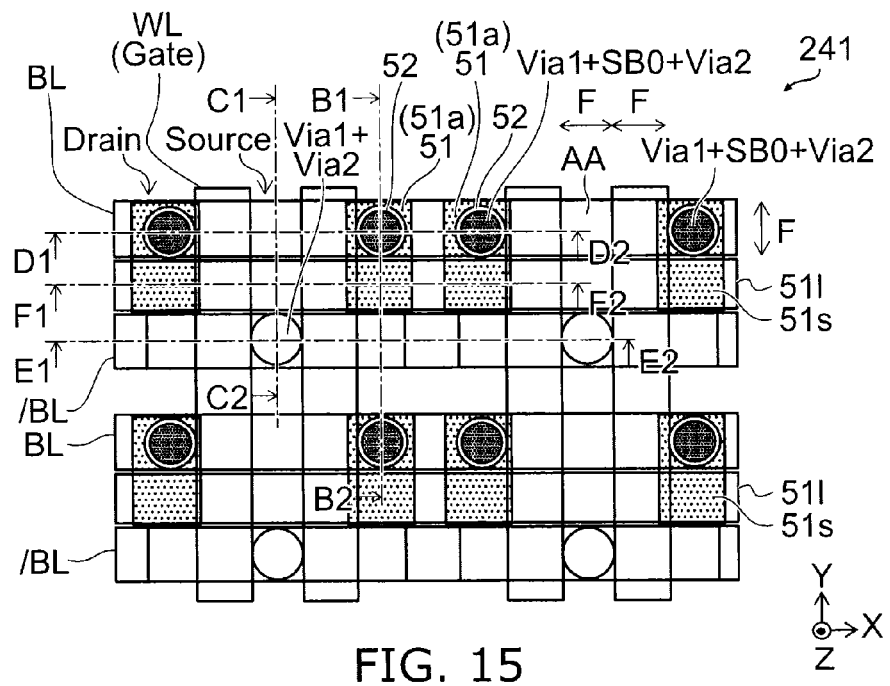
FIG. 15 is a schematic plan view showing a nonvolatile memory device according to the eighth embodiment.

FIG. 15 is a schematic plan view illustrating the configuration of a nonvolatile memory device according to the eighth embodiment.

Figures 16A, 16B, 16C:
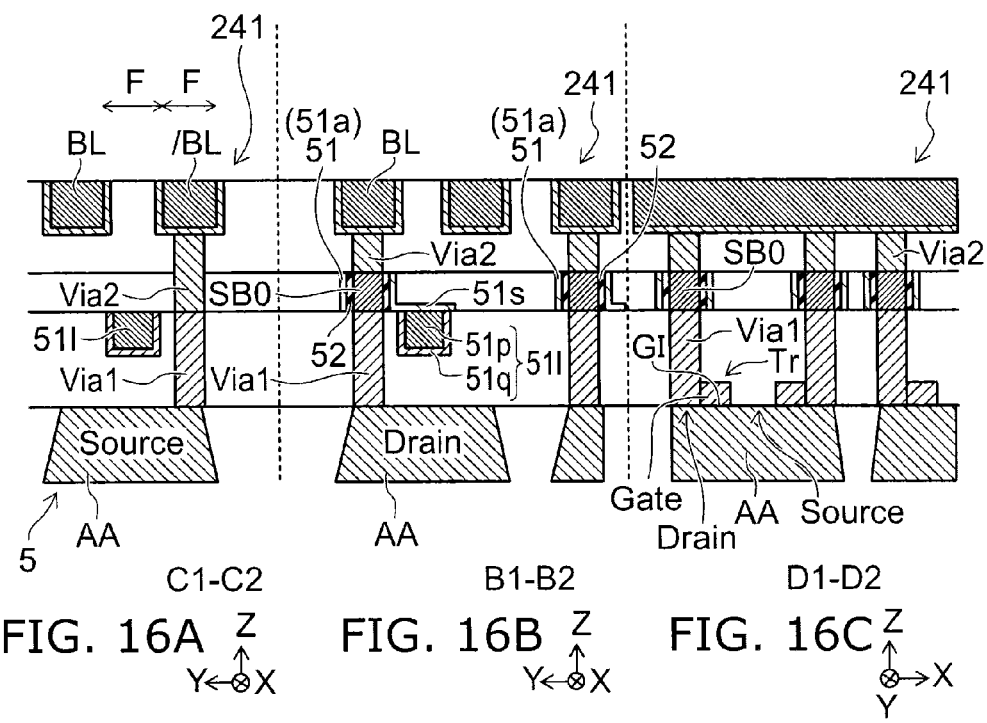
FIG. 16A to FIG. 16C are schematic cross-sectional views showing the nonvolatile memory device according to the eighth embodiment.

FIG. 16A to FIG. 16C are schematic cross-sectional views illustrating the configuration of the nonvolatile memory device according to the eighth embodiment.

FIG. 16A to FIG. 16C are cross-sectional views taken along line C1-C2, line B1-B2, and line D1-D2, respectively, of FIG. 15.

Figures 17A, 17B:
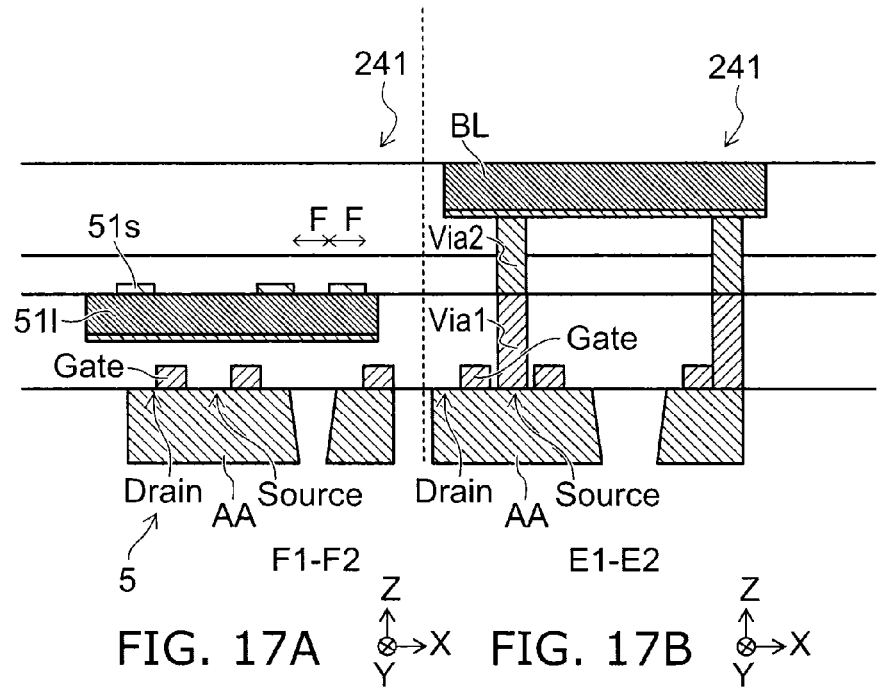
FIG. 17A and FIG. 17B are schematic cross-sectional views showing the nonvolatile memory device according to the eighth embodiment.

FIG. 17A and FIG. 17B are schematic cross-sectional views illustrating the configuration of the nonvolatile memory device according to the eighth embodiment.

FIG. 17A and FIG. 17B are cross-sectional views taken along line F1-F2 and line E1-E2, respectively, of FIG. 15.

In FIG. 15, FIG. 16A to FIG. 16C, and FIG. 17A and FIG. 17B, for easier viewing of the drawings, element isolation insulating films and interlayer insulating films are not shown. However, of the insulative layers, the protection layer 52 is shown. The stacked body SB0 is shown by the figure of one configuration.

As shown in FIG. 15, a nonvolatile memory device 241 according to the embodiment includes a plurality of bit lines BL and a plurality of bit line bars /BL. Each of the bit line bars /BL is disposed between bit lines BL. In this example, the bit line BL and the bit line bar /BL extend in the X-axis direction. A plurality of shield interconnections 51l are provided. In this example, the shield interconnection 51l extends in the X-axis direction. The extending direction of the shield interconnection 51l is parallel to the extending direction of the bit line BL.

For example, the width of the bit line BL and the width of the bit line bar/BL are the minimum design line width F. The distance between the bit line BL and the bit line bar/BL is the minimum line width F. The width of the shield interconnection 51l is, for example, the minimum line width F.

A plurality of word lines WL are provided. The word line WL extends in the Y-axis direction. The width of the word line WL is the minimum line width F. The distance between word lines WL is the minimum line width F in a first region, and is, for example, three times the minimum line width F in a second region.

In the nonvolatile memory device 241, the footprint of the memory element is, for example, 12 $F^2$.

As shown in FIG. 16A to FIG. 16C and FIG. 17A and FIG. 17B, a substrate 5 is provided. A plurality of active areas AA are provided in the substrate 5. An element isolation insulating layer (not shown) is provided between active areas AA. A source and a drain are provided in the active area AA. A gate insulating film G1 is provided between the source and the drain on the active area AA. A gate is provided on the gate insulating film G1. Thereby, a transistor Tr is formed. The gate forms the word line WL.

A first via Via1 is provided on the drain. The first via Via1 extends in the Z-axis direction. The stacked body SB0 (a memory element) is disposed on the first via Via1. The first via Via1 may be one of the first conductive layer 81 and the second conductive layer 82.

A second via Via2 is provided on the stacked body SB0. The second via Via2 may be the other of the first conductive layer 81 and the second conductive layer 82. The bit line BL is provided on the second via Via2.

On the first via Via1 provided on the source, the stacked body SB0 is not interposed but the second via Via2 is provided. The bit line bar/BL is provided on the second via Via2.

The shield 51 (or the shield 51a) is provided opposite to the side surface of the stacked body SB0. The protection layer 52 is provided between the stacked body SB0 and the shield 51. The conductive film forming the shield 51 extends in the Y-axis direction to form a shield connection portion 51s.

In this example, the shield interconnection 51l is provided in a layer in which the first via Via 1 is provided on the substrate 5. In this example, the shield interconnection 51l includes a conductive unit 51p and a barrier metal layer 51q. The barrier metal layer 51q is provided opposite to the side surface and the lower surface of the conductive unit 51p. The upper surface of the shield interconnection 51l is connected to the shield connection portion 51s.

Thus, in the nonvolatile memory device 241, one end of the stacked body SB0 is connected to the drain of the transistor Tr through the first via Via1. The other end of the stacked body SB0 is connected to the bit line BL through the second via Via2. The source of the transistor Tr is connected to the bit line bar/BL through the first via Via 1 and the second via Via2. The gate of the transistor Tr forms the word line WL. The shield interconnection 51l connected to the shield 51 through the shield connection portion 51s is connected to a prescribed terminal outside the region shown in the drawings.

In the nonvolatile memory device 241, by the operation of the transistor Tr, an arbitrary memory element (the stacked body SB0) can be selected and the write operation and the read operation can be performed.

Figure 18:
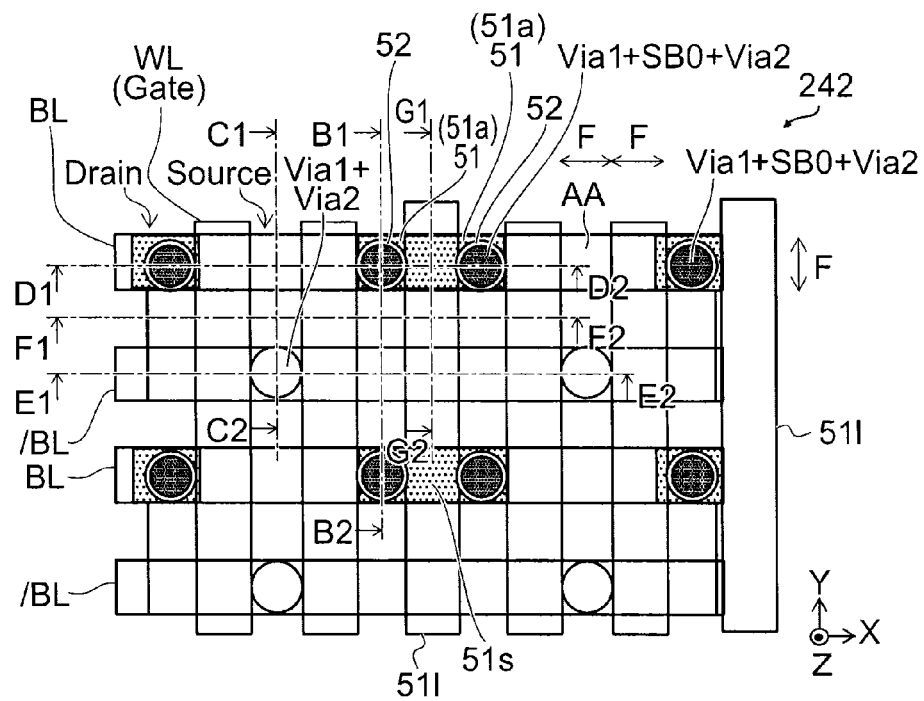
FIG. 18 is a schematic plan view showing one other nonvolatile memory device according to the eighth embodiment.

FIG. 18 is a schematic plan view illustrating the configuration of one other nonvolatile memory device according to the eighth embodiment.

FIG. 19A to FIG. 19C are schematic cross-sectional views illustrating the configuration of the one other nonvolatile memory device according to the eighth embodiment.

FIG. 19A to FIG. 19C are cross-sectional views taken along line C1-C2, line B1-B2, and line G1-G2, respectively, of FIG. 18.

FIG. 20A to FIG. 20C are schematic cross-sectional views illustrating the configuration of the one other nonvolatile memory device according to the eighth embodiment.

FIG. 20A to FIG. 20C are cross-sectional views taken along line F1-F2, line E1-E2, and line D1-D2, respectively, of FIG. 18.

In the drawings, element isolation insulating films and interlayer insulating films are not illustrated except for the protection layer 52.

As shown in FIG. 18, FIG. 19A to FIG. 19C, and FIG. 20A to FIG. 20C, in a nonvolatile memory device 242, the shield interconnection 51l extends in the Y-axis direction. The extending direction of the shield interconnection 51l is non-parallel to the extending direction of the bit line BL.

Otherwise, the configuration of the nonvolatile memory device 242 may be similar to that of the nonvolatile memory device 241, and a description is therefore omitted.

Also in the nonvolatile memory device 242, the footprint of the memory element is, for example, 12 $F^2$.

Figure 21:
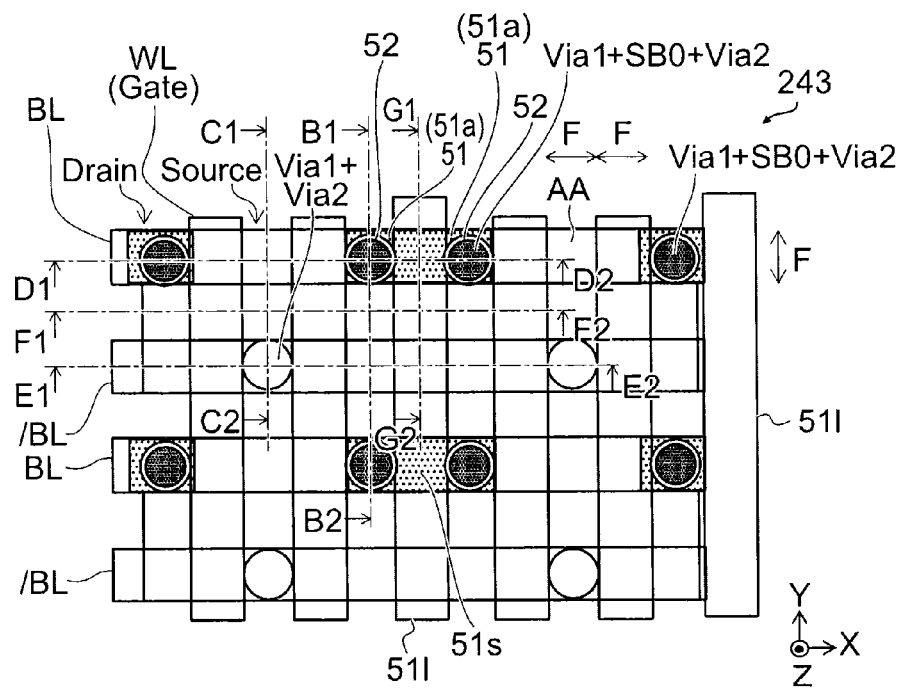
FIG. 21 is a schematic plan view showing one other nonvolatile memory device according to the eighth embodiment.

FIG. 21 is a schematic plan view illustrating the configuration of one other nonvolatile memory device according to the eighth embodiment.

Figures 22A, 22B, 22C:
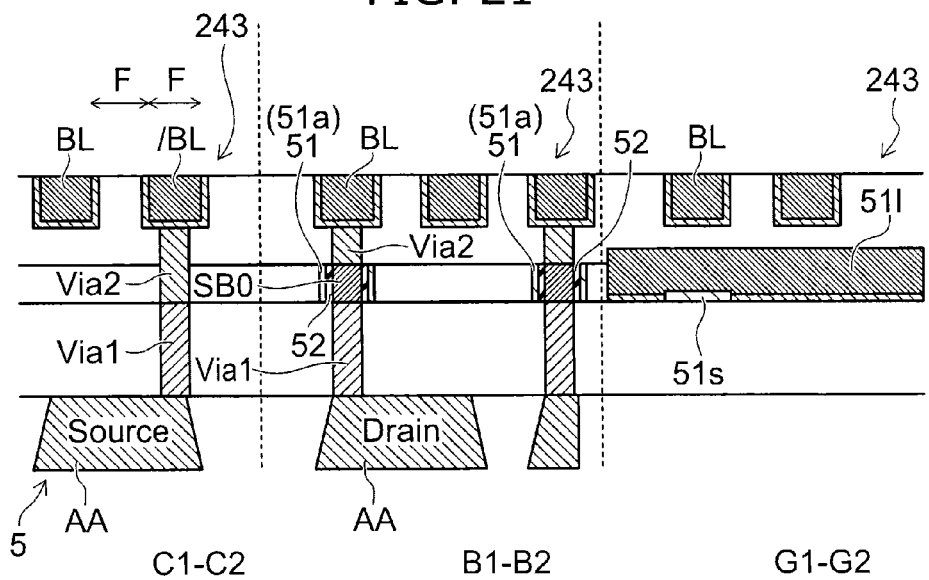
FIG. 22A to FIG. 22C are schematic cross-sectional views showing the one other nonvolatile memory device according to the eighth embodiment.

FIG. 22A to FIG. 22C are schematic cross-sectional views illustrating the configuration of the other nonvolatile memory device according to the eighth embodiment.

FIG. 22A to FIG. 22C are cross-sectional views taken along line C1-C2, line B1-B2, and line G1-G2, respectively, of FIG. 21

Figures 23A, 23B, 23C:
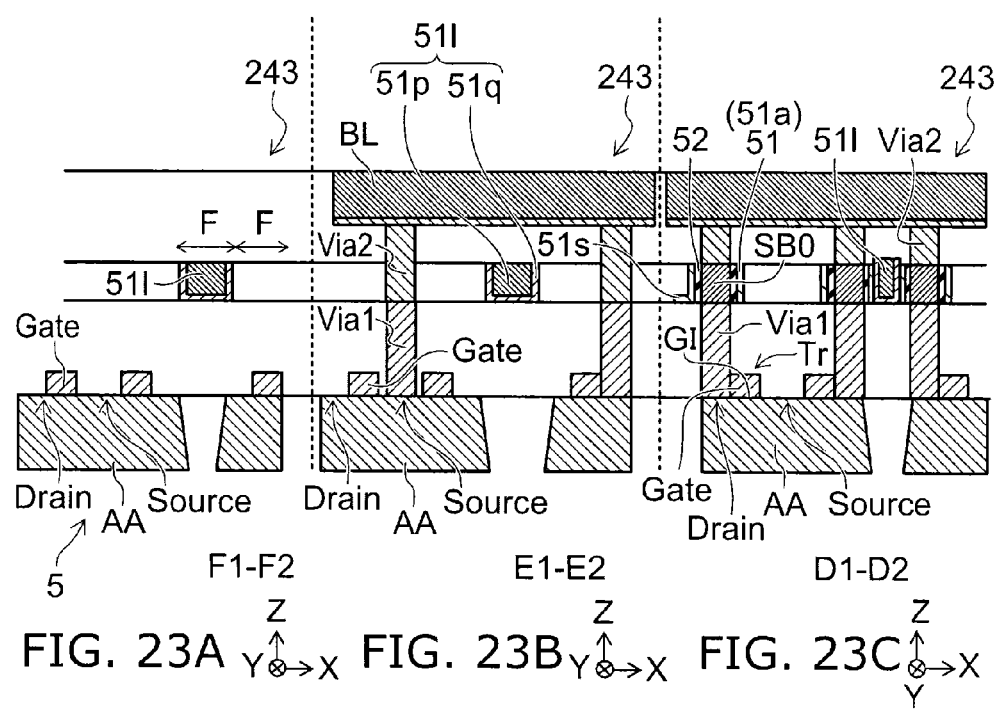
FIG. 23A to FIG. 23C are schematic cross-sectional views showing the one other nonvolatile memory device according to the eighth embodiment.

FIG. 23A to FIG. 23C are schematic cross-sectional views illustrating the configuration of the one other nonvolatile memory device according to the eighth embodiment.

FIG. 23A to FIG. 23C are cross-sectional views taken along line F1-F2, line E1-E2, and line D1-D2, respectively, of FIG. 21.

In the drawings, element isolation insulating films and interlayer insulating films are not shown except for the protection layer 52.

As shown in FIG. 21, FIG. 22A to FIG. 22C, and FIG. 23A to FIG. 23C, also in a nonvolatile memory device 243, the shield interconnection 51l extends in the Y-axis direction. As shown in FIG. 22C, FIG. 23A, and FIG. 23C, the shield interconnection 51l is provided in a layer in which the stacked body SB0 is provided above the substrate 5.

Also in the nonvolatile memory device 243, the footprint of the memory element is, for example, 12 $F^2$.

A method for manufacturing the nonvolatile memory device 243 will now be described.

FIG. 24A and FIG. 24B, FIG. 25A and FIG. 25B, FIG. 26A and FIG. 26B, FIG. 27A and FIG. 27B, FIG. 28A and FIG. 28B, FIG. 29A and FIG. 29B, FIG. 30A and FIG. 30B, FIG. 31A and FIG. 31B, and FIG. 32A and FIG. 32B are schematic views in order of the processes, illustrating a method for manufacturing a nonvolatile memory device according to the eighth embodiment.

FIG. 24A, FIG. 25A, FIG. 26A, FIG. 27A, FIG. 28A, FIG. 29A, FIG. 30A, FIG. 31A, and FIG. 32A are schematic plan views. FIG. 24B, FIG. 25B, FIG. 26B, FIG. 27B, FIG. 28B, FIG. 29B, FIG. 30B, FIG. 31B, and FIG. 32B are cross-sectional views taken along line D1-D2 in FIG. 24A, FIG. 25A, FIG. 26A, FIG. 27A, FIG. 28A, FIG. 29A, FIG. 30A, FIG. 31A, and FIG. 32A, respectively.

Figure 24A:
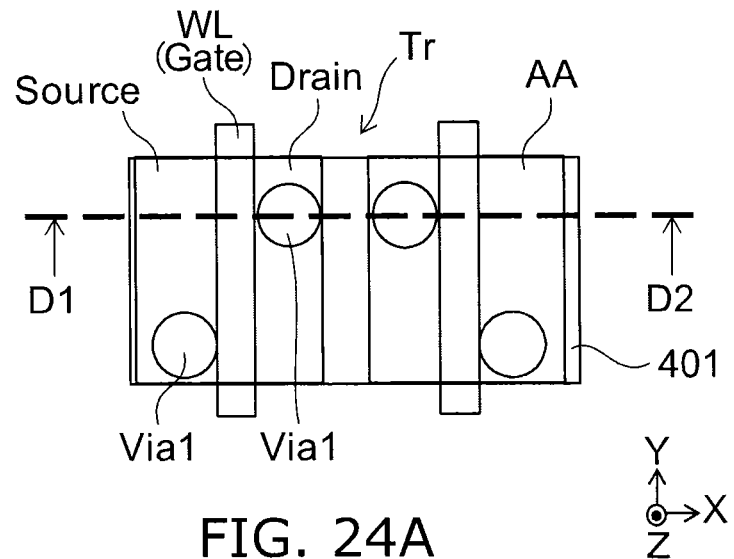
FIG. 24A and FIG. 24B, FIG. 25A and FIG. 25B, FIG. 26A and FIG. 26B, FIG. 27A and FIG. 27B, FIG. 28A and FIG. 28B, FIG. 29A and FIG. 29B, FIG. 30A and FIG. 30B, FIG. 31A and FIG. 31B, and FIG. 32A and FIG. 32B are schematic views in order of the processes, showing a method for manufacturing a nonvolatile memory device according to the eighth embodiment.
Figure 24B:
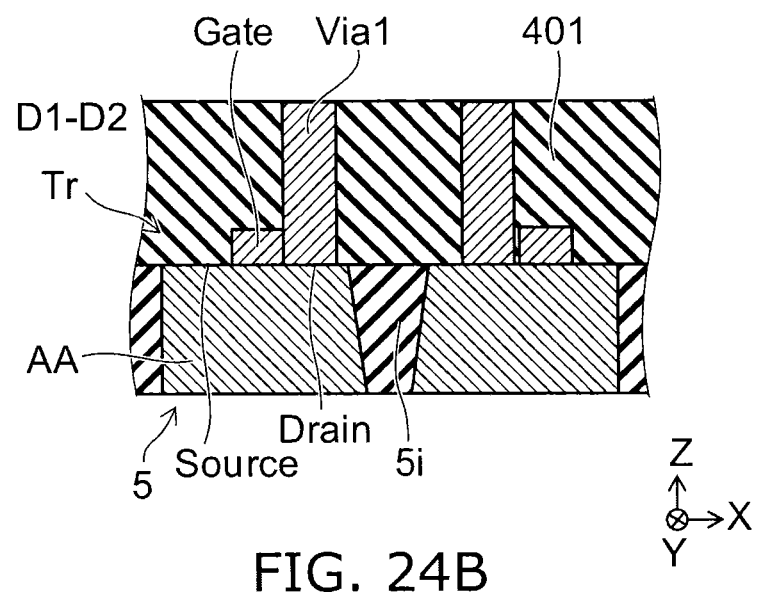

As shown in FIG. 24A and FIG. 24B, the active area AA is provided on the substrate 5. The active area AA is partitioned by an element isolation insulating layer 5i. A source, a drain, and a gate are formed in the active area to form the transistor Tr, and an interlayer insulating layer 401 is formed thereon. A through hole reaching the source and a through hole reaching the drain are formed in the interlayer insulating layer 401. A conductive material is buried in the through hole to form the first via Via1.

Figure 25A:
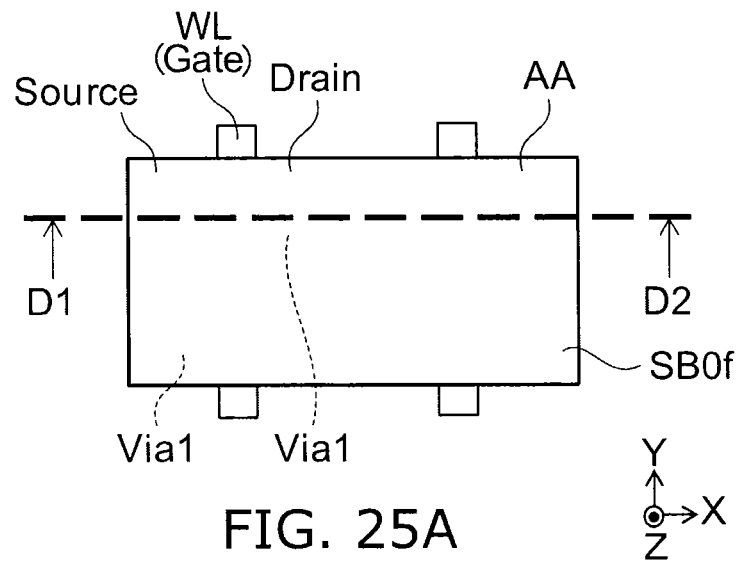
Figure 25B:
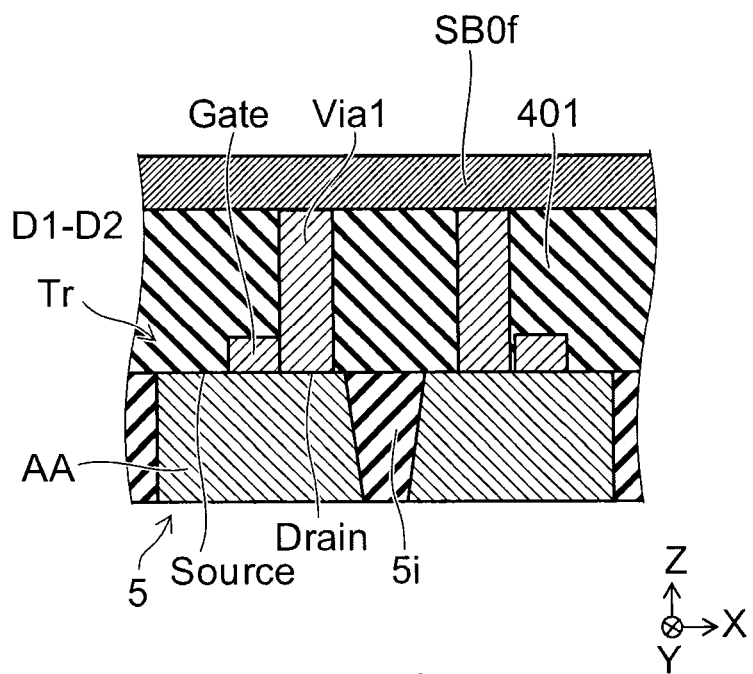

As shown in FIG. 25A and FIG. 25B, a stacked film SB0f that forms the stacked body SB0 is formed on the interlayer insulating layer 401 and the first via Via1.

Figure 26A:
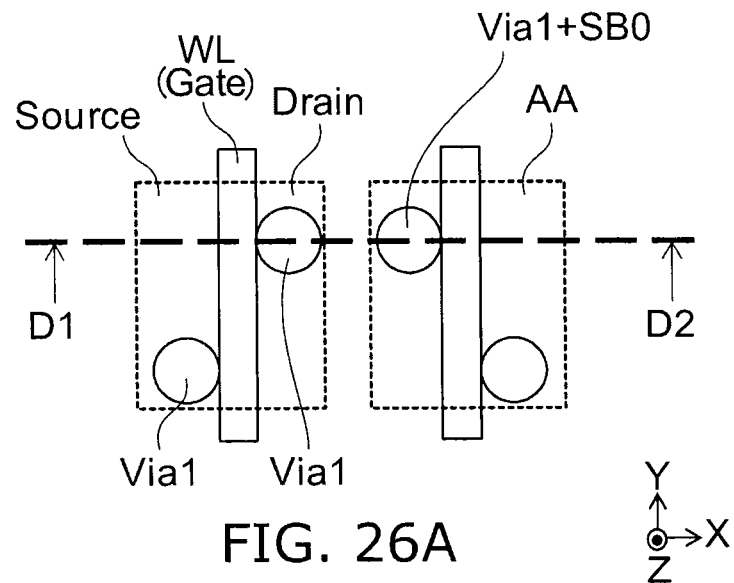
Figure 26B:
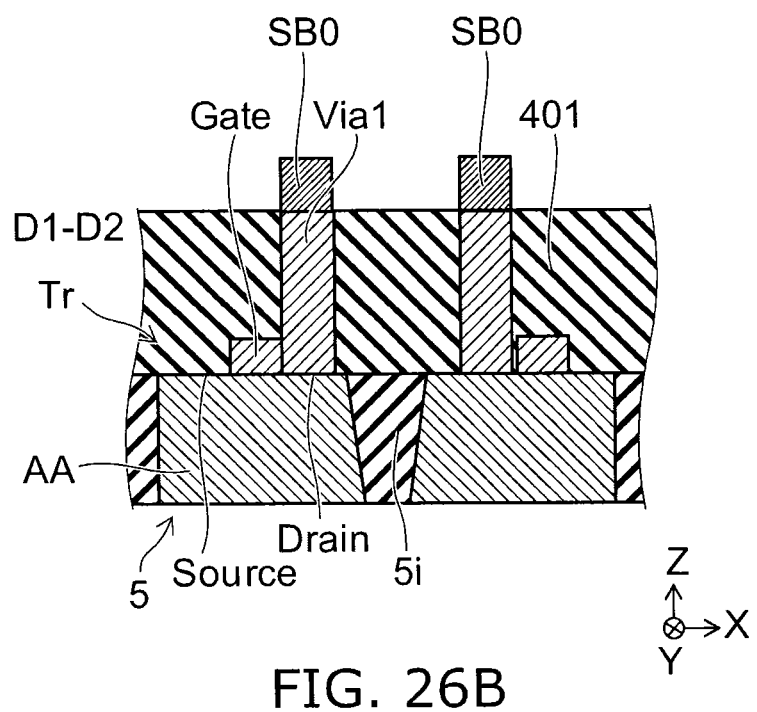

As shown in FIG. 26A and FIG. 26B, part of the stacked film SB0f is removed to form the stacked body SB0. The height (the length along the Z-axis) of the stacked body SB0 is, for example, not less than 5 nm and not more than 50 nm, for example approximately 30 nm.

Figure 27A:
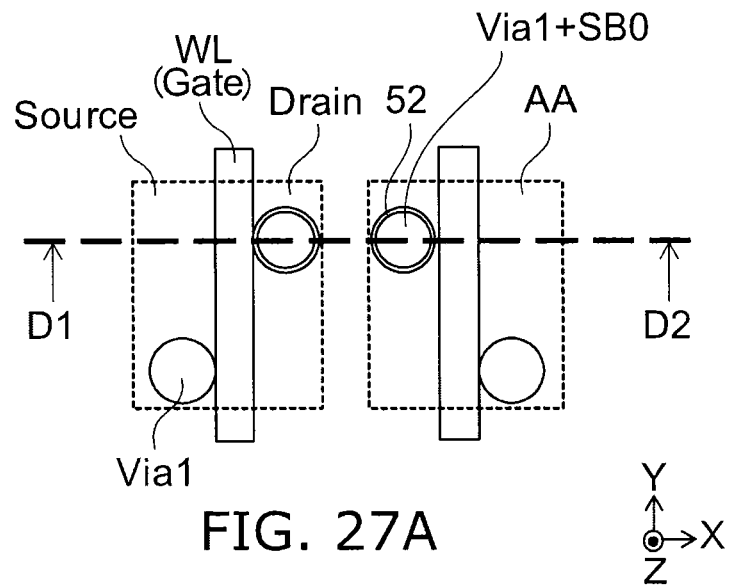
Figure 27B:
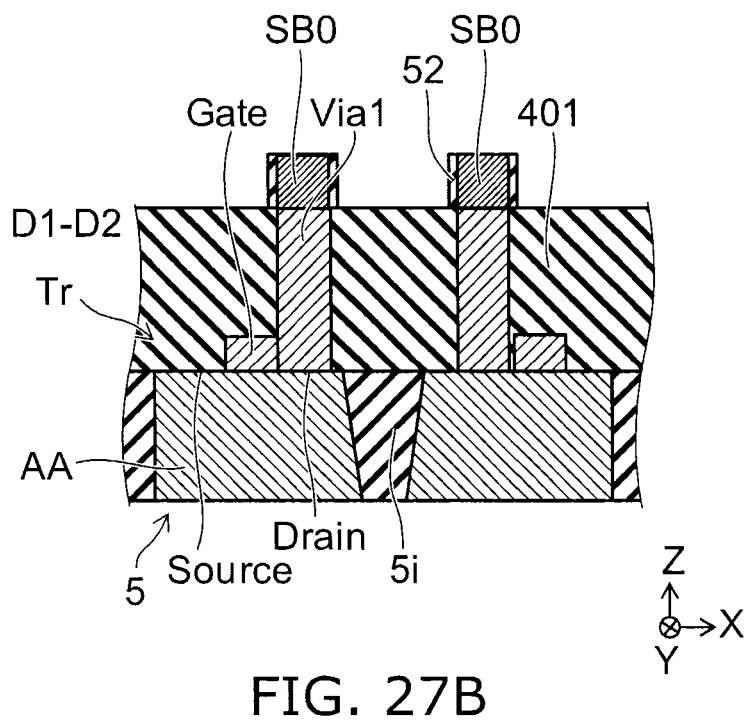

As shown in FIG. 27A and FIG. 27B, after an insulating film that forms the protection layer 52 is deposited, unnecessary portions are removed to form the protection layer 52. Although the insulating film in the region between adjacent stacked bodies SB0 is removed in this example, the insulating film in this region may remain. That is, the protection layer 52 may extend in the region between adjacent stacked bodies SB0. The thickness of the protection layer 52 is, for example, not less than 5 nm and not more than 15 nm, for example 10 nm.

Figure 28A:
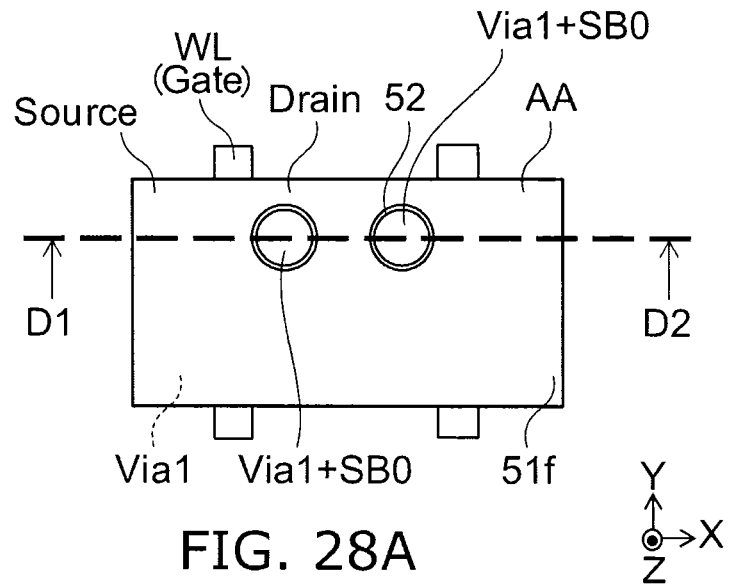
Figure 28B:
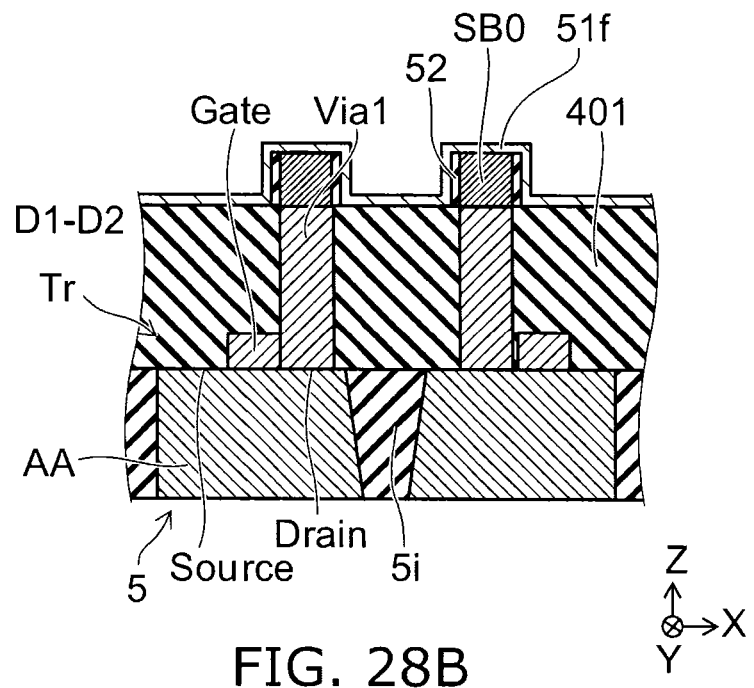

As shown in FIG. 28A and FIG. 28B, a shield film 51f that forms the shield 51 (or the shield 51a) is formed. The thickness of the shield film 51f is, for example, not less than 5 nm and not more than 10 nm, for example approximately 8 nm.

Figure 29A:
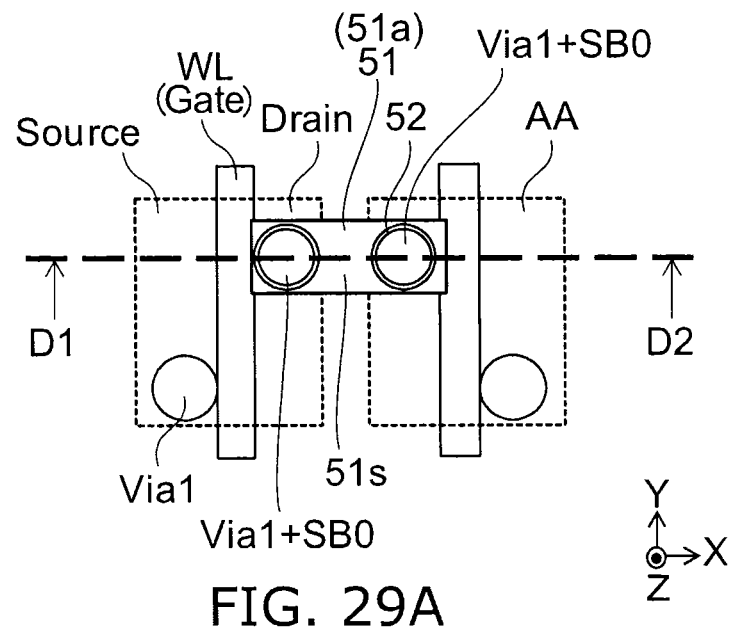
Figure 29B:
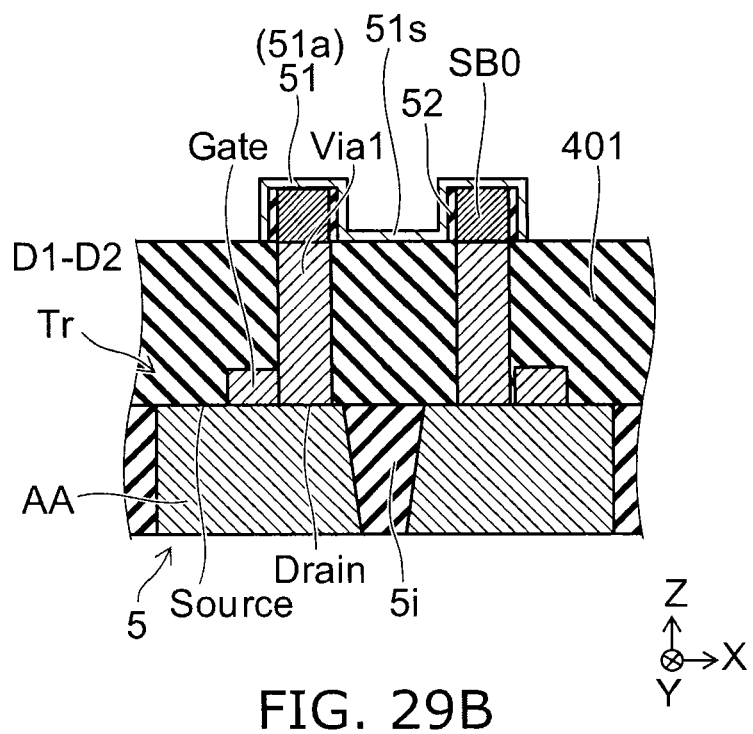

As shown in FIG. 29A and FIG. 29B, part of the shield film 51f is removed to form the shield 51 (or the shield 51a). The processing is performed by lithography and etching. In this example, in the region between adjacent stacked bodies SB0, the shield film 51f is left to form the shield connection portion 51s.

Figure 30A:
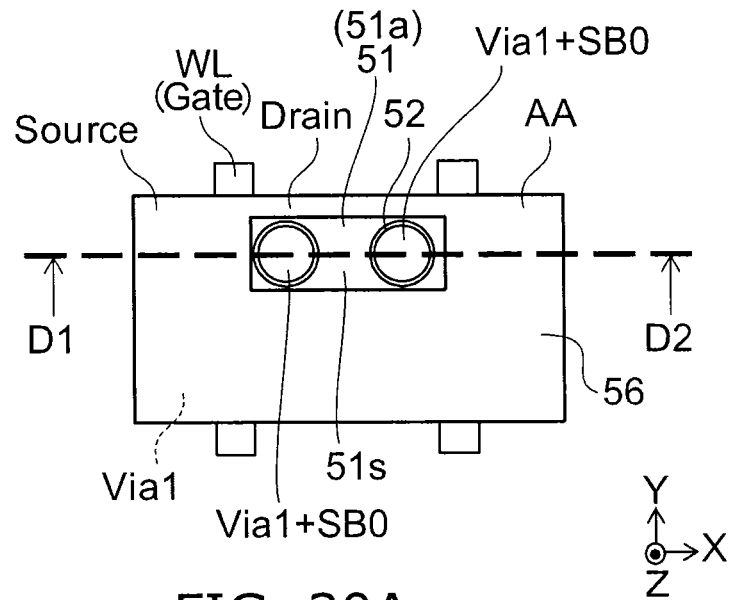
Figure 30B:
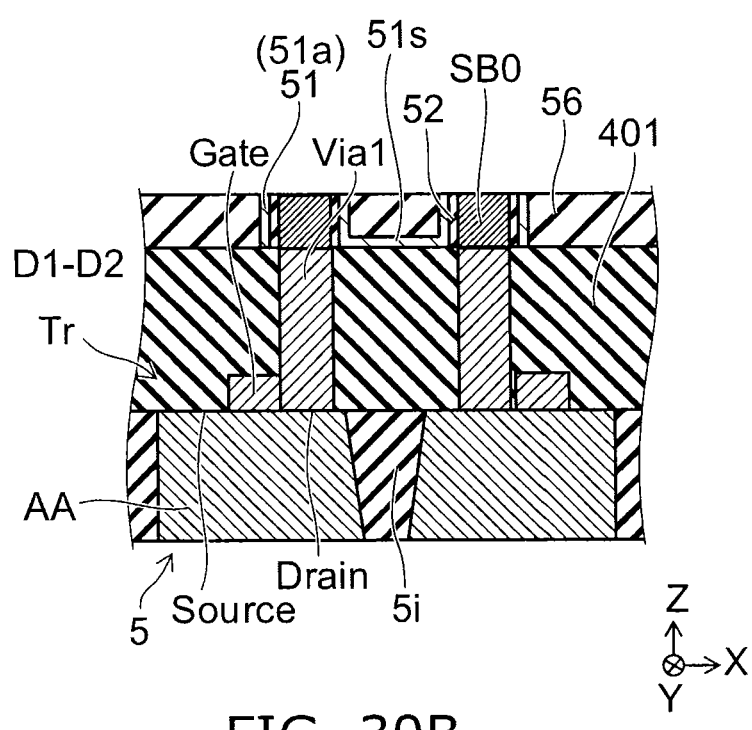

As shown in FIG. 30A and FIG. 30B, the interlayer insulating layer 56 is formed, and is planarized to expose the upper surface of the stacked body SB0 (or a conductive layer etc. connected to the stacked body SB0).

Figure 31A:
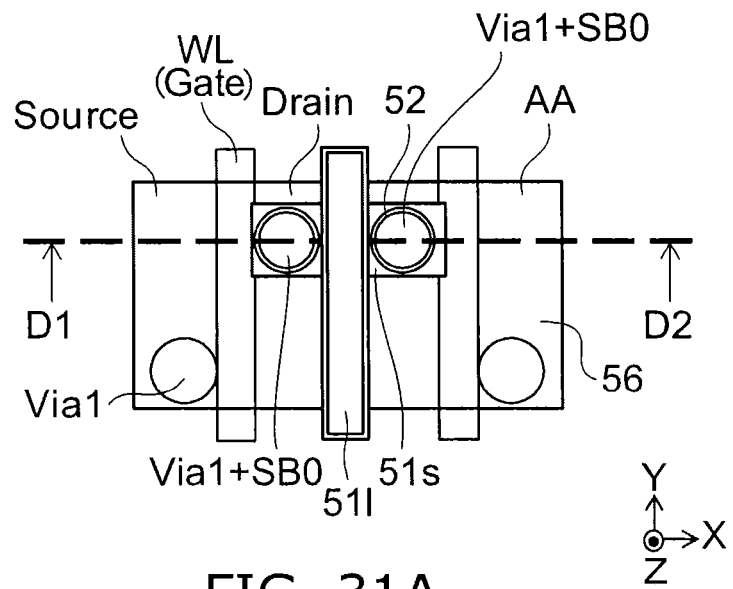
Figure 31B:
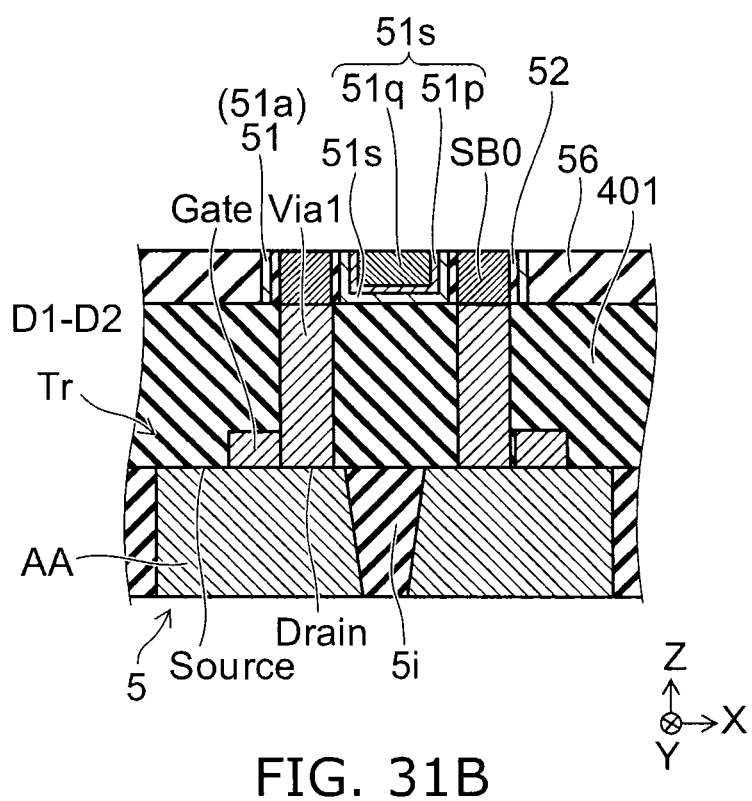

As shown in FIG. 31A and FIG. 31B, at least part of the interlayer insulating layer 56 in the region between adjacent stacked bodies SB0 is removed, and a conductive material is buried in the removed space to form the shield interconnection 51l (the barrier metal layer 51q, the conductive unit 51p, etc.).

Figure 32A:
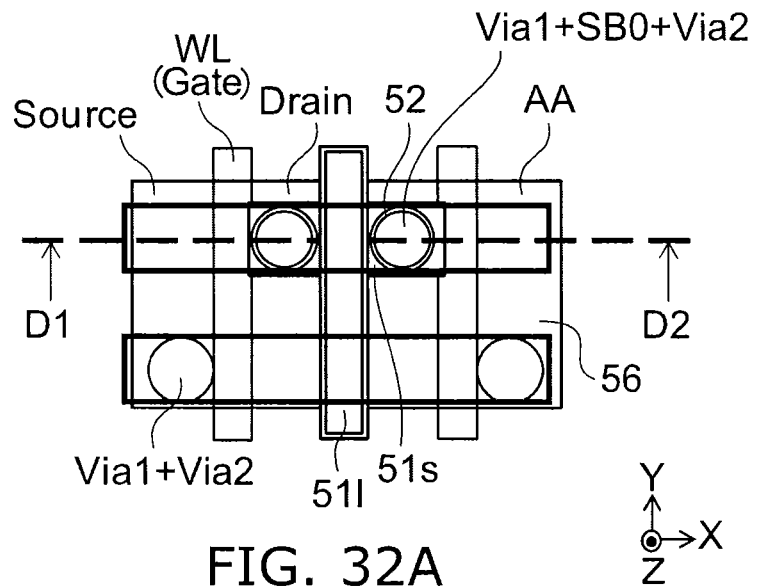
Figure 32B:
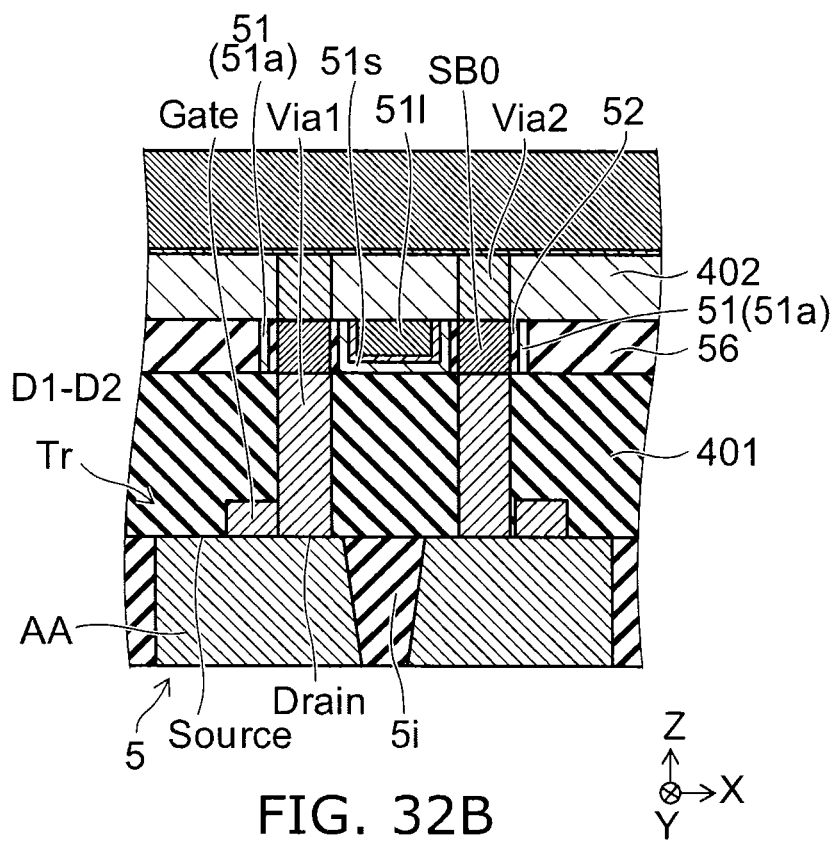

As shown in FIG. 32A and FIG. 32B, an interlayer insulating layer 402 is formed. A through hole is formed in a portion on the stacked body SB0 and a portion above the source of the interlayer insulating layer 402, and a conductive material is buried in the through hole to form the second via Via1. Further, an interlayer insulating layer (not shown) is formed thereon, and band-shaped trenches are formed in the interlayer insulating layer. The trench is connected to the second via Via2. A conductive material is buried in the trench. Thereby, the bit line BL and the bit line bar/BL are formed.

Through the above processes, the nonvolatile memory device 243 is formed.

FIG. 33 is a schematic plan view illustrating the configuration of one other nonvolatile memory device according to the eighth embodiment.

FIG. 34A to FIG. 34C are schematic cross-sectional views illustrating the configuration of the one other nonvolatile memory device according to the eighth embodiment.

FIG. 34A to FIG. 34C are cross-sectional views taken along line C1-C2, line B1-B2, and line D1-D2, respectively, of FIG. 33.

FIG. 35A and FIG. 35B are schematic cross-sectional views illustrating the configuration of the one other nonvolatile memory device according to the eighth embodiment.

FIG. 35A and FIG. 35B are cross-sectional views taken along line F1-F2 and line E1-E2, respectively, of FIG. 33.

In the drawings, element isolation insulating films and interlayer insulating films are not shown except for the protection layer 52.

As shown in FIG. 33, a nonvolatile memory device 244 according to the embodiment includes a plurality of bit lines BL. The bit line BL extends in the X-axis direction.

A plurality of shield interconnections 51l are provided. In this example, the shield interconnection 51l extends in the X-axis direction. The extending direction of the shield interconnection 51l is parallel to the extending direction of the bit line BL. When projected onto the X-Y plane, the shield interconnection 51l is disposed between bit lines BL.

For example, the width of the bit line BL is the minimum line width F. The distance between bit lines BL is, for example, the minimum line width F. The width of the shield interconnection 51l is, for example, the minimum line width F.

The word line WL extends in the Y-axis direction. The width of the word line WL is the minimum line width F. The distance between word lines WL is the minimum line width F.

In the nonvolatile memory device 244, the footprint of the memory element is, for example, 8 $F^2$.

An in-cell interconnection ICL connecting the first via Via1 and the second via Via2 adjacent in the Y-axis direction is provided. The active area AA extends in the X-axis direction.

As shown in FIG. 34A to FIG. 34C and FIG. 35A and FIG. 35B, the active area AA including a source and a drain is provided on the substrate 5. A not-shown gate insulating film is provided, and a gate is provided on the gate insulating film. Thereby, the transistor Tr is formed.

The first via Via1 is provided on the drain, the stacked body SB0 is disposed on the first via Via1, and the second via Via2 is provided on the stacked body SB0. A bit line BL is provided on the second via Via2.

On the first via Via1 provided on the source, the stacked body SB0 is not interposed but an intermediate via ViaM is provided. One end of the in-cell interconnection ICL is disposed on the intermediate via ViaM. The second via Via2 is provided on the other end of the in-cell interconnection. Another bit line BL is provided on this second via Via2.

The shield 51 (or the shield 51a) is provided opposite to the side surface of the stacked body SB0. The protection layer 52 is provided between the stacked body SB0 and the shield 51. The conductive film forming the shield 51 extends in the Y-axis direction to form the shield connection portion 51s.

In this example, the shield interconnection 51l is provided in a layer in which the first via Via1 is provided on the substrate 5.

Thus, in the nonvolatile memory device 244, one end of the stacked body SB0 is connected to the drain of the transistor Tr through a first via Via1. The other end of the stacked body SB0 is connected to one bit line BL through a second via Via2. The source of the transistor Tr is connected to another bit line BL through another first via Via1, the in-cell interconnection ICL, and another second via Via2. The gate of the transistor Tr forms the word line WL. The shield interconnection 51*l* connected to the shield 51 via the shield connection portion 51*s* is connected to a prescribed terminal outside the region shown in the drawings.

Also in the nonvolatile memory device 244, by the operation of the transistor Tr, an arbitrary memory element (the stacked body SB0) can be selected and the write operation and the read operation can be performed.

A method for manufacturing the nonvolatile memory device 244 will now be described.

FIG. 36A to FIG. 36C, FIG. 37A to FIG. 37C, FIG. 38A to FIG. 38C, FIG. 39A to FIG. 39G, FIG. 40A to FIG. 40C, FIG. 41A to FIG. 41C, FIG. 42A to FIG. 42C, FIG. 43A to FIG. 43C, FIG. 44A to FIG. 44C, FIG. 45A to FIG. 45C, FIG. 46A to FIG. 46C, FIG. 47A to FIG. 47C, and FIG. 48A to FIG. 48C are schematic views in order of the processes, illustrating a method for manufacturing a nonvolatile memory device according to the eighth embodiment.

FIG. 36A, FIG. 37A, FIG. 38A, FIG. 39A, FIG. 40A, FIG. 41A, FIG. 42A, FIG. 43A, FIG. 44A, FIG. 45A, FIG. 46A, FIG. 47A, and FIG. 48A are schematic plan views.

FIG. 36B, FIG. 37B, FIG. 38B, FIG. 40B, FIG. 41B, FIG. 42B, FIG. 43B, FIG. 44B, FIG. 45B, FIG. 46B, FIG. 47B, and FIG. 48B are cross-sectional views taken along line B1-B2 of FIG. 36A, FIG. 37A, FIG. 38A, FIG. 40A, FIG. 41A, FIG. 42A, FIG. 43A, FIG. 44A, FIG. 45A, FIG. 46A, FIG. 47A, and FIG. 48A, respectively.

FIG. 36C, FIG. 37C, FIG. 38C, FIG. 40C, FIG. 41C, FIG. 42C, FIG. 43C, FIG. 44C, FIG. 45C, FIG. 46C, FIG. 47C, and FIG. 48C are transparent views in which cross sections taken along line D1-D2 and cross sections taken along line F1-F2 of FIG. 36A, FIG. 37A, FIG. 38A, FIG. 40A, FIG. 41A, FIG. 42A, FIG. 43A, FIG. 44A, FIG. 45A, FIG. 46A, FIG. 47A, and FIG. 48A, respectively, are superposed.

FIG. 39B, FIG. 39D, and FIG. 39F are schematic enlarged plan views of a part PA of FIG. 39A in order of the processes. FIG. 39C, FIG. 39E, and FIG. 39G are schematic enlarged cross-sectional views of the part PA of FIG. 39A in order of the processes, corresponding to line D1-D2.

Figure 36A:
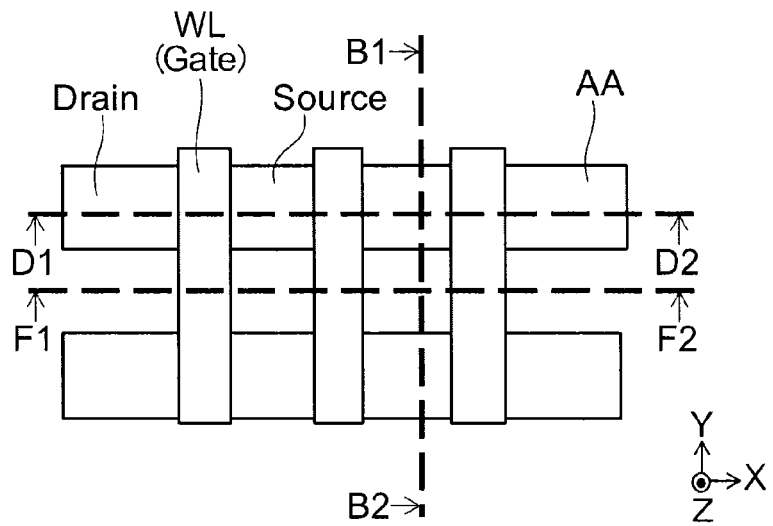
Figure 36B:
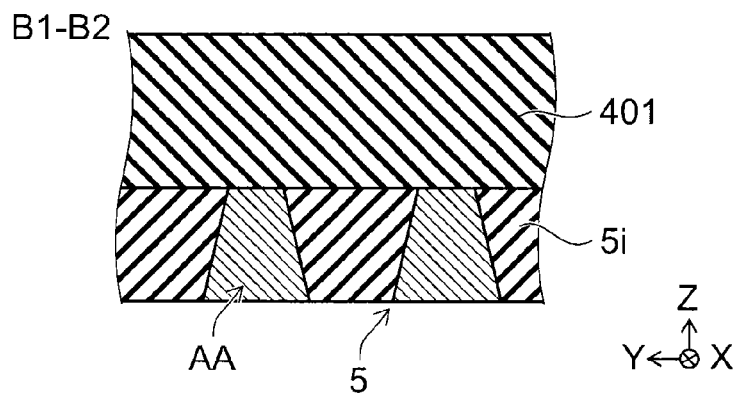
Figure 36C:
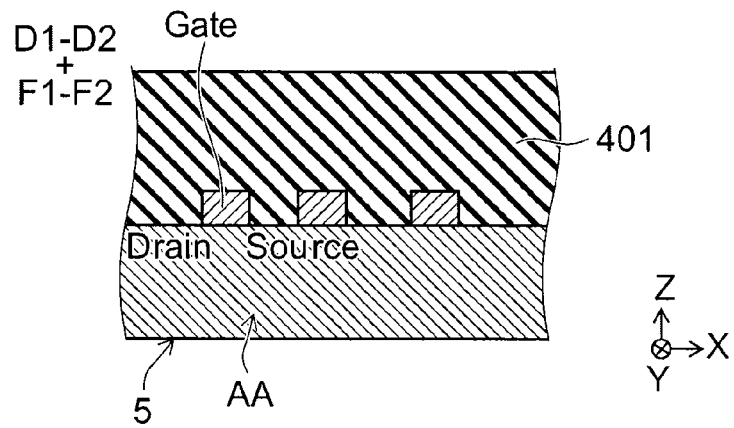

As shown in FIG. 36A to FIG. 36C, the active area AA is provided on the substrate 5; a source, a drain, and a gate are formed to form the transistor Tr; and the interlayer insulating layer 401 is formed thereon.

Figure 37A:
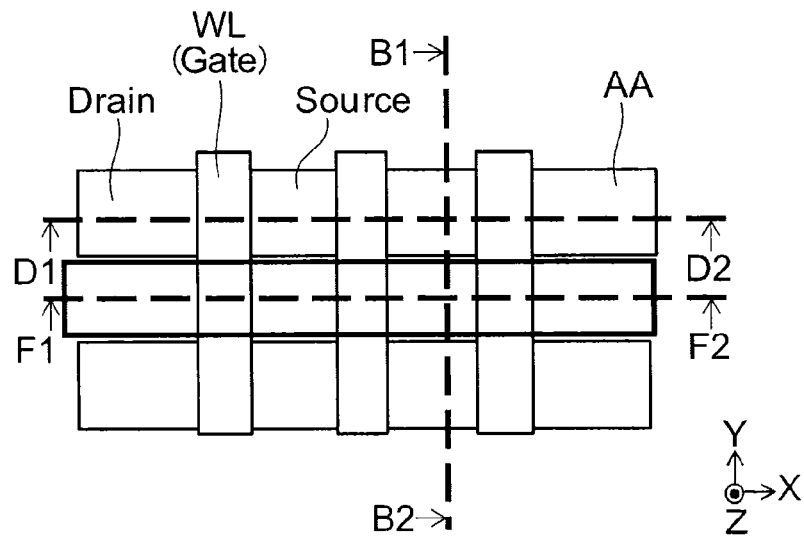
Figure 37B:
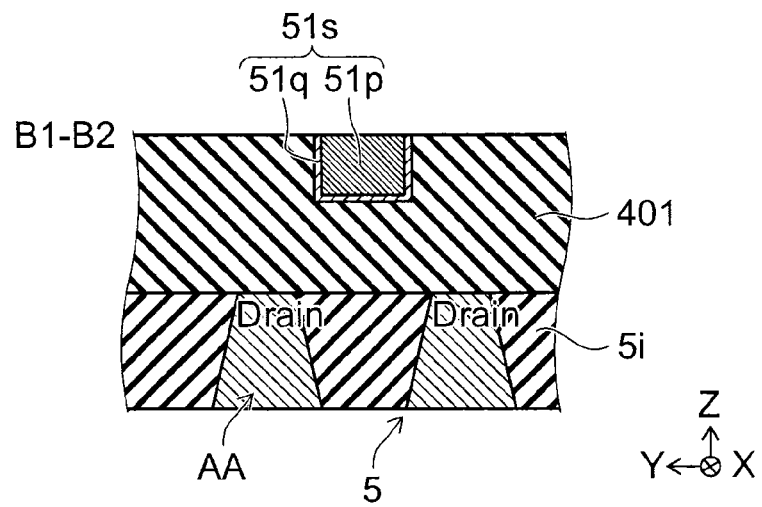
Figure 37C:
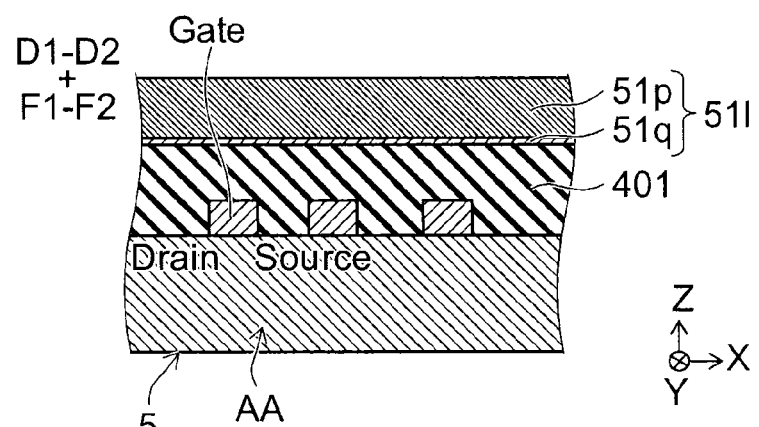

As shown in FIG. 37A to FIG. 37C, a trench extending in the X-axis direction is formed at the upper surface of the interlayer insulating layer 401, the barrier metal layer 51*q* is formed on the inner wall of the trench, and a conductive material is buried in the remaining space to form the conductive unit 51*p*. The upper surface is planarized to form the shield interconnection 51*l*.

Figure 38A:
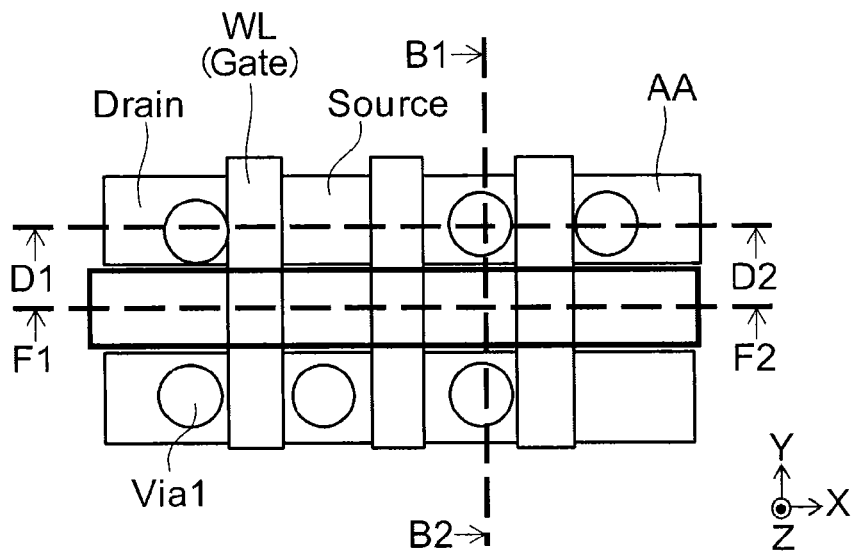
Figure 38B:
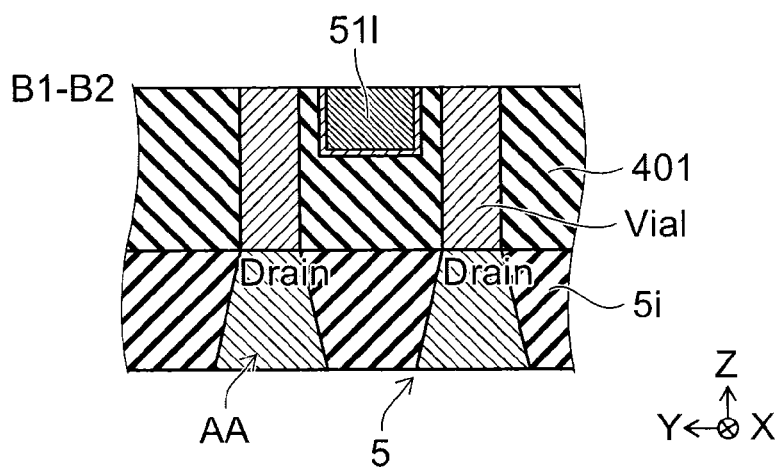
Figure 38C:
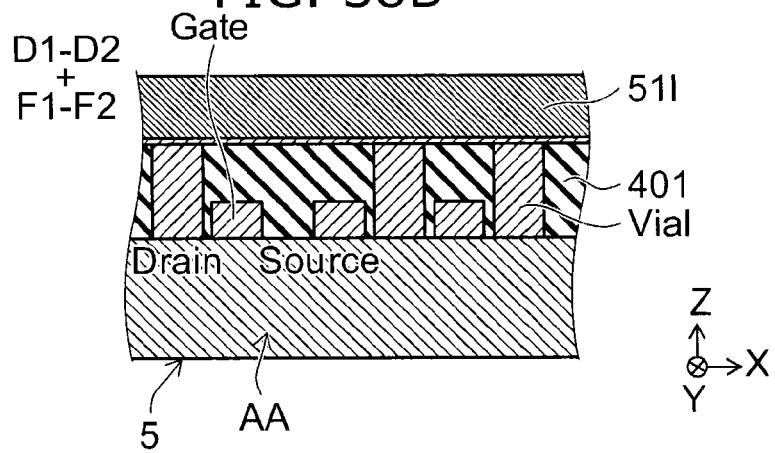

As shown in FIG. 38A to FIG. 38C, a through hole reaching the source and a through hole reaching the drain are formed in the interlayer insulating layer 401. A conductive material is buried in the through hole to form the first via Via1. At this time, for example, the following processing is performed.

As shown in FIG. 39B and FIG. 39C, a through hole Vh1 reaching the drain is formed in the interlayer insulating layer 401. Part of the through hole Vh1 overlaps with the shield interconnection 51*l*.

As shown in FIG. 39D and FIG. 39E, an insulating layer Vi is formed on the inner side wall of the through hole Vh1. For example, the insulating layer Vi can be formed by forming an insulating film on the inner side wall of the through hole Vh1 and selectively removing the insulating film on the drain. SiN, for example, is used as the insulating layer Vi.

As shown in FIG. 39F and FIG. 39G, by burying a conductive material Vc in the remaining space of the through hole Vh1, the first via Via1 can be formed. Cu, for example, is used as the first via Via1. By providing the insulating layer Vi, electrical insulation between the first via Via1 and the shield interconnection 51*l* is obtained even if the first via Via1 and the shield interconnection 51*l* are close or in contact along the Y-axis direction.

Figure 40A:
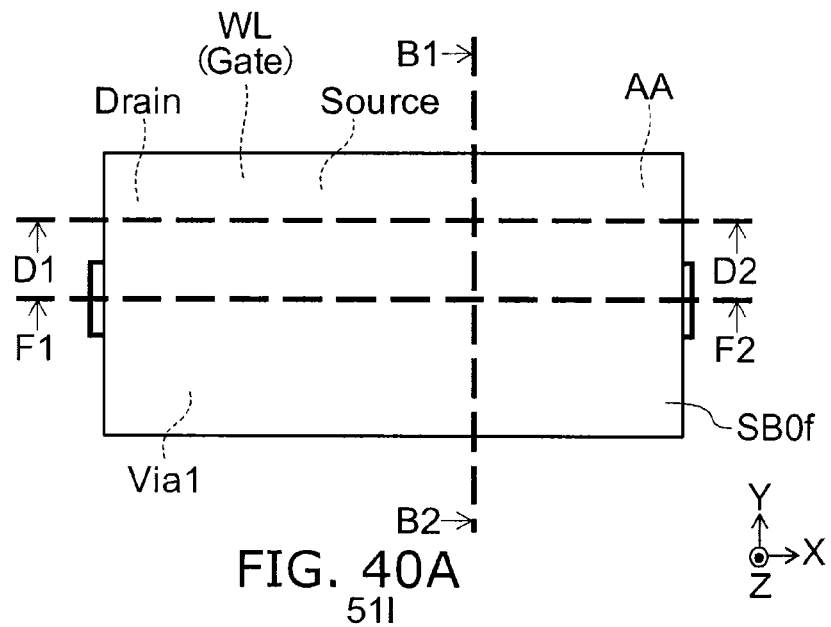
Figure 40B:
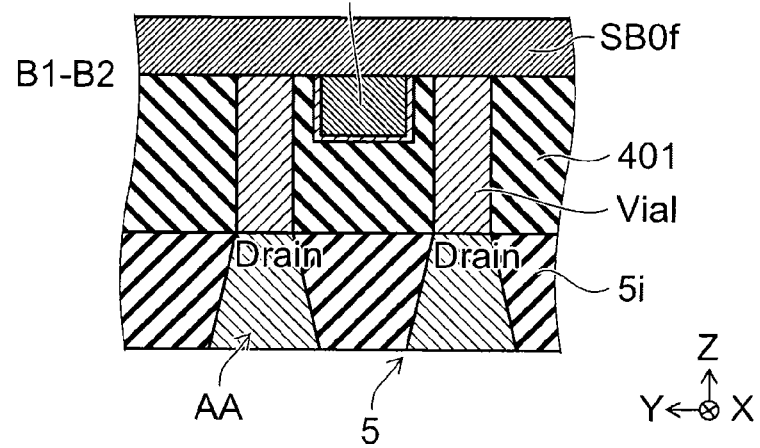
Figure 40C:
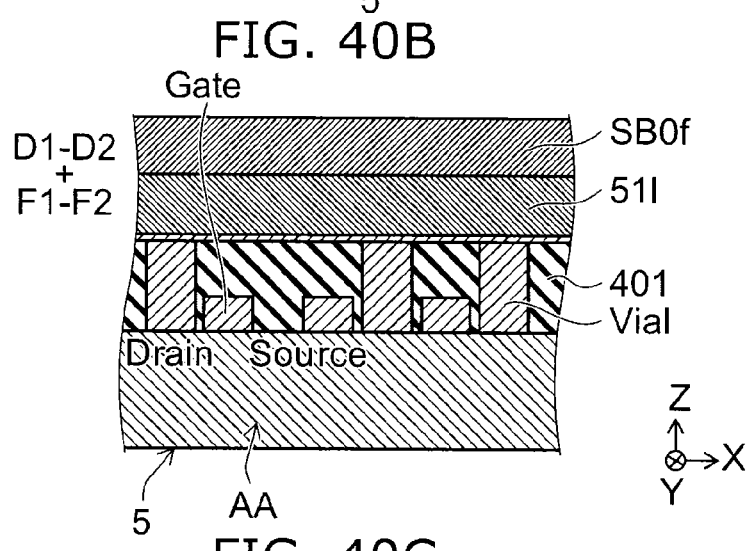

As shown in FIG. 40A to FIG. 40C, the stacked film SB0*f* that forms the stacked body SB0 is formed on the shield interconnection 51*l*, the interlayer insulating layer 401, and the first via Via1.

Figure 41A:
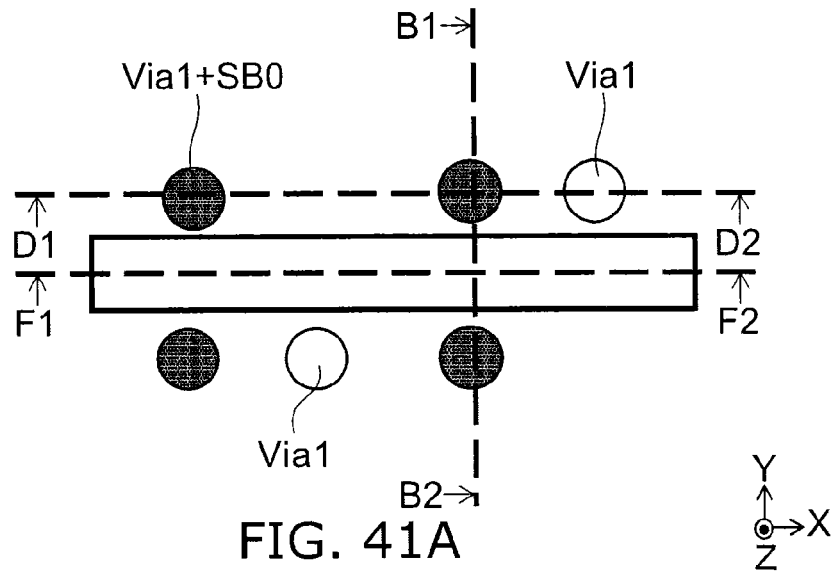
Figure 41B:
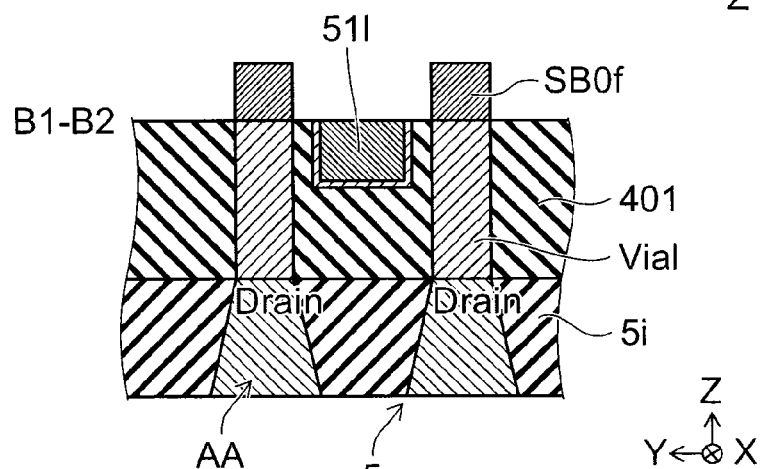
Figure 41C:
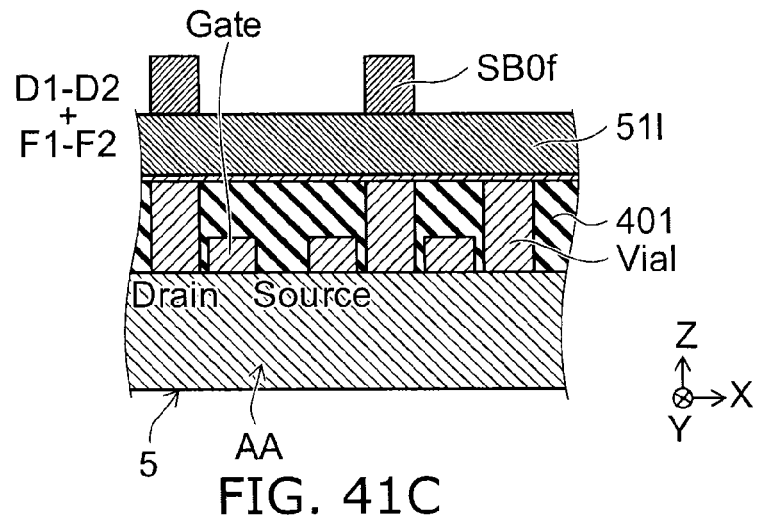

As shown in FIG. 41A to FIG. 41C, part of the stacked film SB0*f* is removed to form the stacked body SB0.

Figure 42A:
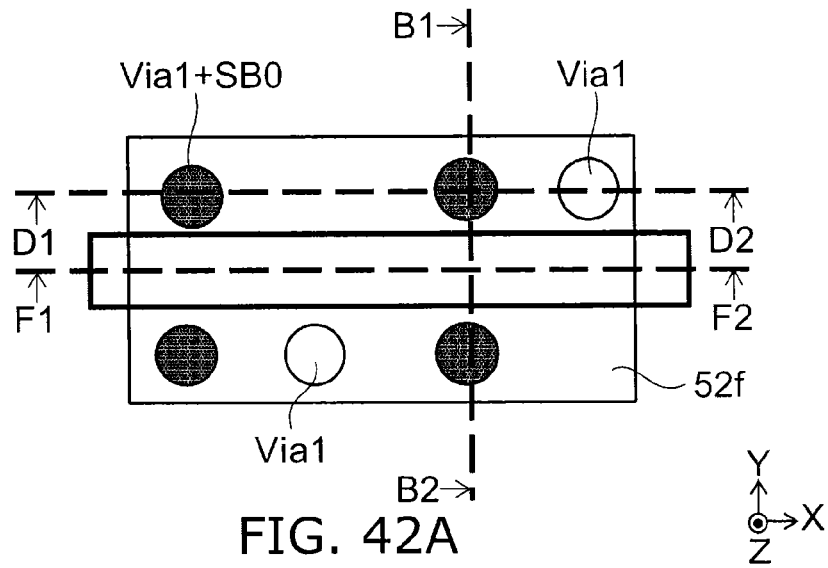
Figure 42B:
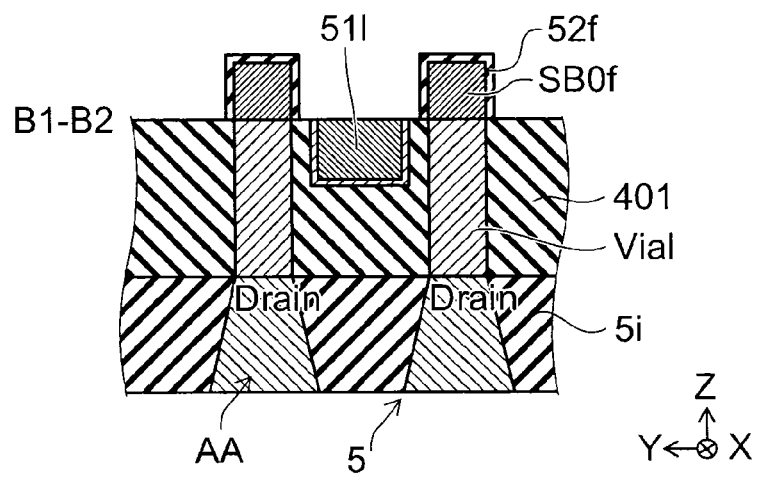
Figure 42C:
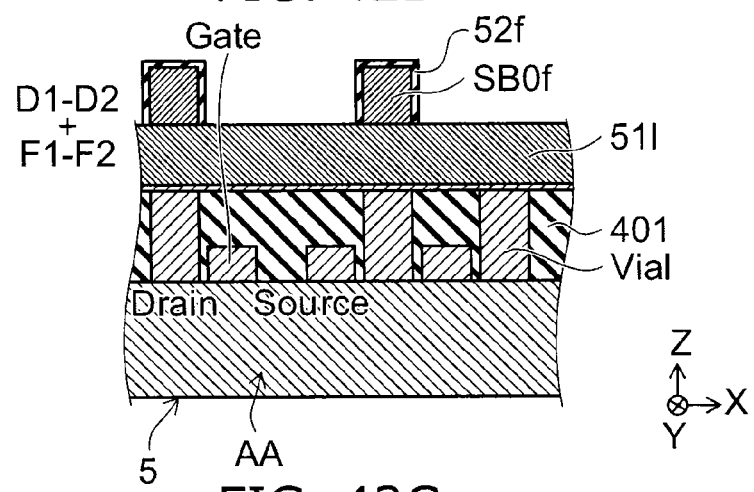

As shown in FIG. 42A to FIG. 42C, a protection film 52*f* that forms the protection layer 52 is deposited, and part of it is removed. In this example, the protection film 52*f* remains on the side surface and the upper surface of the stacked body SB0.

Figure 43A:
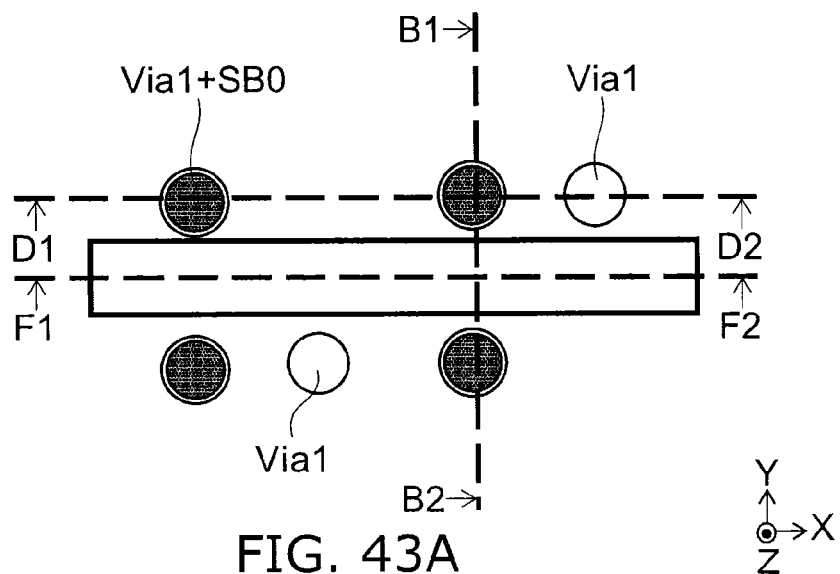
Figure 43B:
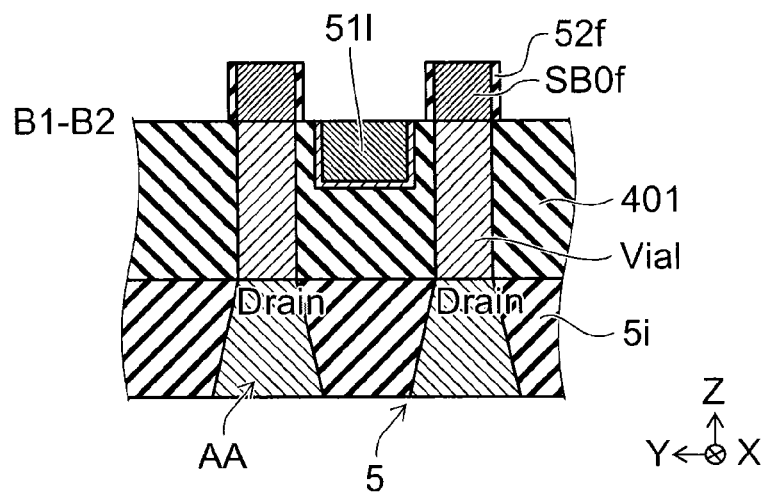
Figure 43C:
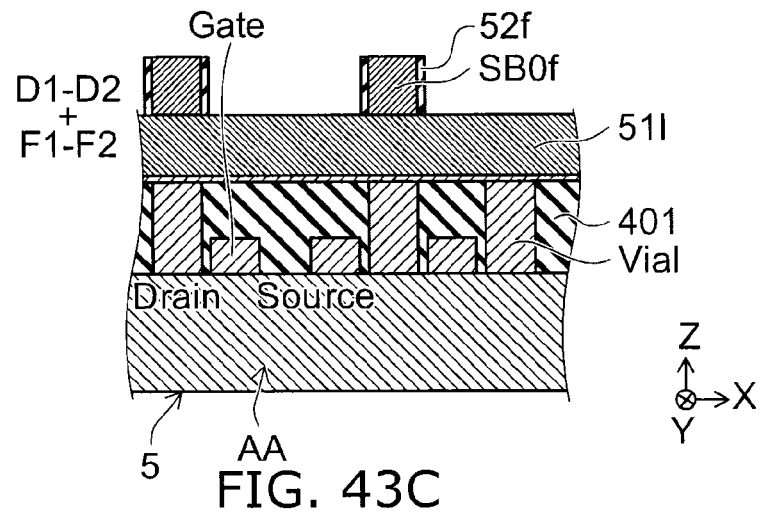

As shown in FIG. 43A to FIG. 43C, the protection film 52*f* on the upper surface of the stacked body SB0 is removed while the protection film 52*f* on the side surface of the stacked body SB0 is left. Thereby, the protection layer 52 is formed.

Figure 44A:
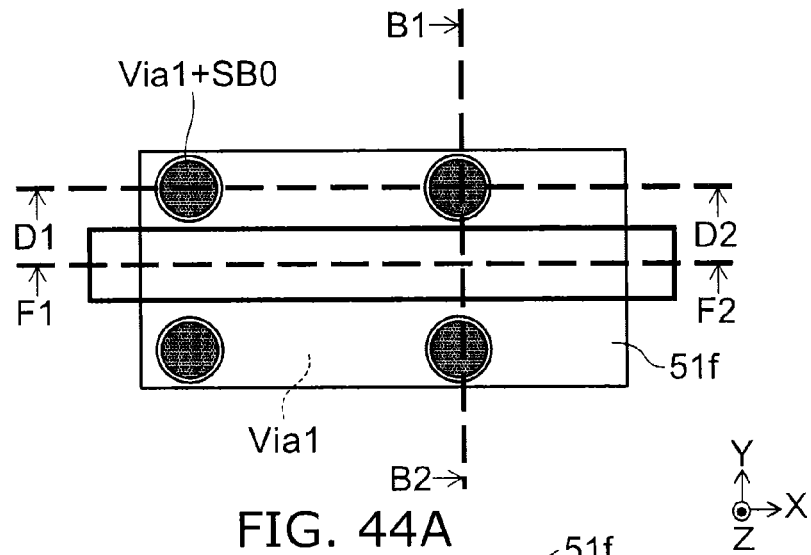
Figure 44B:
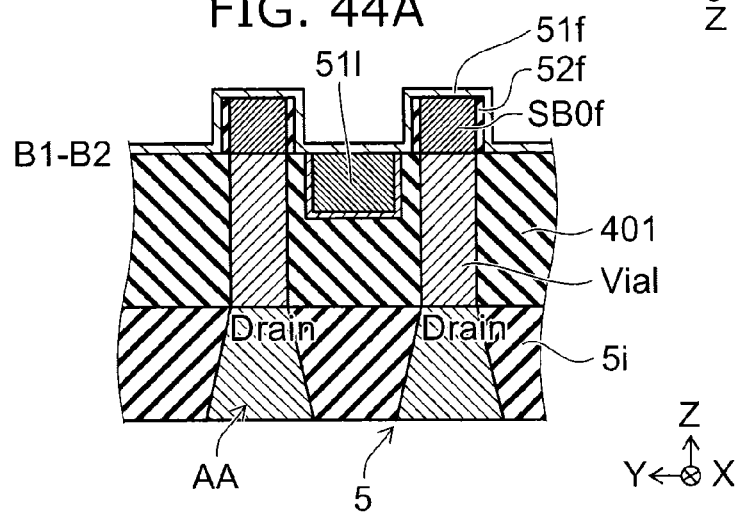
Figure 44C:
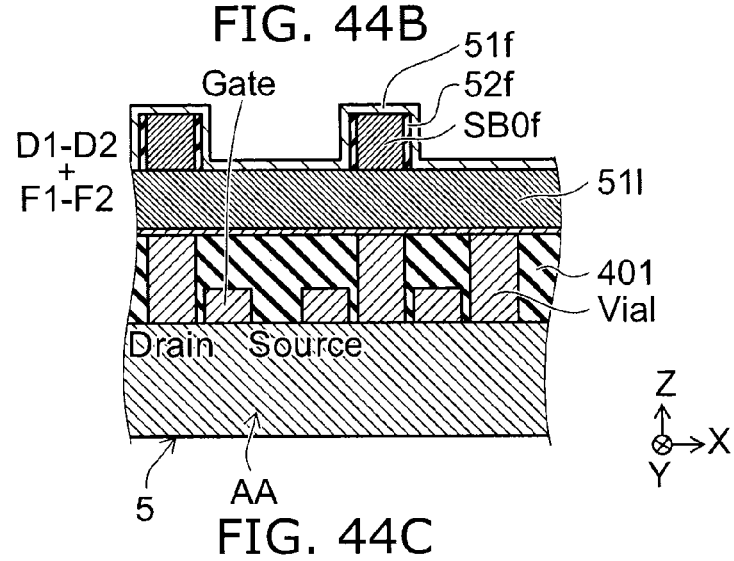

As shown in FIG. 44A to FIG. 44C, the shield film 51*f* that forms the shield 51 (or the shield 51*a*) is formed.

Figures 45A, 45B, 45C:
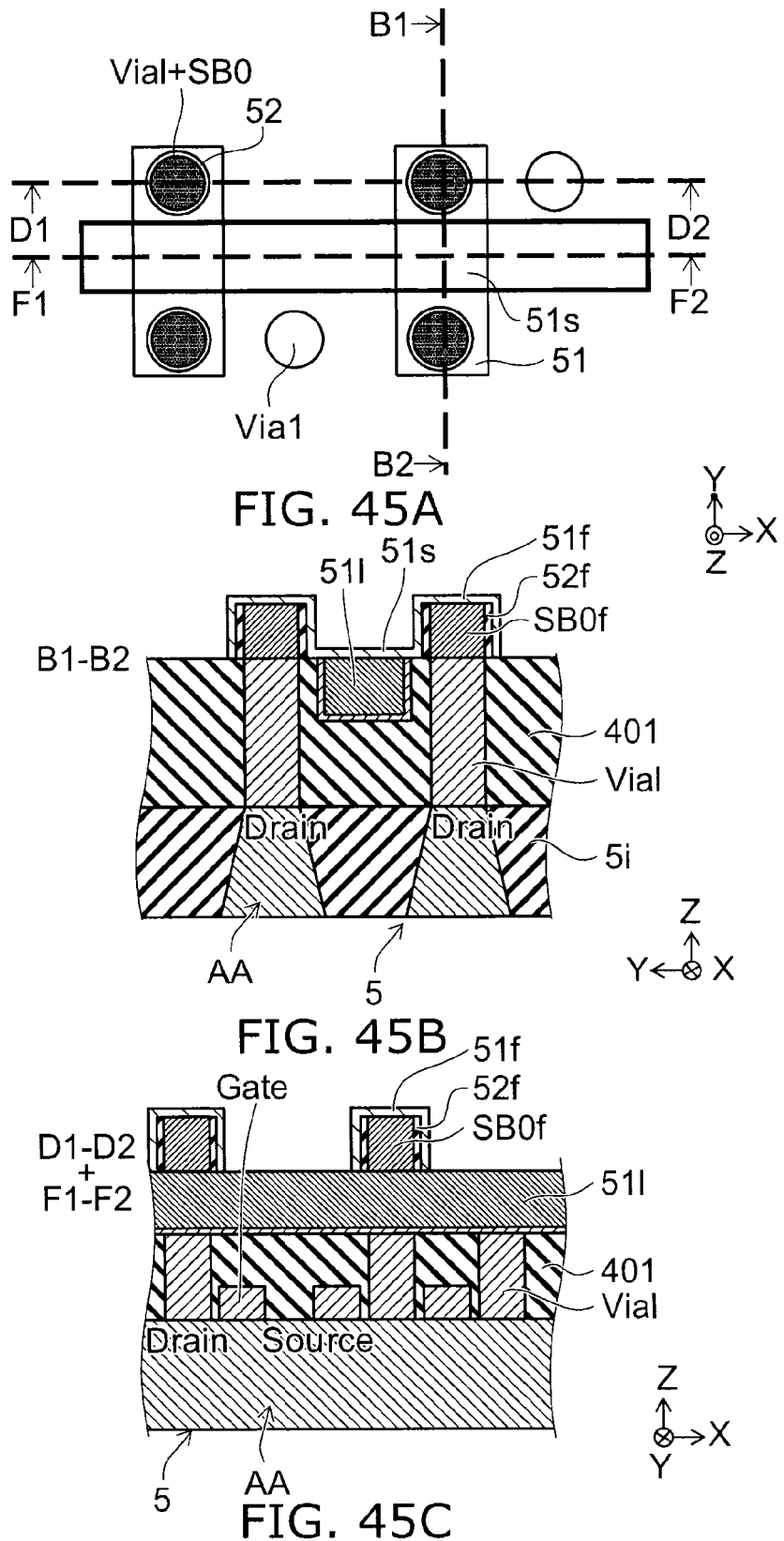

As shown in FIG. 45A to FIG. 45C, the shield film 51*f* is fashioned into a band shape extending in the Y-axis direction. By the shield film 51*f*, the shield 51 and the shield connection portion 51*s* are formed. The shield connection portion 51*s* extends between two stacked bodies SB0 adjacent in the Y-axis direction, and connects the shields 51 opposed to the side walls of these stacked bodies SB0.

Figures 46A, 46B, 46C:
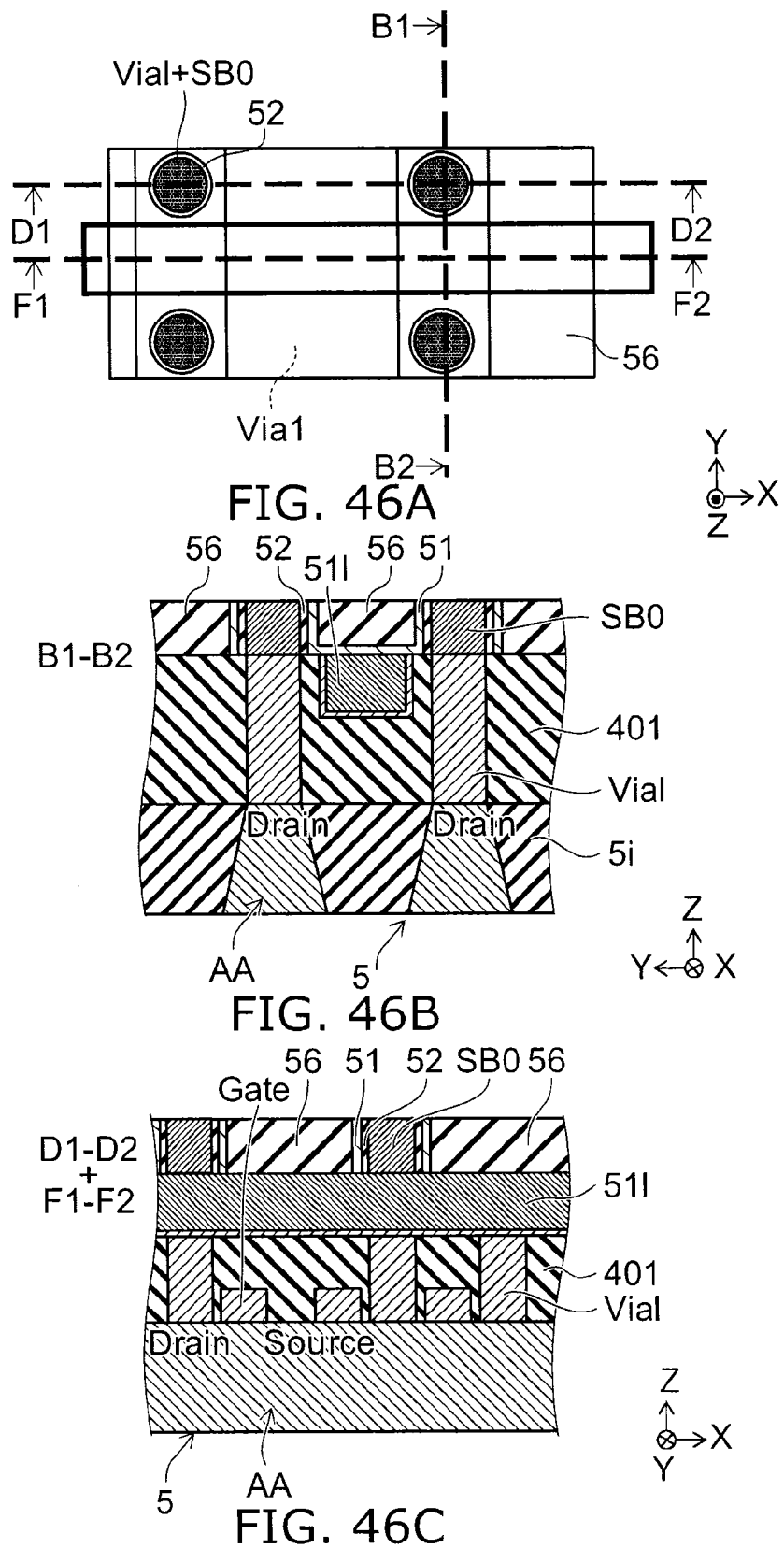

As shown in FIG. 46A to FIG. 46C, the interlayer insulating layer 56 is formed, and is planarized to expose the upper surface of the stacked body SB0 (or a conductive layer etc. connected to the stacked body SB0).

Figure 47A:
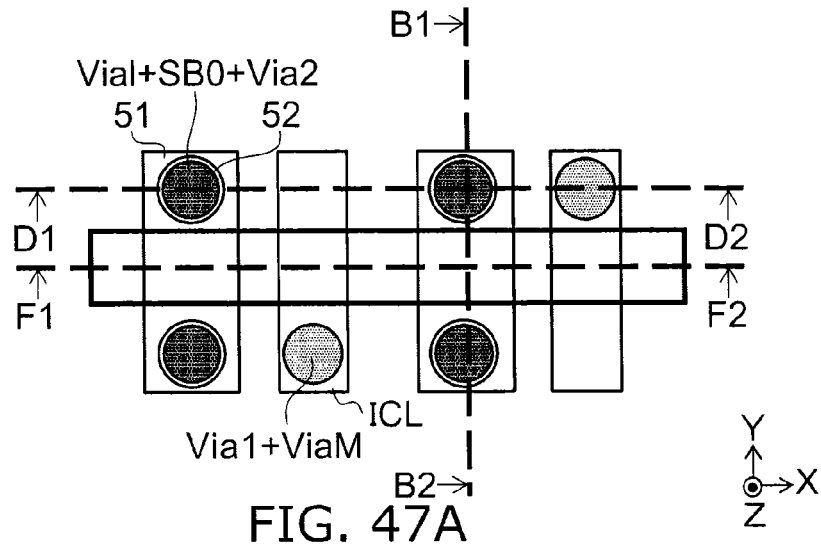
Figure 47B:
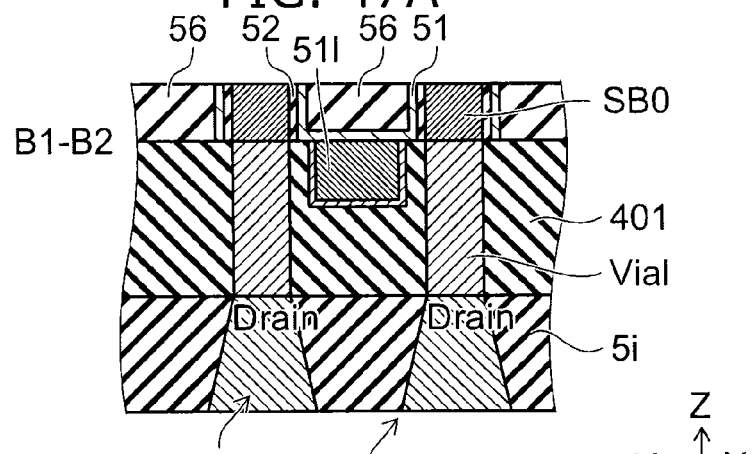
Figure 47C:
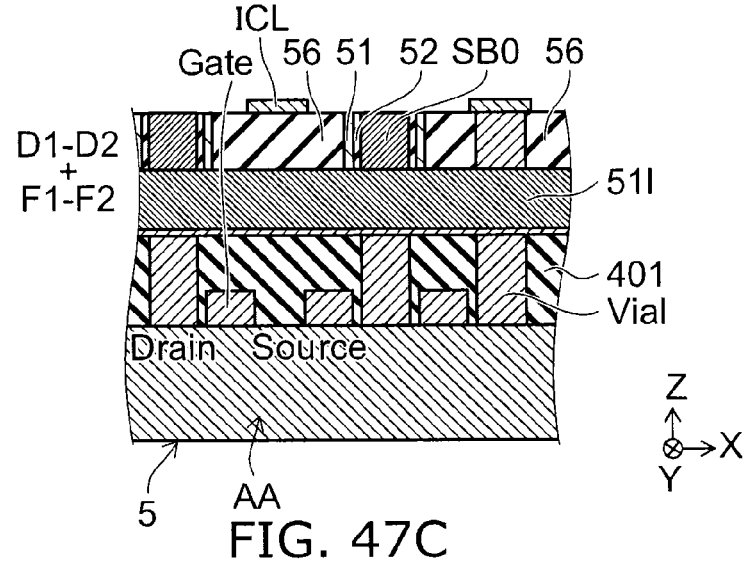

As shown in FIG. 47A to FIG. 47C, a through hole reaching the first via Via1 provided on the source is formed in the interlayer insulating layer 56, and a conductive material is buried in the through hole to form the intermediate via ViaM. After that, the in-cell interconnection ICL is formed such that one end thereof is disposed on the intermediate via ViaM.

Figure 48A:
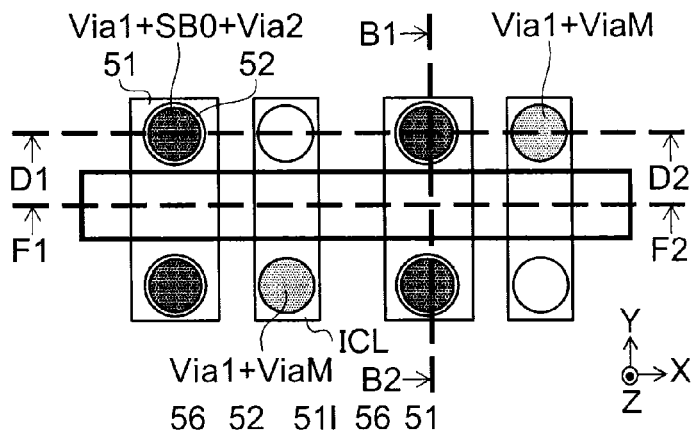
Figure 48B:
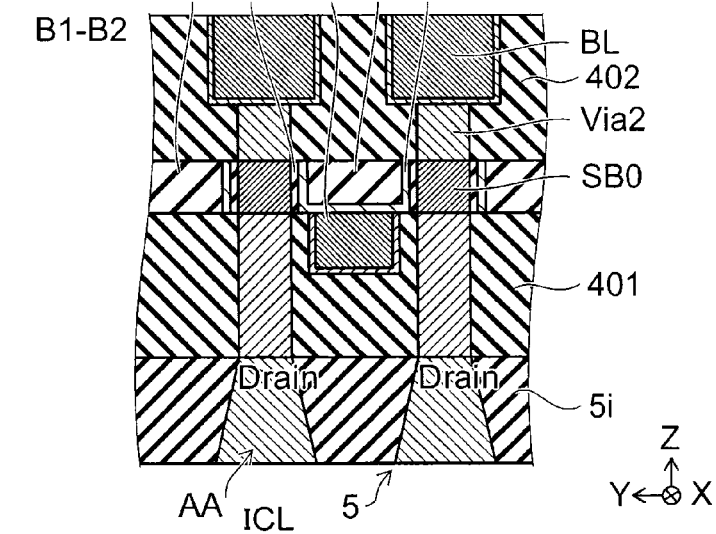
Figure 48C:
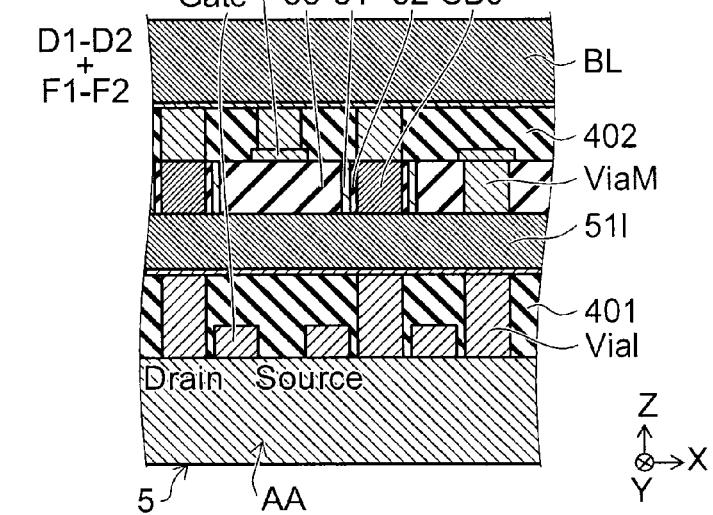

As shown in FIG. 48A to FIG. 48C, the interlayer insulating layer 402 is formed. A through hole is formed in a portion on the stacked body SB0 and a portion on the other end of the in-cell interconnection ICL of the interlayer insulating layer 402, and a conductive material is buried in the through hole to form the second via Via2. Further, an interlayer insulating layer (not shown) is formed thereon, and a band-shaped trench is formed in the interlayer insulating layer. The trench is connected to the second via Via2. A conductive material is buried in the trench. Thereby, the bit line BL is formed.

Through the above processes, the nonvolatile memory device 244 is formed. In the formation of the nonvolatile memory device 244, the configurations (thickness etc.) and materials described in regard to the nonvolatile memory device 244 can be employed.

The foregoing is an example of the method for manufacturing a nonvolatile memory device according to the embodiment, and various modifications are possible.

The embodiment can provide a magnetic memory element and a nonvolatile memory device in which malfunction is suppressed.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may appropriately select specific configurations of components of magnetic memory elements and nonvolatile memory devices such as first to fourth ferromagnetic layers, first to third nonmagnetic layers, shields, shield interconnections, protection layers, interlayer insulating layers, and first and second conductive layers from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory elements and nonvolatile memory devices that can be obtained by an appropriate design modification by one skilled in the art based on the magnetic memory elements and the nonvolatile memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory element comprising:
a stacked body including:
a first stacked unit including:
a first ferromagnetic layer, a magnetization of the first ferromagnetic layer being fixed in a first direction;
a second ferromagnetic layer, a direction of a magnetization of the second ferromagnetic layer being variable in a second direction; and
a first nonmagnetic layer provided between the first ferromagnetic layer and the second ferromagnetic layer, the first nonmagnetic layer, the first ferromagnetic layer and the second ferromagnetic layer being stacked in a stacking direction; and
a second stacked unit including a third ferromagnetic layer stacked with the first stacked unit in the stacking direction, a direction of a magnetization of the third ferromagnetic layer being variable in a third direction; and
a conductive shield opposed to at least a part of a side surface of the second stacked unit, an electric potential of the conductive shield being controllable.

2. The element according to claim 1, wherein the second stacked unit further includes a second nonmagnetic layer provided between the first stacked unit and the third ferromagnetic layer.

3. The element according to claim 1, wherein the second stacked unit further includes:
a fourth ferromagnetic layer stacked with the third ferromagnetic layer in the stacking direction, a magnetization of the fourth ferromagnetic layer being fixed in a fourth direction; and
a second nonmagnetic layer provided between the third ferromagnetic layer and the fourth ferromagnetic layer.

4. The element according to claim 3, further comprising
a first conductive layer; and
a second conductive layer,
the first stacked unit being disposed between the first conductive layer and the second conductive layer,
the second stacked unit being disposed between the first stacked unit and the second conductive layer,
the first conductive layer being electrically connected to one of the first ferromagnetic layer and the second ferromagnetic layer,
the second conductive layer being electrically connected to one of the third ferromagnetic layer and the fourth ferromagnetic layer, and
the conductive shield being electrically isolated from the first conductive layer and from the second conductive layer.

5. The element according to claim 3, further comprising
a first conductive layer;
a second conductive layer; and
a shield interconnection electrically connected to the shield and being isolated from the first conductive layer and from the second conductive layer,
the first stacked unit being disposed between the first conductive layer and the second conductive layer,
the second stacked unit being disposed between the first stacked unit and the second conductive layer,
the first conductive layer being electrically connected to one of the first ferromagnetic layer and the second ferromagnetic layer, and
the second conductive layer being electrically connected to one of the third ferromagnetic layer and the fourth ferromagnetic layer.

6. The element according to claim 3, wherein
the first direction has a first component parallel to the stacking direction,
the fourth direction has a second component parallel to the stacking direction, and
a direction of the first component is opposite to a direction of the second component.

7. The element according to claim 3, wherein
the first ferromagnetic layer, the second ferromagnetic layer, and the fourth ferromagnetic layer are perpendicular magnetization films, and
the third ferromagnetic layer is an in-plane magnetization film.

8. The element according to claim 1, wherein the shield includes a magnetic substance.

9. The element according to claim 1, wherein
the stacked body further includes a third nonmagnetic layer provided between the first stacked unit and the second stacked unit, and
the third nonmagnetic layer includes one metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two metals selected from the group.

10. The element according to claim 9, wherein a circle-equivalent diameter of a cross-sectional shape of the third ferromagnetic layer obtained by cutting along a plane perpendicular to the stacking direction is not more than 35 nanometers and a thickness of the third ferromagnetic layer is not less than 0.5 nanometers and not more than 3.5 nanometers.

11. The element according to claim 1, wherein
the stacked body further includes a third nonmagnetic layer provided between the first stacked unit and the second stacked unit,
the third nonmagnetic layer includes one metal selected from the group consisting of ruthenium (Ru), osmium (Os), and iridium (Ir) or an alloy including at least two metals selected from the group, and
a thickness of the third nonmagnetic layer is not more than 3 nanometers.

12. The element according to claim 1, further comprising a shield interconnection electrically connected to the shield.

13. The element according to claim 12, wherein the shield interconnection is connected to a terminal at a ground potential or a power supply potential.

14. The element according to claim 12, further comprising
a first conductive layer; and
a second conductive layer,
the first stacked unit being disposed between the first conductive layer and the second conductive layer,
the second stacked unit being disposed between the first stacked unit and the second conductive layer,
the first conductive layer being electrically connected to one of the first ferromagnetic layer and the second ferromagnetic layer,
the second conductive layer being electrically connected to the third ferromagnetic layer, and
the shield interconnection being electrically isolated from the first conductive layer and from the second conductive layer.

15. The element according to claim 1, wherein the shield is further opposed to a side surface of the first stacked unit.

16. The element according to claim 1, wherein the shield includes one selected from the group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), vanadium (V), zirconium (Zr), magnesium (Mg), silicon (Si), and aluminum (Al).

17. The element according to claim 1, wherein the shield includes a metal selected from the group consisting of iron (Fe), cobalt (Co), nickel (Ni), manganese (Mn), and chromium (Cr) or an alloy including two or more metals selected from the group.

18. The element according to claim 1, wherein the shield includes an alloy including
at least one metal selected from the group consisting of iron (Fe), cobalt (Co), nickel (Ni), manganese (Mn), and chromium (Cr) and
at least one metal selected from the group consisting of platinum (Pt), palladium (Pd), iridium (Ir), ruthenium (Ru), and rhodium (Rh).

19. The element according to claim 1, wherein the shield includes at least one of a TbFeCo alloy, a GdFeCo alloy, a Co/Pt stacked film, a Co/Pd stacked film, and a Co/Ni stacked film.

20. The element according to claim 1, further comprising an insulative protection layer provided between the side surface and the shield.

21. The element according to claim 20, wherein the protection layer includes an oxide, a nitride, or a fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe).

22. The element according to claim 20, wherein a thickness of the protection layer is not less than a distance in the stacking direction between a center in the stacking direction of the second ferromagnetic layer and a center in the stacking direction of the third ferromagnetic layer.

23. The element according to claim 1, further comprising
a first conductive layer; and
a second conductive layer,
the first stacked unit being disposed between the first conductive layer and the second conductive layer,
the second stacked unit being disposed between the first stacked unit and the second conductive layer,
the first conductive layer being electrically connected to one of the first ferromagnetic layer and the second ferromagnetic layer,
the second conductive layer being electrically connected to the third ferromagnetic layer, and
the conductive shield being electrically isolated from the first conductive layer and from the second conductive layer.

24. The element according to claim 1, wherein
the third ferromagnetic layer is configured to generate a radio-frequency electromagnetic field.

25. The device according to claim 1, wherein
the electric potential of the conductive shield in a writing operation is different from the electric potential of the conductive shield in a reading operation.

* * * * *